(12) United States Patent
Jeong et al.

(10) Patent No.: US 12,356,767 B2
(45) Date of Patent: Jul. 8, 2025

(54) DISPLAY DEVICE

(71) Applicant: Samsung Display Co., LTD., Yongin-si (KR)

(72) Inventors: Jang Gyoon Jeong, Jeollanam-do (KR); Ki Sun Jang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 514 days.

(21) Appl. No.: 17/799,536

(22) PCT Filed: Jun. 8, 2020

(86) PCT No.: PCT/KR2020/007390
§ 371 (c)(1),
(2) Date: Aug. 12, 2022

(87) PCT Pub. No.: WO2021/162180
PCT Pub. Date: Aug. 19, 2021

(65) Prior Publication Data
US 2023/0055222 A1 Feb. 23, 2023

(30) Foreign Application Priority Data
Feb. 13, 2020 (KR) .................. 10-2020-0017427

(51) Int. Cl.
*H01L 33/38* (2010.01)
*H01L 25/075* (2006.01)
(Continued)

(52) U.S. Cl.
CPC ..... *H10H 20/8316* (2025.01); *H01L 25/0753* (2013.01); *H10H 20/857* (2025.01)

(58) Field of Classification Search
None
See application file for complete search history.

(56) References Cited

U.S. PATENT DOCUMENTS

| 10,056,535 B2 | 8/2018 | Chang et al. |
| 10,224,308 B2 | 3/2019 | Zou et al. |

(Continued)

FOREIGN PATENT DOCUMENTS

| CN | 105742451 | 7/2016 |
| CN | 107634081 | 1/2018 |

(Continued)

OTHER PUBLICATIONS

Partial Supplementary European Search Report for European Application No. 20918396.1, dated Jan. 5, 2024.
(Continued)

*Primary Examiner* — Robert K Carpenter
(74) *Attorney, Agent, or Firm* — KILE PARK REED & HOUTTEMAN PLLC

(57) ABSTRACT

A display device includes first and second internal banks extending in a first direction on a substrate and spaced apart from each other in a second direction different from the first direction; a first electrode including a first main electrode extending in the first direction on a side of the first internal bank and a first sub-electrode extending in the first direction on another side of the first internal bank and at least partially spaced apart from and facing the first main electrode; a second electrode extending in the first direction on a side of the second internal bank and spaced apart from and facing the first main electrode; and a light emitting element disposed between the first internal bank and the second internal bank, and the light emitting element has an end disposed on the first main electrode and another end on the second electrode.

24 Claims, 34 Drawing Sheets

(51) Int. Cl.
    *H01L 33/62*    (2010.01)
    *H10H 20/831*    (2025.01)
    *H10H 20/857*    (2025.01)

(56) References Cited

U.S. PATENT DOCUMENTS

| | | |
|---|---|---|
| 10,340,419 B2 | 7/2019 | Kim et al. |
| 11,005,009 B2 | 5/2021 | Kim et al. |
| 11,411,044 B2 | 8/2022 | Cho et al. |
| 11,423,827 B2 | 8/2022 | Kim et al. |
| 11,817,474 B2 | 11/2023 | Cho et al. |
| 12,033,986 B2 | 7/2024 | Kong et al. |
| 12,034,097 B2 | 7/2024 | Kim et al. |
| 2009/0184323 A1 | 7/2009 | Yang et al. |
| 2013/0126846 A1 | 5/2013 | Harada et al. |
| 2020/0013929 A1 | 1/2020 | Lee |
| 2023/0352455 A1* | 11/2023 | Im .................. H10D 86/60 |
| 2024/0088198 A1 | 3/2024 | Cho et al. |

FOREIGN PATENT DOCUMENTS

| | | |
|---|---|---|
| EP | 3 270 413 | 1/2018 |
| EP | 3 608 958 | 2/2020 |
| JP | 2014-123583 | 7/2014 |
| JP | 2015-11784 | 1/2015 |
| KR | 10-2018-0057777 | 5/2018 |
| KR | 10-2019-0038150 | 4/2019 |
| KR | 10-2019-0124359 | 11/2019 |
| KR | 10-2020-0005711 | 1/2020 |
| KR | 10-2020-0006651 | 1/2020 |
| KR | 10-2020-0014955 | 2/2020 |
| KR | 10-2585158 | 10/2023 |
| WO | 2020/017719 | 1/2020 |

OTHER PUBLICATIONS

International Search Report, with English translation, corresponding to International Application No. PCT/KR2020/007390 dated Nov. 6, 2020.
Written Opinion, with English translation, corresponding to International Application No. PCT/KR2020/007390 dated Nov. 6, 2020.

* cited by examiner

DISPLAY DEVICE

CROSS-REFERENCE TO RELATED APPLICATION(S)

This application is a national entry of International Application No. PCT/KR2020/007390, filed on Jun. 8, 2020, which claims under 35 U.S.C. § 119(a) and 365(b) priority to and benefits of Korean Patent Application No. 10-2020-0017427, filed on Feb. 13, 2020 in the Korean Intellectual Property Office, the entire contents of which are incorporated herein by reference.

BACKGROUND

1. Technical Field

The disclosure relates to a display device.

2. Description of the Related Art

The importance of display devices is increasing with the development of multimedia. Accordingly, various types of display devices such as organic light-emitting display (OLED) devices and liquid crystal display (LCD) devices are being used.

A display panel such as an OLED panel or an LCD panel is a device included in a display device to display an image. Among such display panels, a light-emitting element may be provided as a light-emitting display panel, and examples of a light-emitting diode (LED) include an organic LED (OLED) using an organic material as a fluorescent material and an inorganic LED using an inorganic material as a fluorescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device including an electrode to which the same voltage as any one electrode is applied, between electrodes to which different voltages are applied.

Aspects of the disclosure also provide a display device in which dispersion according to alignment positions of light emitting elements is improved.

It should be noted that aspects of the disclosure are not limited thereto and other aspects will be apparent to those of ordinary skill in the art from the following description.

According to an embodiment, a display device may include, a first internal bank and a second internal bank extending in a first direction on a substrate and spaced apart from each other in a second direction different from the first direction; a first electrode including a first main electrode extending in the first direction on a side of the first internal bank and a first sub-electrode extending in the first direction on another side of the first internal bank and at least partially spaced apart from and facing the first main electrode; a second electrode extending in the first direction on a side of the second internal bank and spaced apart from and facing the first main electrode; and a light emitting element disposed between the first internal bank and the second internal bank, wherein the light emitting element has an end disposed on the first main electrode and another end disposed on the second electrode.

A non-alignment area may be formed on the first internal bank and the non-alignment area may not include the light emitting element, and the non-alignment area may partially overlap an area in a plan view in which the first main electrode and the first sub-electrode are spaced apart from each other.

The second electrode may include a second main electrode extending in the first direction on the side of the second internal bank and a second sub-electrode extending in the first direction on the another side of the second internal bank.

The another end of the light emitting element may be disposed on the second main electrode.

The first main electrode and the first sub-electrode may be spaced apart from and face each other in the second direction on the first internal bank and the first main electrode may not be connected to the first sub-electrode, and the first sub-electrode may not be electrically connected to the light emitting element.

The second electrode may include a bridge part at least partially disposed between the second main electrode and the second sub-electrode on the second internal bank, and at least portions of the second main electrode and the second sub-electrode are spaced apart from and face each other.

The display device may further include a first contact electrode extending in the first direction on the first main electrode and electrically contacting the end of the light emitting element; and a second contact electrode extending in the first direction on the second main electrode and disposed on the another end of the light emitting element.

The light emitting element has a shape extending in a direction, and an interval between the first contact electrode and the second contact electrode may be less than a length of the light emitting element.

Widths of the first main electrode and the second main electrode may be less than widths of the first contact electrode and the second contact electrode.

The first main electrode and the first sub-electrode may have a same width, and an interval between the first main electrode and the first sub-electrode may be less than a width of the first internal bank.

A first source voltage may be applied to the first main electrode, and the first source voltage may not be applied to the first sub-electrode.

The display device may further include a first electrode fragment spaced apart from the first sub-electrode and the first internal bank in the first direction.

The display device may further include a third internal bank extending in the first direction between the first internal bank and the second internal bank; and third electrodes disposed on both sides of the third internal bank and spaced apart from each other in the second direction, wherein the third electrode disposed on a side of the third internal bank may be spaced apart from and face the first main electrode, and the third electrode disposed on the another side of the third internal bank may be spaced apart from and face the second electrode.

The light emitting element may include a first light emitting element disposed between the first internal bank and the third internal bank and a second light emitting element disposed between the third internal bank and the second internal bank.

The display device may further include second electrode fragments spaced apart from the third electrodes and the third internal bank in the first direction.

The display device may further comprise a fourth internal bank extending in the first direction between the first internal bank and the third internal bank; and fourth electrodes disposed on both sides of the fourth internal bank and spaced apart from each other in the second direction, wherein the light emitting element may include a third light emitting element disposed between the fourth internal bank and the third internal bank.

According to an embodiment, a display device may include a first internal bank and a second internal bank disposed on a substrate and spaced apart from and facing each other; a first electrode including a first sub-electrode covering a side of the first internal bank and a first main electrode covering another side of the first internal bank; a second electrode including a second main electrode covering a side of the second internal bank and a second sub-electrode covering another side of the second internal bank; and a light emitting element disposed between the first internal bank and the second internal bank, wherein the first electrode is not disposed on at least a portion of an upper surface of the first internal bank, and the second electrode is not disposed on at least a portion of an upper surface of the second internal bank.

The display device may further include a first insulating layer covering portions of the first electrode and the second electrode, wherein the first insulating layer covers the first sub-electrode and the second sub-electrode, and exposes portions of upper surfaces of the first main electrode and the second main electrode.

The display device may further include a first contact electrode disposed on the first main electrode and contacting an end of the light emitting element and a second contact electrode disposed on the second main electrode and contacting another end of the light emitting element.

The first main electrode may be electrically connected to a first voltage line to which a first source voltage may be applied.

The second contact electrode may electrically contact a second voltage line to which a second source voltage may be applied.

According to an embodiment, a display device may include, a first internal bank including at least one hole; a first electrode disposed on the first internal bank and in which at least one electrode hole partially exposes the hole corresponding to the at least one hole; a second internal bank disposed in the at least one hole of the first internal bank and spaced apart from a sidewall of the at least one hole of the first internal bank; a second electrode covering an outer surface of the second internal bank, and exposing a portion of an upper surface of the second internal bank; and light emitting elements disposed between the first internal bank and the second internal bank and having both ends electrically connected to the first electrode and the second electrode, wherein at least a portion of the first electrode is disposed that covers the sidewall of the first internal bank.

The second electrode may include a main electrode that covers an outer side surface of the second internal bank spaced apart from and facing the first internal bank; an electrode extension part disposed on the exposed upper surface of the second internal bank and spaced apart from the main electrode; and a bridge part connecting the electrode extension part to the main electrode.

The display device may further include a first contact electrode disposed on the first electrode and disposed along the sidewall of the at least one hole of the first internal bank and a second contact electrode disposed on the main electrode of the second electrode and having a width greater than a width of the main electrode.

The above and other features and advantages of the disclosure will become more apparent by describing in detail embodiments thereof with reference to the attached drawings.

A display device according to an embodiment may include internal banks disposed to be spaced apart from each other and different electrodes disposed on the internal banks, and at least one of the electrodes may include a main electrode and a sub-electrode disposed on the same internal bank. The same alignment signal may be applied to the main electrode and the sub-electrode during a process of manufacturing the display device, and an electric field inducing light emitting elements not to be disposed between the main electrode and the sub-electrode may be generated between the main electrode and the sub-electrode.

Accordingly, in the display device, the light emitting elements may be induced to be disposed between the different electrodes, an alignment area in which the light emitting elements are disposed may be formed between the internal banks, and non-alignment areas in which the light emitting elements are not disposed may be formed between the main electrode and the sub-electrode on the internal bank. The display device according to an embodiment may include the main electrode and the sub-electrode disposed on the same internal bank to induce the light emitting elements to be intensively disposed in the alignment area.

The effects according to the embodiments are not limited by the contents exemplified above, and more various effects are included in this disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
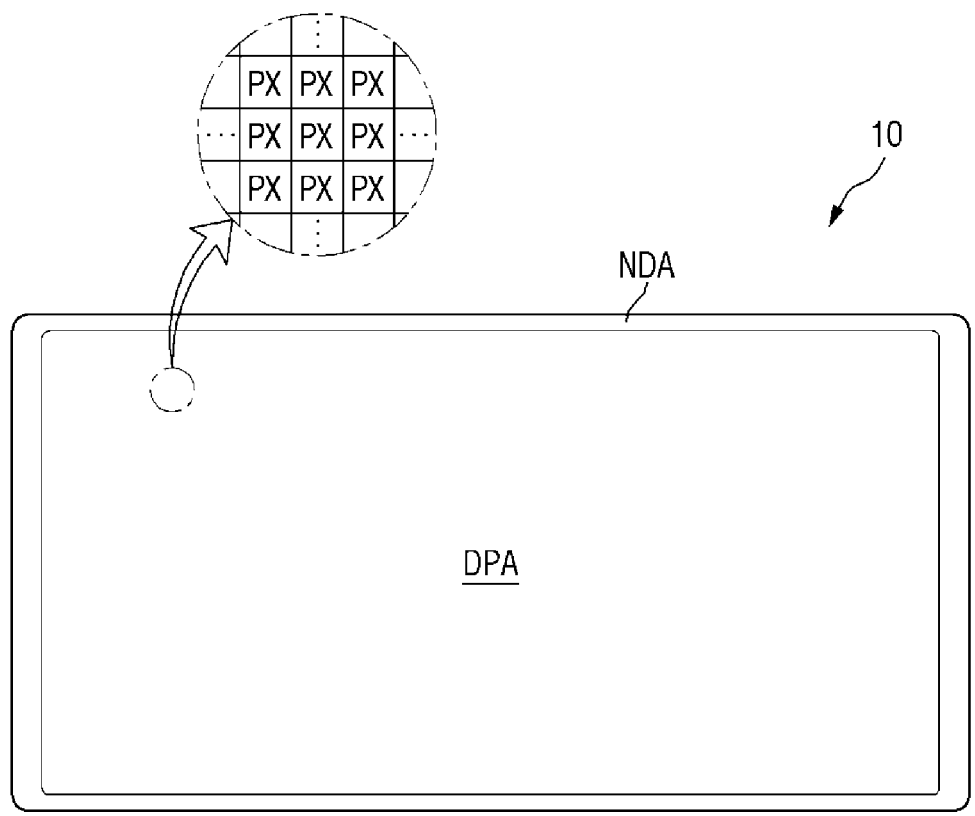
FIG. 1 is a schematic plan view of a display device according to an embodiment.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

FIG. 1 is a schematic plan view of a display device according to an embodiment.

Referring to FIG. 1, a display device 10 displays a moving image or a still image. The display device 10 may refer to all electronic devices that provide display screens. For example, televisions, laptop computers, monitors, billboards, the Internet of Things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, camcorders, and the like, which provide display screens, may be included in the display device 10.

The display device 10 may include a display panel providing the display screen. Examples of the display panel may include an inorganic light emitting diode display panel, an organic light emitting display panel, a quantum dot light emitting display panel, a plasma display panel, a field emission display panel, and the like within the spirit and the scope of the disclosure. Hereinafter, a case where an inorganic light emitting diode display panel is applied as an example of the display panel will be described by way of example, but the disclosure is not limited thereto, and the same technical spirit may be applied to other display panels if applicable.

A shape of the display device 10 may be variously modified. For example, the display device 10 may have a shape such as a rectangular shape with a width greater than a length, a rectangular shape with a length greater than a width, a square shape, a rectangular shape with rounded corners (vertices), other polygonal shapes, or a circular shape. A shape of a display area DPA of the display device 10 may also be similar to an overall shape of the display device 10. In FIG. 1, the display device 10 and the display area DPA having the rectangular shape with the width greater than the length are illustrated. It is to be understood that the shapes disclosed herein include shapes substantial to the shapes disclosed herein.

The display device 10 may include a display area DPA and non-display areas NDA. The display area DPA is an area in which a screen may be displayed, and the non-display areas NDA are areas in which the screen is not displayed. The display area DPA may also be referred to as an active area, and the non-display area NDA may also be referred to as a non-active area. The display area DPA may occupy substantially the center of the display device 10.

The display area DPA may include pixels PX. The pixels PX may be arranged (or disposed) in a matrix direction. A shape of each pixel PX may be a rectangular shape or a square shape in a plan view, but is not limited thereto, and may also be a rhombic shape of which each side is inclined with respect to one direction (or a direction). The respective pixels PX may be alternately arranged in a stripe type or a PENTILE™ type. Each of the pixels PX may include one or more light emitting elements 300 emitting light of a wavelength band to display a color.

The non-display areas NDA may be disposed around the display area DPA. The non-display areas NDA may entirely or partially surround the display area DPA. The display area DPA may have a rectangular shape, and the non-display areas NDA may be disposed adjacent to four sides of the display area DPA. The non-display areas NDA may constitute a bezel of the display device 10. Lines or circuit drivers included in the display device 10 may be disposed or external devices may be mounted, in each of the non-display areas NDA.

Figure 2:
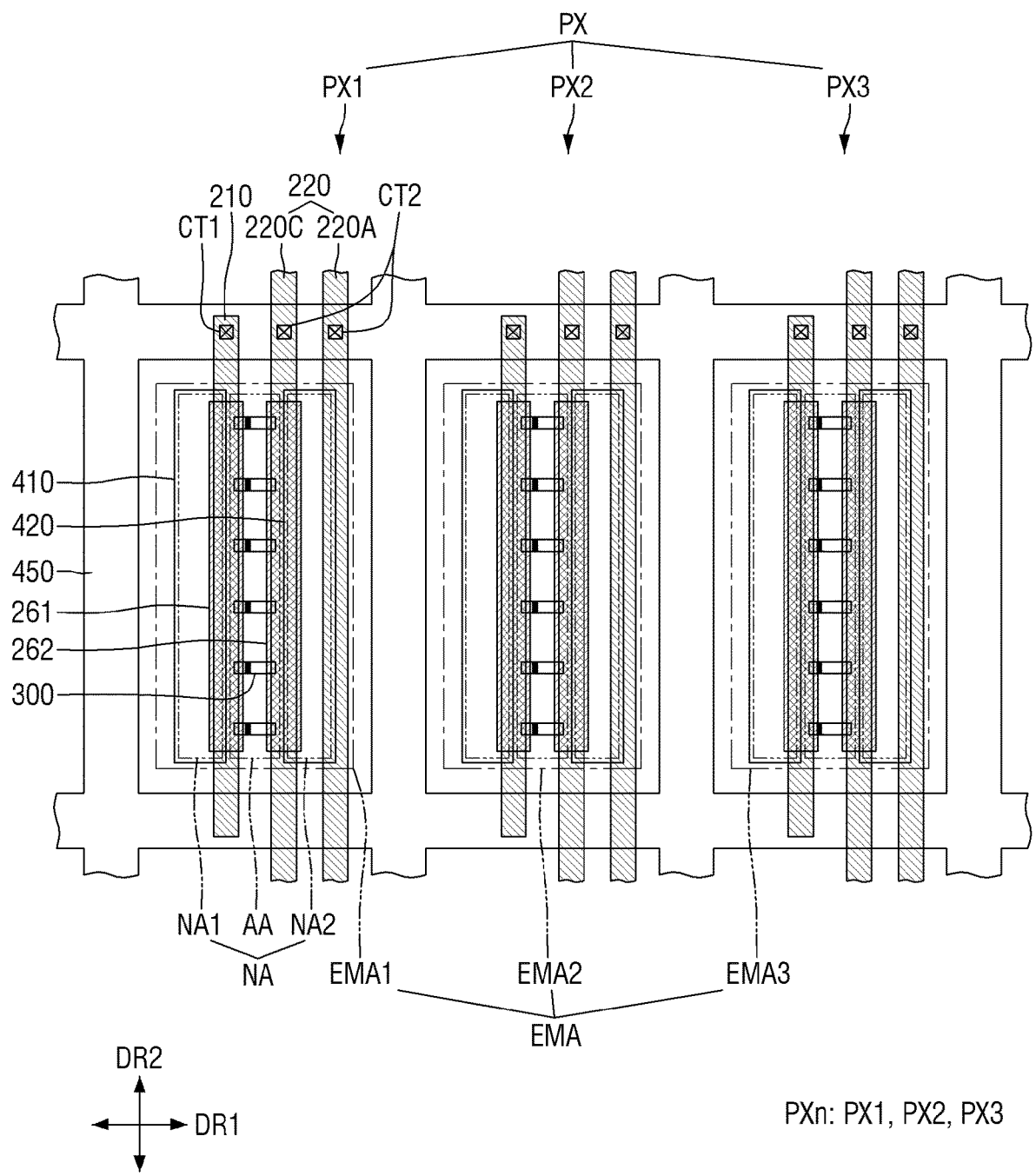
FIG. 2 is a schematic plan view illustrating one pixel of the display device according to an embodiment.
Figure 3:
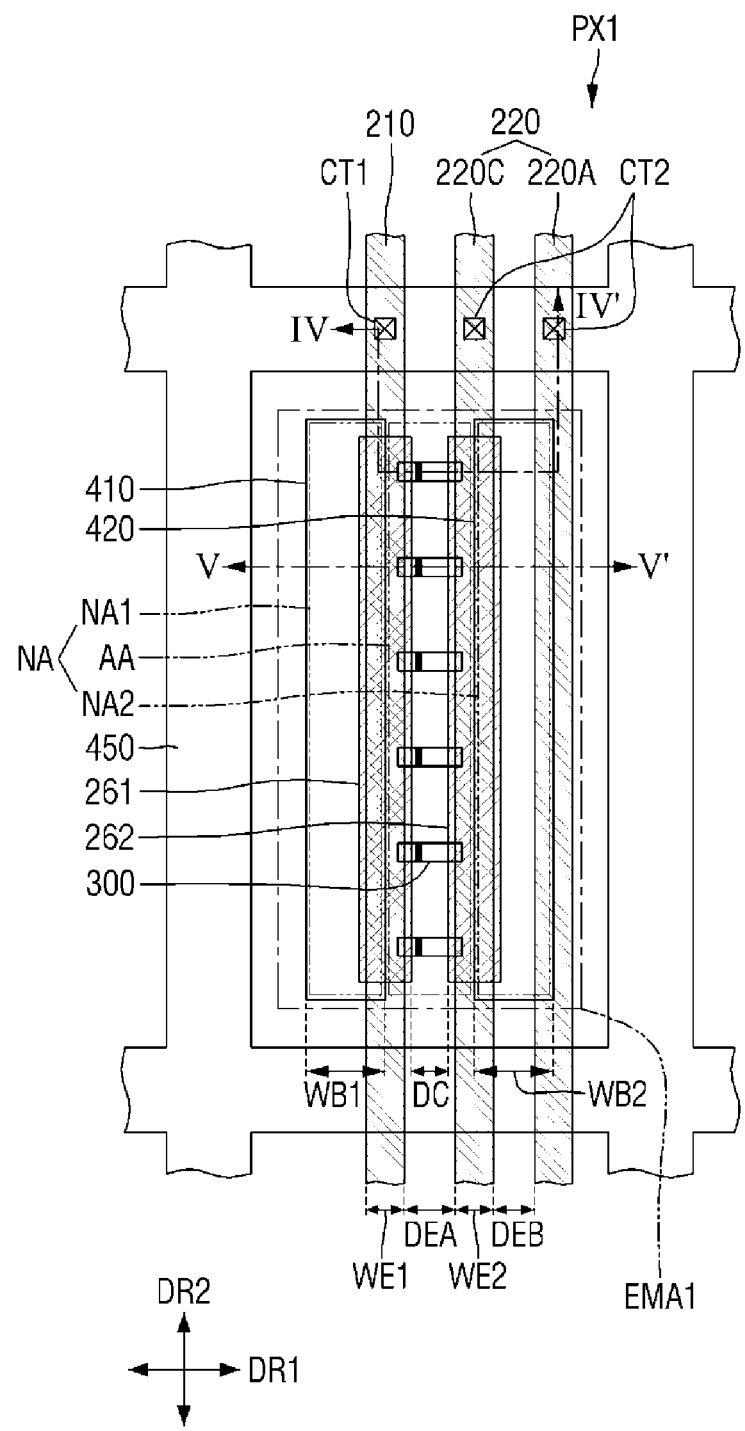
FIG. 3 is a schematic plan view illustrating one sub-pixel of FIG. 2.
Figure 4:
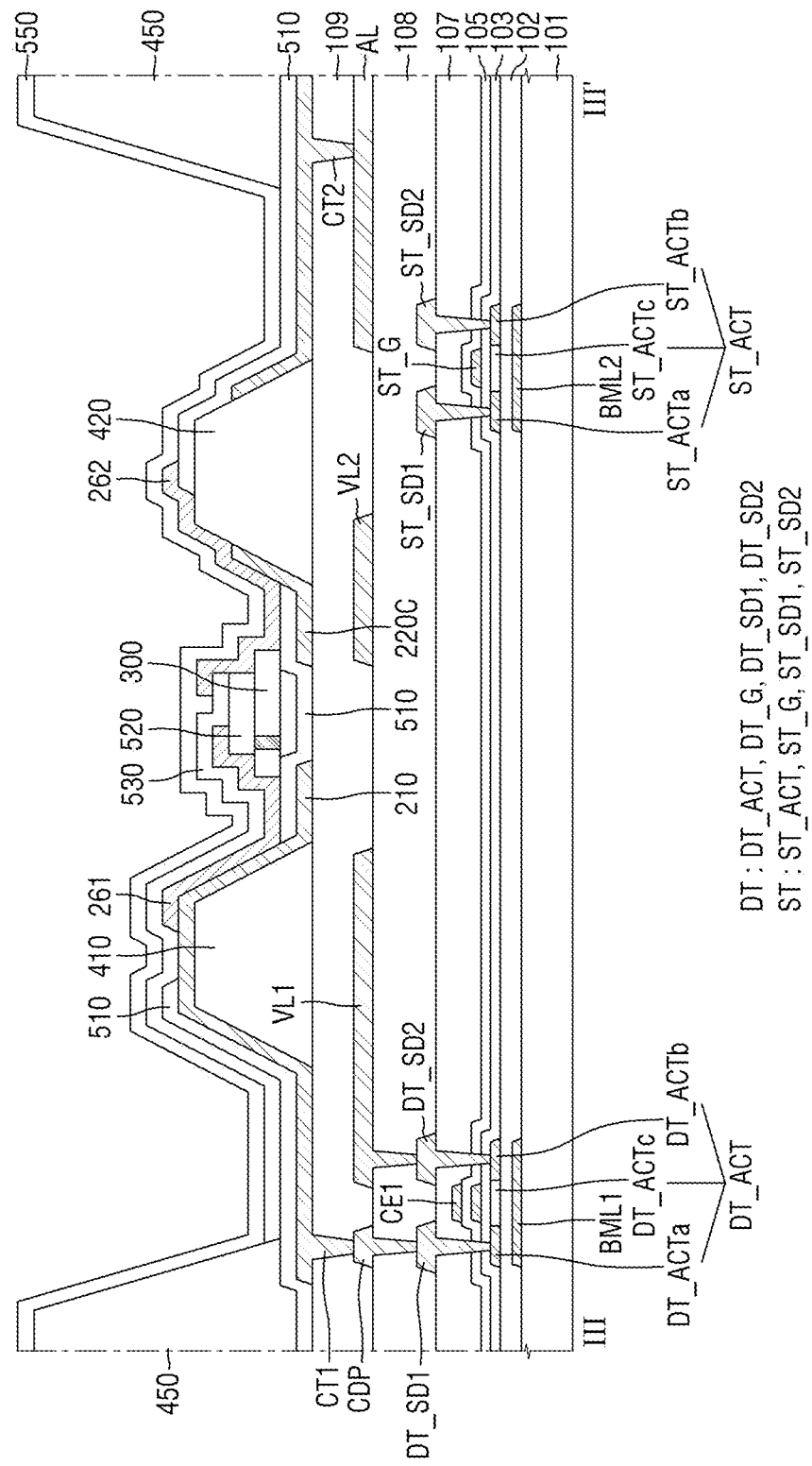
FIG. 4 is a schematic cross-sectional view taken along line IV-IV' of FIG. 3.
Figure 5:
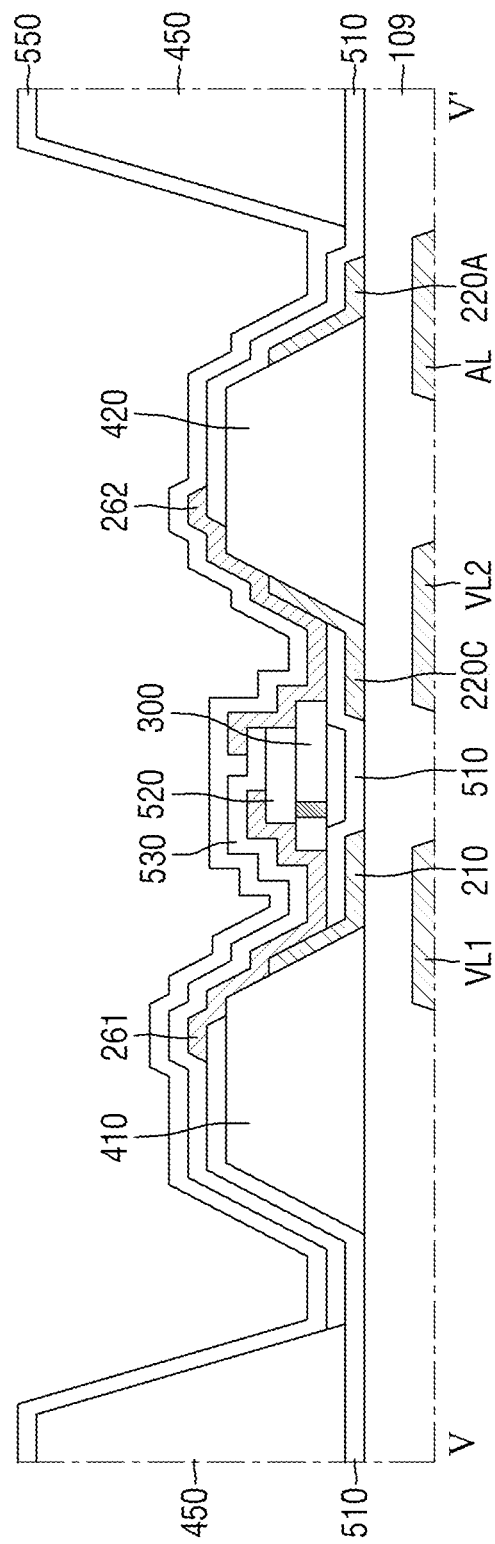
FIG. 5 is a schematic cross-sectional view taken along line V-V' of FIG. 3.

FIG. 2 is a schematic plan view illustrating one pixel of the display device according to an embodiment. FIG. 3 is a schematic plan view illustrating one sub-pixel of FIG. 2. FIG. 4 is a schematic cross-sectional view taken along line IV-IV' of FIG. 3. FIG. 5 is a schematic cross-sectional view taken along line V-V' of FIG. 3.

Referring to FIGS. 2 and 3, each of the pixels PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. The first color may be blue, the second color may be green, and the third color may be red. However, the disclosure is not limited thereto, and the respective sub-pixels PXn may also emit light of a same color. It has been illustrated in FIG. 2 that the pixel PX may include three sub-pixels PXn, but the disclosure is not limited thereto, and the pixel PX may include a larger number of sub-pixels PXn.

Each of the sub-pixels PXn of the display device 10 may include an area defined as an emission area EMA. The first sub-pixel PX1 may include a first emission area EMA1, the second sub-pixel PX2 may include a second emission area EMA2, and the third sub-pixel PX3 may include a third emission area EMA3. The emission area EMA may be defined as an area in which the light emitting elements 300 included in the display device 10 are disposed to emit light of a wavelength band. The light emitting element 300 may include an active layer 330 (see FIG. 6), which may emit light of a wavelength band without directionality. The light emitted from the active layers 330 of the light emitting elements 300 may be emitted in directions of both side surfaces of the light emitting elements 300. The emission area EMA may include an area in which the light emitting elements 300 are disposed, and may include an area in which the light emitted from the light emitting elements 300 is emitted, as an area adjacent to the light emitting elements 300.

The disclosure is not limited thereto, and the emission area EMA may also include an area in which the light emitted from the light emitting elements 300 is reflected or refracted by other members and emitted. Light emitting elements 300 may be disposed in each sub-pixel PXn, and the emission area EMA including an area in which the light emitting elements 300 are disposed and an area adjacent to the light emitting elements 300 may be formed.

Although not illustrated in the drawings, each of the sub-pixels PXn of the display device 10 may include a non-emission area defined as an area other than the emission area EMA. The non-emission area may be an area in which the light emitting elements 300 are not disposed and the light emitted from the light emitting elements 300 does not arrive, and thus, the light is not emitted.

The display device 10 may include an alignment area AA in which the light emitting elements 300 are disposed and a non-alignment area NA in which the light emitting elements 300 are not disposed, for each sub-pixel PXn. The alignment area AA and the non-alignment area NA may be defined, respectively, as an area in which the light emitting elements 300 are disposed and an area in which the light emitting elements 300 are not disposed among areas between electrodes 210 and 220 of the display device 10 according to an arrangement of the electrodes 210 and 220 of the display device 10. A detailed description thereof will be provided later.

FIGS. 4 and 5 illustrate a cross section of the first sub-pixel PX1 of FIG. 2, but may be equally applied to other pixels PX or sub-pixels PXn. FIG. 4 illustrates a schematic cross section crossing one end (or an end) and the other end (or another end) of the light emitting element 300 disposed in the first sub-pixel PX1 of FIG. 2. FIG. 5 illustrates a schematic cross-section crossing a first electrode 210 and a second electrode 220 disposed respectively on a first internal bank 410 and a second internal bank 420.

Referring to FIGS. 4 and 5 in conjunction with FIGS. 2 and 3, the display device 10 may include a circuit element layer and a display element layer disposed on a first substrate 101. A semiconductor layer, conductive layers, and insulating layers may be disposed on the first substrate 101, and may constitute a circuit element layer and a display element layer, respectively. The conductive layers may include a first gate conductive layer, a second gate conductive layer, a first data conductive layer, and a second data conductive layer that are disposed below a first planarization layer 109 and constitute the circuit element layer, and electrodes 210 and 220 and contact electrodes 261 and 262 that are disposed on the planarization layer 109 and constitute the display element layer. The insulating layers may include a buffer layer 102, a first gate insulating layer 103, a first passivation layer 105, a first interlayer insulating layer 107, a second interlayer insulating layer 108, the first planarization layer 109, a first insulating layer 510, a second insulating layer 520, a third insulating layer 530, a fourth insulating layer 550, and the like within the spirit and the scope of the disclosure.

The circuit element layer may include a driving transistor DT, a switching transistor ST, a first conductive pattern CDP, voltage lines VL1 and VL2, and an alignment line AL as circuit elements and lines for driving the light emitting element 300, and the display element layer may include a first electrode 210, a second electrode 220, a first contact electrode 261, and a second contact electrode 262, and the like, as well as the light emitting element 300.

The first substrate 101 may be an insulating substrate. The first substrate 101 may be made of an insulating material such as glass, quartz, or a polymer resin. The first substrate 101 may be a rigid substrate, but may also be a flexible substrate that may be bent, folded, or rolled.

Light blocking layers BML1 and BML2 may be disposed on the first substrate 101. The light blocking layers BML1 and BML2 may include a first light blocking layer BML1 and a second light blocking layer BML2. The first light blocking layer BML1 and the second light blocking layer BML2 are disposed to overlap at least a first active material layer DT_ACT of the driving transistor DT and a second active material layer ST_ACT of the switching transistor ST, respectively. The light blocking layers BML1 and BML2 may include a light blocking material to prevent light from being incident on the first and second active material layers DT_ACT and ST_ACT. As an example, the first and second light blocking layers BML1 and BML2 may be made of an opaque metal material blocking transmission of the light. However, the disclosure is not limited thereto, and in some cases, the light blocking layers BML1 and BML2 may be omitted. Although not illustrated in the drawings, the first light blocking layer BML1 is electrically connected to a first source or drain electrode DT_SD1 of the driving transistor DT to be described later, and the second light blocking layer BML2 may be electrically connected to a first source or drain electrode ST_SD1 of the switching transistor ST.

The buffer layer 102 may be entirely disposed on the first substrate 101 as well as on the light blocking layers BML1 and BML2. The buffer layer 102 may be formed on the first substrate 101 in order to protect the transistors DT and ST of the pixel PX from moisture permeating through the first substrate 101 vulnerable to moisture permeation, and may perform a surface planarization function. The buffer layer 102 may include inorganic layers that may be alternately stacked each other. For example, the buffer layer 102 may be formed as multiple layers in which inorganic layers including at least one of silicon oxide (SiOx), silicon nitride (SiNx), and silicon oxynitride (SiON) may be alternately stacked each other.

The semiconductor layer is disposed on the buffer layer 102. The semiconductor layer may include the first active material layer DT_ACT of the driving transistor DT and the second active material layer ST_ACT of the switching transistor ST. The first active material layer DT_ACT and the second active material layer ST_ACT may be disposed to partially overlap gate electrodes DT_G and ST_G or the like of a first gate conductive layer to be described later.

In an embodiment, the semiconductor layer may include polycrystalline silicon, single crystal silicon, an oxide semiconductor, or the like within the spirit and the scope of the disclosure. The polycrystalline silicon may be formed by crystallizing amorphous silicon. Examples of the crystallization method may include a rapid thermal annealing (RTA) method, a solid phase crystallization (SPC) method, an excimer laser annealing (ELA) method, a metal induced crystallization (MILC) method, a sequential lateral solidification (SLS) method, and the like, but are not limited thereto. In case that the semiconductor layer may include the polycrystalline silicon, the first active material layer DT_ACT may include a first doped region DT_ACTa, a second doped region DT_ACTb, and a first channel region DT_ACTc. The first channel region DT_ACTc may be disposed between the first doped region DT_ACTa and the second doped region DT_ACTb. The second active material layer ST_ACT may include a third doped region ST_ACTa, a fourth doped region ST_ACTb, and a second channel region ST_ACTc. The second channel region ST_ACTc may be disposed between the third doped region ST_ACTa and the fourth doped region ST_ACTb. The first doped region DT_ACTa, the second doped region DT_ACTb, the third doped region ST_ACTa, and the fourth doped region ST_ACTb may be regions formed by doping partial regions of the first active material layer DT_ACT and the second active material layer ST_ACT with impurities.

In an embodiment, the first active material layer DT_ACT and the second active material layer ST_ACT may include an oxide semiconductor. Each of the doped regions of the first active material layer DT_ACT and the second active material layer ST_ACT may be a conductive region. The oxide semiconductor may be an oxide semiconductor containing indium (In). In an embodiment, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc tin oxide (IGZTO), or the like within the spirit and the scope of the disclosure. However, the disclosure is not limited thereto.

The first gate insulating layer 103 is disposed on the semiconductor layer and the buffer layer 102. The first gate insulating layer 103 may be disposed on the buffer layer 102 as well as on the semiconductor layer. The first gate insulating layer 103 may function as a gate insulating film of the driving transistor DT and the switching transistor ST. The first gate insulating layer 103 may be formed as an inorganic layer including an inorganic material, for example, silicon oxide (SiOx), silicon nitride (SiNx), or silicon oxynitride (SiON), or may be formed in a structure in which such inorganic layers may be stacked each other.

The first gate conductive layer is disposed on the first gate insulating layer 103. The first gate conductive layer may include a first gate electrode DT_G of the driving transistor DT and a second gate electrode ST_G of the switching transistor ST. The first gate electrode DT_G may be disposed to overlap the first channel region DT_ACTc of the first active material layer DT_ACT in a thickness direction, and the second gate electrode ST_G may be disposed to overlap the second channel region ST_ACTc of the second active material layer ST_ACT in the thickness direction.

The first gate conductive layer may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof. However, the disclosure is not limited thereto.

The first passivation layer 105 is disposed on the first gate conductive layer. The first passivation layer 105 may be disposed to cover (or overlap) the first gate conductive layer to serve to protect the first gate conductive layer. The first passivation layer 105 may be formed as an inorganic layer including an inorganic material, for example, silicon oxide (SiOx), silicon nitride (SiNx), or silicon oxynitride (SiON), or may be formed in a structure in which such inorganic layers may be stacked each other.

The second gate conductive layer is disposed on the first passivation layer 105. The second gate conductive layer may include a first capacitor electrode CE1 of a storage capacitor of which at least a partial area is disposed to overlap the first gate electrode DT_G in the thickness direction. The first capacitor electrode CE1 may overlap the first gate electrode DT_G in the thickness direction with the first passivation layer 105 interposed therebetween, and the storage capacitor may be formed between the first capacitor electrode CE1 and the first gate electrode DT_G. The second gate conductive layer may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof. However, the disclosure is not limited thereto.

The first interlayer insulating layer 107 is disposed on the second gate conductive layer. The first interlayer insulating layer 107 may function as an insulating film between the second gate conductive layer and other layers disposed above the second gate conductive layer. The first interlayer insulating layer 107 may be formed as an inorganic layer including an inorganic material, for example, silicon oxide (SiOx), silicon nitride (SiNx), or silicon oxynitride (SiON), or may be formed in a structure in which such inorganic layers may be stacked each other.

The first data conductive layer is disposed on the first interlayer insulating layer 107. The first gate conductive layer may include a first source or drain electrode DT_SD1 and a second source or drain electrode DT_SD2 of the driving transistor DT and a first source or drain electrode ST_SD1 and a second source or drain electrode ST_SD2 of the switching transistor ST.

The first source or drain electrode DT_SD1 and the second source or drain electrode DT_SD2 of the driving transistor DT may be in contact with the first doped region DT_ACTa and the second doped region DT_ACTb of the first active material layer DT_ACT through contact holes penetrating through the first interlayer insulating layer 107 and the first gate insulating layer 103, respectively. The first source or drain electrode ST_SD1 and the second source or drain electrode ST_SD2 of the switching transistor ST may be in contact with the third doped region ST_ACTa and the fourth doped region ST_ACTb of the second active material layer ST_ACT through contact holes penetrating through the first interlayer insulating layer 107 and the first gate insulating layer 103, respectively. The first source or drain electrode DT_SD1 of the driving transistor DT and the first source or drain electrode ST_SD1 of the switching transistor ST may be electrically connected to the first light blocking layer BML1 and the second light blocking layer BML2 through other contact holes, respectively. In case that any one of the first source or drain electrodes DT_SD1 and ST_SD1 and the second source or drain electrodes DT_SD2 and ST_SD2 of the driving transistor DT and the switching transistor ST is a source electrode, the other of the first source or drain electrodes DT_SD1 and ST_SD1 and the second source or drain electrodes DT_SD2 and ST_SD2 may be a drain electrode. However, the disclosure is not limited thereto, and in case that any one of the first source or drain electrodes DT_SD1 and ST_SD1 and the second source or drain electrodes DT_SD2 and ST_SD2 is a drain electrode, the other of the first source or drain electrodes DT_SD1 and ST_SD1 and the second source or drain electrodes DT_SD2 and ST_SD2 may be a source electrode.

The first data conductive layer may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof. However, the disclosure is not limited thereto.

The second interlayer insulating layer 108 may be disposed on the first data conductive layer. The second interlayer insulating layer 108 may cover the first data conductive layer, and may be entirely disposed on the first interlayer insulating layer 107, and may serve to protect the first data conductive layer. The second interlayer insulating layer 108 may be formed as an inorganic layer including an inorganic material, for example, silicon oxide (SiOx), silicon nitride (SiNx), or silicon oxynitride (SiON), or may be formed in a structure in which such inorganic layers may be stacked each other.

The second data conductive layer is disposed on the second interlayer insulating layer 108. The second data conductive layer may include a first voltage line VL1, a second voltage line VL2, the alignment line AL, and the first conductive pattern CDP. A high potential voltage (or a first source voltage) supplied to the driving transistor DT may be applied to the first voltage line VL1, and a low potential voltage (or a second source voltage) supplied to the second electrode 220 may be applied to the second voltage line VL2. Alignment signals necessary for aligning the light emitting elements 300 may be applied to the first voltage line VL1 and the second voltage line VL2 during a process of manufacturing the display device 10.

The alignment line AL may receive an alignment signal necessary for aligning the light emitting elements 300 during the process of manufacturing the display device 10, and may be electrically connected to any one of the second electrodes 220 to transfer the alignment signal to the second electrode 220. Only one alignment line AL has been illustrated in the drawings, but the disclosure is not limited thereto. In the display device 10, a larger number of alignment lines AL may also be disposed according to the numbers of electrodes 210 and 220 disposed on the display element layer.

The first conductive pattern CDP may be electrically connected to the first source or drain electrode DT_SD1 of the driving transistor DT through a contact hole formed in the second interlayer insulating layer 108. The first conductive pattern CDP may also be in contact with a first electrode 210 to be described later, and the driving transistor DT may transfer the first source voltage applied from the first voltage line VL1 to the first electrode 210 through the first conductive pattern CDP. It has been illustrated in the drawings that the second data conductive layer may include one second voltage line VL2 and one first voltage line VL1, but the disclosure is not limited thereto. The second data conductive layer may include larger numbers of first voltage lines VL1 and second voltage lines VL2.

The second data conductive layer may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof. However, the disclosure is not limited thereto.

The first planarization layer 109 is disposed on the second data conductive layer. The first planarization layer 109 may include an organic insulating material, for example, an organic material such as polyimide (PI), and perform a surface planarization function.

Internal banks 410 and 420, electrodes 210 and 220, an external bank 450, contact electrodes 261 and 262, and light emitting elements 300 are disposed on the first planarization layer 109. In addition, Insulating layers 510, 520, 530, and 550 may be further disposed on the first planarization layer 109.

The internal banks 410 and 420 are disposed on or directly disposed on the first planarization layer 109. The internal banks 410 and 420 may include a first internal bank 410 and a second internal bank 420 disposed adjacent to a central portion of each pixel PX or sub-pixel PXn.

The first internal bank 410 and the second internal bank 420 may be disposed to be spaced apart from and face each other in a first direction DR1. The first internal bank 410 and the second internal bank 420 may extend in a second direction DR2, but may be spaced and terminated at boundaries between the sub-pixels PXn so as not to extend to other sub-pixels PXn neighboring in the second direction DR2. Accordingly, the first internal bank 410 and the second internal bank 420 may be disposed for each sub-pixel PXn to form a pattern in the entirety of the display device 10. The internal banks 410 and 420 are disposed to be spaced apart from and face each other, such that an area in which the light emitting elements 300 are disposed may be formed between the internal banks 410 and 420. It has been illustrated in the drawings that one first internal bank 410 and one second internal bank 420 are disposed, but the disclosure is not limited thereto. In some cases, larger numbers of internal banks 410 and 420 may also be further disposed according to the numbers of electrodes 210 and 220 to be described later.

The first internal bank 410 and the second internal bank 420 may have widths WB1 and WB2, respectively, and may have a structure in which at least portions thereof protrude from an upper surface of the first planarization layer 109. The first internal bank 410 and the second internal bank 420 may have the same widths WB1 and WB2, respectively, the protruding portions of the first internal bank 410 and the second internal bank 420 may have inclined side surfaces, and the light emitted from the light emitting elements 300 may travel toward the inclined side surfaces of the internal banks 410 and 420. As described later, in case that the electrodes 210 and 220 disposed on the internal banks 410 and 420 include a material having high reflectivity, the light emitted from the light emitting elements 300 may be reflected by the electrodes 210 and 220 disposed on the side surfaces of the internal banks 410 and 420 and be emitted in an upward direction of the first substrate 101. For example, the internal banks 410 and 420 may function as reflective partition walls reflecting the light emitted from the light emitting elements 300 toward the upward direction while providing the area in which the light emitting elements 300 are disposed. In an embodiment, the internal banks 410 and 420 may include an organic insulating material such as polyimide (PI), but are not limited thereto.

The electrodes 210 and 220 are disposed on the internal banks 410 and 420 and the first planarization layer 109. The electrodes 210 and 220 may include a first electrode 210 disposed on the first internal bank 410 and a second electrode 220 disposed on the second internal bank 420.

By way of example, the first electrode 210 may be disposed to extend in the second direction DR2 in each sub-pixel PXn. However, the first electrode 210 may be disposed to be separated so as not to extend to other sub-pixels PXn neighboring in the second direction DR2. A portion of the first electrode 210 extending in the second direction DR2 may be disposed to overlap the external bank 450, and the first electrode 210 may be electrically connected to the driving transistor DT at a portion where it overlaps the external bank 450. For example, the first electrode 210 may be in contact with the first conductive pattern CDP through a first contact hole CT1 formed in an area in which it overlaps the external bank 450 and penetrating through the first planarization layer 109, and may be electrically connected to the first source or drain electrode DT_SD1 of the driving transistor DT through the first conductive pattern CDP. However, the disclosure is not limited thereto, and the first electrode 210 may also be disposed to extend in the second direction DR2 beyond other neighboring sub-pixels PXn.

The second electrode 220 may be disposed to extend in the second direction DR2 in each sub-pixel PXn. The second electrode 220 may be disposed to extend to other sub-pixels PXn neighboring in the second direction DR2, unlike the first electrode 210. For example, one connected second electrode 220 may be disposed in sub-pixels PXn neighboring to each other in the second direction DR2. However, the disclosure is not limited thereto. Similar to the first electrode 210, the second electrode 220 may also be disposed to be separated for each sub-pixel PXn so as not to extend to other sub-pixels PXn neighboring in the second direction DR2.

The second electrode 220 may partially overlap the external bank 450 at a boundary of the sub-pixel PXn neighboring in the second direction DR2, and the second electrode 220 may be electrically connected to the second voltage line VL2 or the alignment line AL in an area in which it overlaps the external bank 450. For example, the second electrode 220 may be in contact with the second voltage line VL2 or the alignment line AL through a second contact hole CT2 formed in the area in which it overlaps the external bank 450 and penetrating through the first planarization layer 109. The second electrodes 220 of the sub-pixels PXn neighboring to each other in the first direction DR1 may be electrically connected to the second voltage line VL2 or the alignment line AL through the second contact holes CT2, respectively. In case that the second electrode 220 is disposed to be separated for each sub-pixel PXn, the second electrodes 220 disposed in each sub-pixel PXn may be electrically connected to the alignment line AL or the second voltage line VL2 through the second contact holes CT2.

An embodiment in which each of the first contact hole CT1 and the second contact hole CT2 overlaps the external bank 450 has been illustrated in the drawings, but the disclosure is not limited thereto. In an embodiment, the first contact hole CT1 and the second contact hole CT2 may not overlap the external bank 450, and may also be disposed in an area surrounded by the external bank 450.

The first electrode 210 and the second electrode 220 may be disposed on the first internal bank 410 and the second internal bank 420, respectively, and may be spaced apart from and face each other in the first direction DR1. Light emitting elements 300 may be disposed between the first internal bank 410 and the second internal bank 420, and may have at least one end electrically connected to the first electrode 210 and the second electrode 220.

In the display device 10 according to an embodiment, at least one of the first electrode 210 or the second electrode 220 may include main electrodes and sub-electrodes disposed to be spaced apart from each other. The main electrode and the sub-electrodes included in one electrode 210 or 220 may be at least partially disposed on the same internal bank 410 and 420, respectively, but may include portions spaced apart from and facing each other. The main electrode including any one of the electrodes 210 and 220 may be spaced apart from and face the other of the electrodes 210 and 220 or the main electrode of the other of the electrodes.

For example, as illustrated in FIG. 3, the second electrode 220 may include a sub-electrode 220A and a main electrode 220C. The sub-electrode 220A and the main electrode 220C may extend in the second direction DR2, respectively, and may include portions spaced apart and facing each other in the first direction DR1 on the second internal bank 420. It has been illustrated in the drawing that the sub-electrode 220A and the main electrode 220C of the second electrode 220 are spaced apart from each other and are not physically connected to each other, but the disclosure is not limited thereto. The sub-electrode 220A and the main electrodes 220C may include a partially spaced area therebetween, and the second electrode 220 may include a portion partially connecting the sub-electrode 220A and the main electrodes 220C to each other. For a description thereof, reference is made to an embodiment.

Each of the electrodes 210 and 220 may have a smaller width (or a width less than) than the internal banks 410 and 420. According to an embodiment, a width WE1 of the first electrode 210 and a width WE2 of the sub-electrode 220A and the main electrode 220C may be smaller (or a width less than) than the width WB1 of the first internal bank 410 and the width WB2 of the second internal bank 420, respectively. The first electrode 210 may be disposed to cover only one side (or a side) of the first internal bank 410 facing the second internal bank 420, and the second electrode 220 may be disposed so that the sub-electrode 220A and the main electrode 220C cover both sides of the second internal bank 420, respectively. The main electrode 220C of the second electrode 220 may be disposed to be spaced apart from and face the first electrode 210 and be disposed to cover one side of the second internal bank 420 facing the first internal bank 410, and the sub-electrode 220A of the second electrode 220 may be disposed to cover the other side of the second internal bank 420. Accordingly, at least partial areas of the first electrode 210 and the second electrode 220 may be disposed on or directly disposed on the first planarization layer 109.

An interval DEB between the main electrode 220C and the sub-electrodes 220A of the second electrode 220 may be smaller (or a less than) than the widths WB1 and WB2 of the internal banks 410 and 420. Accordingly, even though the sub-electrode 220A and the main electrodes 220C of the second electrode 220 has the width WE2 smaller (or a width less than) than the width WB2 of the second internal bank 420, at least portions of the sub-electrode 220A and the main electrodes 220C may be disposed on the second internal bank 420. The main electrode 220C may be disposed on the inclined side surface of one side of the second internal bank 420, and the light emitted from the light emitting elements 300 may be reflected by the main electrode 220C.

The sub-electrode 220A and the main electrodes 220C of the second electrode 220 may be electrically connected to the second voltage line VL2 or the alignment line AL. The sub-electrode 220A may be electrically connected to the alignment line AL, and the main electrode 220C may be electrically connected to the second voltage line VL2. As described above, the alignment signal may be applied to each of the second voltage line VL2 and the alignment line AL during the process of manufacturing the display device 10. However, the second source voltage may be applied only to the second voltage line VL2 during driving of the display device 10.

The second electrode 220 may include the sub-electrode 220A and the main electrodes 220C to which the same electrical signal is applied during the process of manufacturing the display device 10, but to which different electrical signals are applied during the driving of the display device 10. The sub-electrode 220A and the main electrodes 220C of the second electrode 220 may be electrodes distinguished from each other. As an example, the sub-electrode 220A may be an alignment electrode to which the alignment signal is applied, and the main electrode 220C may be a driving electrode to which the second source voltage is applied while being an alignment electrode.

The first electrode 210 may be formed as one electrode and disposed on one side of the first internal bank 410. The alignment signal may be transferred to the first electrode 210 through the first voltage line VL1 during the process of manufacturing the display device 10, and the first source voltage may be transferred to the first electrode 210 through the first voltage line VL1 during the driving of the display device 10. However, the disclosure is not limited thereto, and in an embodiment, the first electrode 210 may also include at least one main electrode and sub-electrodes 210A_1 and 210C_1 (see FIG. 10) distinguished from each other. The main electrode of the first electrode 210 may be electrically connected to the first voltage line VL1 through the driving transistor DT, and the other sub-electrode of the first electrode 210 may be electrically connected to the other alignment line AL. Also, in a case of the first electrode 210, the sub-electrode may be an alignment electrode, and the other main electrode may be a driving electrode to which the first source voltage is applied, while being an alignment electrode.

In the display device 10, at least one of the first electrode 210 and the second electrode 220 may include a main electrode and a sub-electrode, and at least portions of the main electrode and the sub-electrodes may be physically spaced apart from each other, such that areas in which the electrodes 210 and 220 are not disposed may be formed on the internal banks 410 and 420. Any one of the main electrode and the sub-electrodes may be spaced apart from and face the other electrode 210 or 220, and an area in which the electrodes 210 and 220 are not disposed may also be formed between the internal banks 410 and 420.

For example, the main electrode 220C of the second electrode 220 may be spaced apart from and face the first electrode 210, and the sub-electrode 220A of the second electrode 220 may be spaced apart from and face the main electrode 220C. In case that the first electrode 210 may include the main electrode and the sub-electrodes, the main electrode of the first electrode 210 and the main electrode 220C of the second electrode 220 may be disposed to be spaced apart from each other. For example, according to an embodiment, the first electrode 210 and the second electrode 220 may not be disposed on at least portions of upper surfaces of the first internal bank 410 and the second internal bank 420. The display device 10 may include an area between the first electrode 210 and the main electrode 220C of the second electrode 220 or an area between the first internal bank 410 and the second internal bank 420 and an area between the main electrode 220C and the sub-electrode 220A of the second electrode 220 or an upper area of the second internal bank 420, as areas between the electrodes.

The display device 10 may include the light emitting elements 300 electrically connected to different electrodes 210 and 220. The light emitting elements 300 may be jetted onto the first electrode 210 and the second electrode 220 in a state in which they are dispersed in ink through an inkjet process, and may be aligned between the first electrode 210 and the second electrode 220 by a method of applying alignment signals to the first electrode 210 and the second electrode 220 to apply a dielectrophoretic force to the light emitting elements 300. In case that different alignment signals are applied to the respective electrodes, an electric field may be generated between the respective electrodes. For example, in case that a first alignment signal is applied to the first electrode 210 and a second alignment signal is applied to the second electrode 220, an electric field may be generated by the alignment signals between the first electrode 210 and the second electrode 220. The electric field may transfer the dielectrophoretic force to the light emitting elements 300 in the ink jetted onto the electrodes 210 and 220, and the light emitting elements 300 may receive the dielectrophoretic force to be disposed between the electrodes 210 and 220 while their orientation directions and positions are changed.

An electric field may be generated by different alignment signals between the first electrode 210 and the main electrode 220C of the second electrode 220 spaced apart from and facing the first electrode 210. The electric field may have a potential gradient according to a position. The light emitting elements 300 may receive the dielectrophoretic force according to the potential gradient or a change amount in potential. The potential gradient by different electrical signals may be generated so that the light emitting elements 300 may be directed to a direction in which the light emitting elements 300 may be disposed between the first electrode 210 and the main electrode 220C of the second electrode 220.

On the other hand, the same second alignment signal may be applied to each of the sub-electrode 220A and the main electrode 220C of the second electrode 220, and a potential gradient or a change amount in potential of an electric field generated between the sub-electrode 220A and the main electrode 220C may be generated in an opposite direction. For example, the electric field generated between the sub-electrode 220A and the main electrode 220C may have a potential gradient toward an outward direction so that the light emitting elements 300 are not disposed between the sub-electrode 220A and the main electrode 220C, and the light emitting elements 300 may not be disposed between the sub-electrode 220A and the main electrode 220C of the second electrode 220. A more detailed description will be provided later.

In the display device 10, at least one of the electrodes 210 and 220 may include the main electrode and the sub-electrodes to induce the light emitting elements 300 not to be disposed in an area between the main electrode and the sub-electrodes and induce the light emitting elements 300 to be disposed in an area between different electrodes 210 and 220. The electrodes 210 and 220 may be disposed on different internal banks 410 and 420, respectively, but each main electrode and sub-electrodes may be disposed on the same internal bank 410 or 420. Accordingly, the light emitting elements 300 may be disposed between the different internal banks 410 and 420, but may not be disposed on the internal banks 410 and 420.

According to an embodiment, the alignment area AA in which the light emitting elements 300 are disposed may be formed between the first electrode 210 and the main electrode 220C of the second electrode 220, and the non-alignment area NA in which the light emitting elements 300 are not disposed may be formed in areas adjacent to the electrodes 210 and 220 among areas other than the alignment area AA. For example, the non-alignment area NA may include a first non-alignment area NA1 formed on a side opposite to the alignment area AA with respect to the first electrode 210 and a second non-alignment area NA2 formed between the main electrode 220C and the sub-electrode 220A of the second electrode 220. The alignment area AA may be formed between the electrodes to which different electrical signals are applied, and the non-alignment area NA may be an area other than the alignment area, and may be formed between electrodes to which the same electrical signal is applied, as well as in an area in which electrodes to which electrical signals are applied are not disposed. As an example, the first non-alignment area NA1 may be formed on the first internal bank 410, but may be formed in an area in which an electrode other than the first electrode 210 is not disposed, and the second non-alignment area NA2 may be formed on the second internal bank 420, but may be formed between the main electrode 220C and the sub-electrode 220A of the second electrode 220 to which the same electrical signal is applied. It has been illustrated in the drawings that one alignment area AA and two non-alignment areas NA are formed, but the disclosure is not limited thereto. The numbers of alignment areas AA and non-alignment areas NA may be changed depending on the numbers of internal banks 410 and 420 and electrodes 210 and 220.

The light emitting elements 300 disposed in the alignment area AA may have both ends electrically connected respectively to the first electrode 210 and the second electrode 220 to emit the light. On the other hand, in case that the light emitting elements 300 are disposed in the non-alignment area NA, both ends of the light emitting elements 300 may be connected to the second electrodes 220 to which the same electrical signal is applied, and thus, these light emitting elements 300 may not emit the light and may be lost light emitting elements 300. In the display device 10 according to an embodiment, the light emitting elements 300 may be intensively disposed in an area in which the light emitting elements 300 may be electrically connected to different electrodes 210 and 220, and the number of light emitting elements 300 that are disposed in the non-alignment area NA and are lost may be minimized. The display device 10, an area in which the electrodes 210 and 220 are disposed per unit area may be decreased, such that external light reflection of the display device 10 may be decreased.

For example, according to an embodiment, in the display device 10, the light emitting elements 300 may be disposed in an area in which the internal banks 410 and 420 are spaced apart from each other, and may not be disposed on the internal banks 410 and 420. The first electrode 210 and the second electrode 220 electrically connected respectively to both ends of the light emitting elements 300 may be disposed on the first internal bank 410 and the second internal bank 420, respectively. The light emitting elements 300 may be disposed between the different internal banks 410 and 420, such that both ends of the light emitting elements 300 may be electrically connected to the electrodes 210 and 220 to which the different electrical signals are applied.

On the other hand, the electrodes 210 and 220 to which the same electrical signal is applied are disposed on the internal banks 410 and 420, respectively, and thus, the light emitting elements 300 may not be disposed on the internal banks 410 and 420. In the display device 10 according to an embodiment, as described above, at least one of the electrodes 210 and 220 may include the main electrode and the sub-electrode, and thus, the alignment area AA may be formed in an area in which the internal banks 410 and 420 are spaced apart from each other and the non-alignment area NA may be formed on the internal banks 410 and 420.

According to an embodiment, in the display device 10, at least one of the electrodes may include the main electrode electrically connected to the light emitting elements 300 and the sub-electrode that is not electrically connected to the light emitting elements 300. As illustrated in FIG. 3, the second electrode 220 may include the main electrode 220C electrically connected to the light emitting elements 300 and the sub-electrode 220C that is not electrically connected to the light emitting elements 300. During the driving of the display device 10, an electrical signal may be applied only to the main electrode 220C of the second electrode 220, and may not be applied to the sub-electrode 220A of the second electrode 220. The display device 10 according to an embodiment may include a pair of electrodes disposed for each sub-pixel PXn and electrically connected to the light emitting elements 300, and any one of the pair of electrodes may include an electrode which is disposed on the same internal bank 410 or 420 and to which an electrical signal is not applied.

However, the disclosure is not limited thereto. In an embodiment, the display device 10 may also include sub-electrodes to which the same electrical signal is applied and which are disposed on the same internal bank 410 or 420 and electrodes which are disposed spaced apart from these sub-electrodes, respectively, and to which an electrical signal different from the electrical signal applied to the sub-electrodes is applied.

Shapes of the electrodes 210 and 220 are not limited thereto. The display device 10 according to an embodiment is not particularly limited as long as it has a structure in which electrodes to which different alignment signals are applied and electrodes to which the same alignment signal is applied may be sequentially disposed to be spaced apart from each other during the process of manufacturing the display device 10. As illustrated in FIG. 3, the display device 10 may have a structure in which the electrodes to which the different alignment signals are applied and the electrodes to which the same alignment signal is applied are sequentially disposed to be spaced apart from each other along one direction. The first electrode 210 to which a different signal is applied may be disposed on one side of the main electrode 220C of the second electrode 220, and the sub-electrode 220A to which the same signal is applied may be disposed on the other side of the main electrode 220C of the second electrode 220. Similarly, the display device 10 may also have a structure in which an electrode to which the same alignment signal as the alignment signal applied to any one of the first electrode 210 and the second electrode 220 is applied is disposed between the first electrode 210 and the second electrode 220 to which the different alignment signals are applied.

In an embodiment, the first electrode 210 and the second electrode 220 may further include stem parts extending in the first direction DR1. In the first electrode 210, different stem parts may be disposed for each sub-pixel PXn, and in the second electrode 220, one stem may extend to the sub-pixels PXn neighboring to each other in the first direction DR1, such that the second electrodes 220 of the respective sub-pixels PXn may be electrically connected to each other through the stem part. The second electrode 220 may be electrically connected to the second voltage line VL2 in the non-display area NDA positioned outside the display area DPA in which the pixels PX or sub-pixels PXn are disposed.

It has been illustrated in the drawings that one first electrode 210 and a pair of second electrodes 220 including one main electrode and sub-electrodes are disposed for each sub-pixel PXn, but the disclosure is not limited thereto. In an embodiment, the numbers of first electrodes 210 and second electrodes 220 disposed for each sub-pixel PXn may be larger than those illustrated in the drawings. Each of the sub-pixels PXn of the display device 10 may include a larger number of electrodes to which the same alignment signal is applied. The first electrode 210 and the second electrode 220 disposed in each sub-pixel PXn may not necessarily have a shape in which they extend in one direction, and the first electrode 210 and the second electrode 220 may be disposed in various structures. For example, the first electrode 210 and the second electrode 220 may have a partially curved or bent shape, and any one of the first electrode 210 and the second electrode 220 may be disposed to surround the other of the first electrode 210 and the second electrode 220. The first electrode 210 and the second electrode 220 are not particularly limited in arrangement structures and shapes thereof as long as at least partial areas thereof are spaced apart from and face each other and accordingly, an area in which the light emitting elements 300 are to be disposed is formed between the first electrode 210 and the second electrode 220.

In an embodiment, the first electrode 210 may be an electrode separated for each sub-pixel PXn, and the second electrode 220 may be an electrode commonly connected along each sub-pixel PXn. Any one of the first electrode 210 and the second electrode 220 may be electrically connected to an anode electrode of the light emitting element 300, and the other of the first electrode 210 and the second electrode 220 may be electrically connected to a cathode electrode of the light emitting element 300. However, the first electrode 210 and the second electrode 220 are not limited thereto, and vice versa.

Each of the electrodes 210 and 220 may include a transparent conductive material. As an example, each of the electrodes 210 and 220 may include a material such as indium tin oxide (ITO), indium zinc oxide (IZO), or indium tin zinc oxide (ITZO), but is not limited thereto. In an embodiment, each of the electrodes 210 and 220 may include a conductive material having high reflectivity. For example, each of the electrodes 210 and 220 may include a metal such as silver (Ag), copper (Cu), or aluminum (Al) as the material having the high reflectivity. Each of the electrodes 210 and 220 may reflect the light emitted from the light emitting elements 300 and traveling toward the side surfaces of the first internal bank 410 and the second internal bank 420 in an upward direction of each sub-pixel PXn.

The disclosure is not limited thereto, and the respective electrodes 210 and 220 may have a structure in which one or more layers made of the transparent conductive material and one or more layers made of the metal having the high reflectivity may be stacked or may be formed as one layer (or a layer) including the transparent conductive material and the metal having the high reflectivity. In an embodiment, each of the electrodes 210 and 220 may have a stacked structure of ITO/silver (Ag)/ITO/IZO or be made of an alloy including aluminum (Al), nickel (Ni), lanthanum (La), and the like within the spirit and the scope of the disclosure.

The first insulating layer 510 is disposed on the first planarization layer 109 so as to partially cover the first electrode 210 and the second electrode 220. For example, the first insulating layer 510 may be disposed on the first planarization layer 109 as well as on the first electrode 210 and the second electrode 220, but may be disposed to expose portions of upper surfaces of the first electrode 210 and the second electrode 220. Openings partially exposing the first electrode 210 and the second electrode 220 may be formed in the first insulating layer 510. The openings may expose portions of the first electrode 210 and the main electrode 220C of the second electrode 220 spaced apart from and facing the first electrode 210. However, the first electrode 210 and the main electrode 220C and the sub-electrodes 220A of the second electrode 220 have the widths WE1 and WE2 that are relatively small, respectively, and thus, the openings may expose portions of the upper surfaces of the first internal bank 410 and the second internal bank 420. As illustrated in FIG. 5, the openings may be formed in the first insulating layer 510 on one side or sides of the first internal bank 410 and the second internal bank 420 facing each other, and portions of upper surfaces of the first electrode 210 and the main electrode 220C of the second electrode 220 may be exposed. At the same time, one side or sides of the first internal bank 410 and the second internal bank 420 may also be partially exposed. The exposed first electrode 210 and main electrode 220C may be in contact with contact electrodes 261 and 262 to be described later, respectively.

However, the first insulating layer 510 may cover the other sides of the respective internal banks 410 and 420 so that the other sides of the respective internal banks 410 and 420 are not exposed. Accordingly, the sub-electrode 220A of the second electrode 220 may be completely covered by the first insulating layer 510. The sub-electrode 220A may not be in contact with contact electrodes 261 and 262 to be described later.

The first insulating layer 510 may insulate the first electrode 210 and the second electrode 220 from each other while protecting the first electrode 210 and the second electrode 220. The first insulating layer 510 may prevent the light emitting elements 300 disposed on the first insulating layer 510 from being in direct contact with and being damaged by other members. However, a shape and a structure of the first insulating layer 510 are not limited thereto.

In an embodiment, the first insulating layer 510 may have a step formed at a portion of an upper surface thereof between the first electrode 210 and the second electrode 220. In an embodiment, the first insulating layer 510 may include an inorganic insulating material, and a portion of the upper surface of the first insulating layer 510 disposed to partially cover the first electrode 210 and the second electrode 220 may be stepped due to a step formed by the electrodes 210 and 220 disposed below the first insulating layer 510. Accordingly, the light emitting element 300 disposed on the first insulating layer 510 between the first electrode 210 and the second electrode 220 may form an empty space between the light emitting element 300 and the upper surface of the first insulating layer 510. The empty space may also be filled with a material constituting a second insulating layer 520 to be described later.

However, the disclosure is not limited thereto. The first insulating layer 510 may be formed so that a portion thereof disposed between the first electrode 210 and the second electrode 220 has a flat upper surface. The upper surface may extend in one direction toward the first electrode 210 and the second electrode 220, and the first insulating layer 510 may also be disposed on areas in which the electrodes 210 and 220 overlap the inclined side surfaces of the first internal bank 410 and the second internal bank 420, respectively. The contact electrodes 261 and 262 may be in contact with exposed areas of the first electrode 210 and the second electrode 220, respectively, and may be in smooth contact with ends of the light emitting element 300 on the flat upper surface of the first insulating layer 510.

The external bank 450 may be disposed on the first insulating layer 510. As illustrated in FIGS. 2 and 3, the external bank 450 may be disposed at a boundary between the respective sub-pixels PXn. The external bank 450 may be disposed to extend in at least the second direction DR2, and may be disposed to surround portions of the internal electrodes 410 and 420 and the electrodes 210 and 220 as well as the area in which the light emitting elements 300 are disposed between the internal electrodes 410 and 420 and the electrodes 210 and 220. The external bank 450 may further include portions extending in the first direction DR1, and may form a lattice pattern over the entirety of the display area DPA.

According to an embodiment, a height of the external bank 450 may be greater than a height of the internal banks 410 and 420. Unlike the internal banks 410 and 420, the external bank 450 may serve to prevent ink from overflowing into adjacent sub-pixels PXn in an inkjet printing process of disposing the light emitting elements 300 among processes of manufacturing the display device 10 as described later while dividing the neighboring sub-pixels PXn. For example, the external bank 450 may separate inks in which different light emitting elements 300 are dispersed for each of different sub-pixels PXn from each other so that these inks are not mixed with each other. The external bank 450 may include polyimide (PI) like the internal banks 410 and 420, but is not limited thereto.

The light emitting elements 300 may be disposed in the alignment area AA formed between the first electrode 210 and the second electrode 220 or between the first internal bank 410 and the second internal bank 420. The light emitting elements 300 may have one end or an end electrically connected to the first electrode 210 and the other end or another end electrically connected to the second electrode 220 or the main electrode 220C of the second electrode 220. In an embodiment, the light emitting elements 300 may be electrically connected to the first electrode 210 and the second electrode 220 through the contact electrodes 261 and 262, respectively.

The light emitting elements 300 may be disposed to be spaced apart from each other, and may be aligned substantially parallel to each other. An interval between the light emitting elements 300 spaced apart from each other is not particularly limited. In some cases, the light emitting elements 300 may be disposed adjacent to each other and be grouped, and other light emitting elements 300 may be grouped in a state in which they are spaced apart from the light emitting elements 300 by an interval, or the light emitting elements 300 may have a non-uniform density, and may be oriented and aligned in one direction. In an embodiment, the light emitting elements 300 may have a shape in which they extend in one direction, and a direction in which the respective electrodes 210 and 220 extend and a direction in which the light emitting elements 300 extend may be substantially perpendicular to each other. However, the disclosure is not limited thereto, and the light emitting elements 300 are not perpendicular to the direction in which the respective electrodes 210 and 220 extend, and may also be disposed to be oblique with respect to the direction in which the respective electrodes 210 and 220 extend.

The light emitting elements 300 according to an embodiment may include active layers 330 including different materials to emit light of different wavelength bands to the outside. The display device 10 according to an embodiment may include the light emitting elements 300 emitting light of different wavelength bands. The light emitting elements 300 of the first sub-pixel PX1 may include active layers 330 emitting light of a first color of which a central wavelength band is a first wavelength, the light emitting elements 300 of the second sub-pixel PX2 may include active layers 330 emitting light of a second color of which a central wavelength band is a second wavelength, and the light emitting elements 300 of the third sub-pixel PX3 may include active layers 360 emitting light of a third color of which a central wavelength band is a third wavelength.

Accordingly, the light of the first color may be emitted from the first sub-pixel PX1, the light of the second color may be emitted from the second sub-pixel PX2, and the light of the third color may be emitted from the third sub-pixel PX3. In an embodiment, the light of the first color may be blue light having a central wavelength band in the range of about 450 nm to about 495 nm, the light of the second color may be green light having a central wavelength band in the range of about 495 nm to about 570 nm, and the light of the third color may be red light having a central wavelength band in the range of about 620 nm to about 752 nm. However, the disclosure is not limited thereto. In some cases, each of the first sub-pixel PX1, the second sub-pixel PX2, and the third sub-pixel PX3 may also include the same type of light emitting elements 300 to emit light of substantially the same color.

The light emitting elements 300 may be disposed on the first insulating layer 510 between the internal banks 410 and 420 or between the respective electrodes 210 and 220. At the same time, the light emitting elements 300 may be disposed so that partial areas thereof overlap the respective electrodes 210 and 220 in the thickness direction. According to an embodiment, a length of the light emitting element 300 may be greater than an interval DEA between the first electrode 210 and the main electrode 220C of the second electrode 220. One end of the light emitting element 300 may overlap the first electrode 210 in the thickness direction to be put on the first electrode 210, and the other end of the light emitting element 300 may overlap the second electrode 220 in the thickness direction to be put on the second electrode 220. However, the disclosure is not limited thereto, and although not illustrated in the drawings, at least some or a number of the light emitting elements 300 disposed in each sub-pixel PXn may also be disposed in an area other than an area formed between the internal banks 410 and 420, for example, between the internal banks 410 and 420 and the external bank 450.

The light emitting element 300 may include layers disposed in a direction parallel to the first substrate 101 or the upper surface of the first planarization layer 109. The light emitting element 300 of the display device 10 according to an embodiment may have a shape in which it extends in one direction, and may have a structure in which semiconductor layers are sequentially disposed in one direction. The light emitting element 300 may be disposed so that one direction in which the light emitting element 300 extends is parallel to the first planarization layer 109, and the semiconductor layers included in the light emitting element 300 may be sequentially disposed along the direction parallel to the upper surface of the first planarization layer 109. However, the disclosure is not limited thereto. In some cases, in case that the light emitting element 300 has another structure, the layers may also be disposed in a direction perpendicular to the first planarization layer 109.

The second insulating layer 520 may be partially disposed on the light emitting element 300 disposed between the first electrode 210 and the second electrode 220. For example, the second insulating layer 520 may be disposed on the first insulating layer 510 between the first electrode 210 and the second electrode 220, and the light emitting element 300 may be disposed between the first insulating layer 510 and the second insulating layer 520. In an embodiment, an insulating film 380 (see FIG. 6) formed on an outer surface of the light emitting element 300 may be in direct contact with the first insulating layer 510 and the second insulating layer 520. For example, the second insulating layer 520 may be disposed to partially surround the outer surface of the light emitting element 300 to fix the light emitting element 300 during the process of manufacturing the display device 10 while protecting the light emitting element 300.

A portion of the second insulating layer 520 disposed on the light emitting element 300 may have a shape in which it extends in the second direction DR2 between the first electrode 210 and the second electrode 220, in a plan view. As an example, the second insulating layer 520 may form a stripe-shaped or island-shaped pattern within each sub-pixel PXn.

The second insulating layer 520 may be disposed on the light emitting element 300, but may expose one end and the other end of the light emitting element 300. The exposed ends of the light emitting element 300 may be in contact with contact electrodes 261 and 262 to be described later, respectively. Such a shape of the second insulating layer 520 may be formed by performing a patterning process using a material constituting the second insulating layer 520 by a general mask process. A mask for forming the second insulating layer 520 may have a width smaller (or a width less than) than a length of the light emitting element 300, and both ends of the light emitting element 300 may be exposed by patterning the material constituting the second insulating layer 520. However, the disclosure is not limited thereto.

In an embodiment, a portion of the material of the second insulating layer 520 may also be disposed between a lower surface of the light emitting element 300 and the first insulating layer 510. The second insulating layer 520 may also be formed to fill a space between the first insulating layer 510 and the light emitting element 300 formed during the process of manufacturing the display device 10. Accordingly, the second insulating layer 520 may be formed to surround the outer surface of the light emitting element 300. However, the disclosure is not limited thereto.

The contact electrodes 261 and 262 and the third insulating layer 530 may be disposed on the second insulating layer 520.

The contact electrodes 261 and 262 may have a shape in which they extend in one direction. The contact electrodes 261 and 262 may be in contact with the light emitting elements 300 and the electrodes 210 and 220, respectively, and the light emitting elements 300 may receive electrical signals from the first electrode 210 and the second electrode 220 through the contact electrodes 261 and 262.

The contact electrodes 261 and 262 may include a first contact electrode 261 and a second contact electrode 262. The first contact electrode 261 and the second contact electrode 262 may be disposed on portions of the first electrode 210 and the second electrode 220, respectively. The first contact electrode 261 may be disposed on the first electrode 210, the second contact electrode 262 may be disposed on the main electrode 220C of the second electrode 220, and each of the first contact electrode 261 and the second contact electrode 262 may have a shape in which it extends in the second direction DR2. The first contact electrode 261 and the second contact electrode 262 may be spaced apart from and face each other in the first direction DR1, and may form a stripe-shaped pattern in the emission area EMA of each sub-pixel PXn.

In an embodiment, widths of the first contact electrode 261 and the second contact electrode 262 measured in one direction may be equal to or greater than widths of the first electrode 210 and the second electrode 220 measured in the one direction, respectively. The first contact electrode 261 and the second contact electrode 262 may be disposed to cover both side surfaces of the first electrode 210 and the main electrode 220C of the second electrode 220 while being in contact with one end and the other end of the light emitting element 300, respectively. As described above, portions of the upper surfaces of the first electrode 210 and the main electrode 220C may be exposed, and the first contact electrode 261 and the second contact electrode 262 may be in contact with the exposed upper surfaces of the first electrode 210 and the main electrode 220C, respectively. For example, the first contact electrode 261 may be in contact with a portion of the first electrode 210 positioned on the first internal bank 410, and the second contact electrode 262 may be in contact with a portion of the main electrodes 220C positioned on the second internal bank 420. In one embodiment, the first internal bank 410 and the second internal bank 420 exposed by the openings of the first insulating layer 510 may be in direct contact with the contact electrodes 261 and 262, respectively. The first contact electrode 261 and the second contact electrode 262 may have greater widths than the first electrode 210 and the main electrode 220C of the second electrode 220, respectively, and may be in contact with the internal banks 410 and 420 on which the first electrode 210 and the main electrode 220C are not disposed and which are exposed, respectively. An interval DC between the first contact electrode 261 and the second contact electrode 262 may be greater than the interval DEA between the first electrode 210 and the second electrode 220 or the main electrode 220C. The first contact electrode 261 and the second contact electrode 262 may be in smooth contact with both ends of the light emitting elements 300, respectively, by adjusting the interval DC therebetween.

The widths of the first contact electrode 261 and the second contact electrode 262 may be smaller than (or a width less than) the widths WB1 and WB2 of the internal banks 410 and 420, respectively, and the first contact electrode 261 and the second contact electrode 262 may be disposed on one side or a side or sides of the first internal bank 410 and the second internal electrode 420, respectively. Accordingly, the second contact electrode 262 may not be disposed on the sub-electrode 220C of the second electrode 220. The sub-electrode 220A of the second electrode 220 may be covered by the first insulating layer 510, and the second contact electrode 262 may not be in contact with the sub-electrode 220A. However, the disclosure is not limited thereto, and in an embodiment, the first contact electrode 261 and the second contact electrode 262 may also be formed to have greater widths to cover both sides of the internal banks 410 and 420, respectively, and the second contact electrode 262 may also be disposed on the sub-electrode 220A of the second electrode 220.

According to an embodiment, the light emitting element 300 may have semiconductor layers exposed on both end surfaces thereof in the direction in which it extends, and the first contact electrode 261 and the second contact electrode 262 may be in contact with the light emitting element 300 on the end surfaces on which the semiconductor layers are exposed. However, the disclosure is not limited thereto. In some cases, side surfaces of both ends of the light emitting element 300 may be partially exposed. An insulating film 380 (see FIG. 6) surrounding outer surfaces of the semiconductor layers of the light emitting element 300 may be partially removed in a process of forming the second insulating layer 520 covering the outer surface of the light emitting element 300 among the processes of manufacturing the display device 10, and side surfaces of the semiconductor layers of the light emitting element 300 may be partially exposed to be in contact with the first contact electrode 261 and the second contact electrode 262. One end of the light emitting element 300 may be electrically connected to the first electrode 210 through the first contact electrode 261, and the other end of the light emitting element 300 may be electrically connected to the second electrode 220 through the second contact electrode 262.

It has been illustrated in the drawings that one first contact electrode 261 and one second contact electrode 262 are disposed in one sub-pixel PXn, but the disclosure is not limited thereto. The numbers of first contact electrodes 261 and second contact electrodes 262 may be changed depending on the numbers of first electrodes 210 and second electrodes 220 disposed in each sub-pixel PXn.

The first contact electrode 261 is disposed on the first electrode 210 and the second insulating layer 520. The first contact electrode 261 may be in contact with one end of the light emitting element 300 and the exposed upper surface of the first electrode 210. One end of the light emitting element 300 may be electrically connected to the first electrode 210 through the first contact electrode 261.

The third insulating layer 530 is disposed on the first contact electrode 261. The third insulating layer 530 may electrically insulate the first contact electrode 261 and the second contact electrode 262 from each other. The third insulating layer 530 may be disposed to cover the first contact electrode 261, but may not be disposed on the other end of the light emitting element 300 so that the light emitting element 300 may be in contact with the second contact electrode 262. The third insulating layer 530 may be in partial contact with the first contact electrode 261 and the second insulating layer 520 on an upper surface of the second insulating layer 520. A side surface of the third insulating layer 530 in a direction in which the second electrode 220 is disposed may be aligned with one side surface (or a side surface) of the second insulating layer 520. The third insulating layer 530 may also be disposed on the non-emission area, for example, on the first insulating layer 510 disposed on the first planarization layer 109. However, the disclosure is not limited thereto.

The second contact electrode 262 is disposed on the second electrode 220, the second insulating layer 520, and the third insulating layer 530. The second contact electrode 262 may be in contact with the other end of the light emitting element 300 and the exposed upper surface of the second electrode 220. The other end of the light emitting element 300 may be electrically connected to the second electrode 220 through the second contact electrode 262.

For example, the first contact electrode 261 may be disposed between the first electrode 210 and the third insulating layer 530, and the second contact electrode 262 may be disposed on the third insulating layer 530. The second contact electrode 262 may be in partial contact with the second insulating layer 520, the third insulating layer 530, the second electrode 220, and the light emitting element 300. One end of the second contact electrode 262 may be disposed on the third insulating layer 530. The first contact electrode 261 and the second contact electrode 262 may not be in contact with each other by the second insulating layer 520 and the third insulating layer 530. However, the disclosure is not limited thereto, and in some cases, the third insulating layer 530 may be omitted.

The contact electrodes 261 and 262 may include a conductive material. For example, the contact electrodes 261 and 262 may include ITO, IZO, ITZO, aluminum (Al), or the like within the spirit and the scope of the disclosure. As an example, the contact electrodes 261 and 262 may include a transparent conductive material, and the light emitted from the light emitting elements 300 may be transmitted through the contact electrodes 261 and 262 and travel toward the electrodes 210 and 220. Each of the electrodes 210 and 220 may include a material having high reflectivity, and the electrodes 210 and 220 placed on the inclined side surfaces of the internal banks 410 and 420 may reflect the light incident thereon in the upward direction of the first substrate 101. However, the disclosure is not limited thereto.

The fourth insulating layer 550 may be entirely disposed on the first substrate 101. The fourth insulating layer 550 may serve to protect members disposed on the first substrate 101 from an external environment.

Each of the first insulating layer 510, the second insulating layer 520, the third insulating layer 530, and the fourth insulating layer 550 described above may include an inorganic insulating material or an organic insulating material. In an embodiment, the first insulating layer 510, the second insulating layer 520, the third insulating layer 530, and the fourth insulating layer 550 may include an inorganic insulating material such as silicon oxide (SiOx), silicon nitride (SiNx), silicon oxynitride (SiOxNy), aluminum oxide (Al2O3), or aluminum nitride (AlN). By way of example, first insulating layer 510, the second insulating layer 520, the third insulating layer 530, and the fourth insulating layer 550 may include an organic insulating material such as an acrylic resin, an epoxy resin, a phenolic resin, a polyamide resin, a polyimide resin, an unsaturated polyester resin, a polyphenylene resin, a polyphenylene sulfide resin, a benzocyclobutene, a cardo resin, a siloxane resin, a silsesquioxane resin, polymethyl methacrylate, polycarbonate, or polymethyl methacrylate-polycarbonate synthetic resin. However, the disclosure is not limited thereto.

The light emitting elements 300 may be light emitting diodes. By way of example, the light emitting elements 300 may be inorganic light emitting diodes having a size of a micrometer or nanometer scale and made of an inorganic material. The inorganic light emitting diodes may be aligned between two electrodes in which polarities are formed in case that an electric field is formed in a direction between the two electrodes facing each other. The light emitting elements 300 may be aligned between the two electrodes by the electric field formed on the two electrodes.

The light emitting element 300 according to an embodiment may have a shape in which it extends in one direction. The light emitting element 300 may have a shape such as a rod shape, a wire shape, or a tube shape. In an embodiment, the light emitting element 300 may have a cylindrical shape or a rod shape. However, the light emitting element 300 is not limited to having the shape described above, and may have various shapes. For example, the light emitting element 300 may have a polygonal prismatic shape such as a cubic shape, a rectangular parallelepiped shape, or a hexagonal prismatic shape or have a shape in which it extends in one direction but has partially inclined outer surfaces. Semiconductors included in a light emitting element 300 to be described later may have a structure in which they are sequentially disposed or stacked along the one direction.

The light emitting element 300 may include a semiconductor layer doped with any conductivity-type (for example, p-type or n-type) impurities. The semiconductor layer may receive an electrical signal applied from an external power source and emit the electrical signal as light of a wavelength band.

Figure 6:
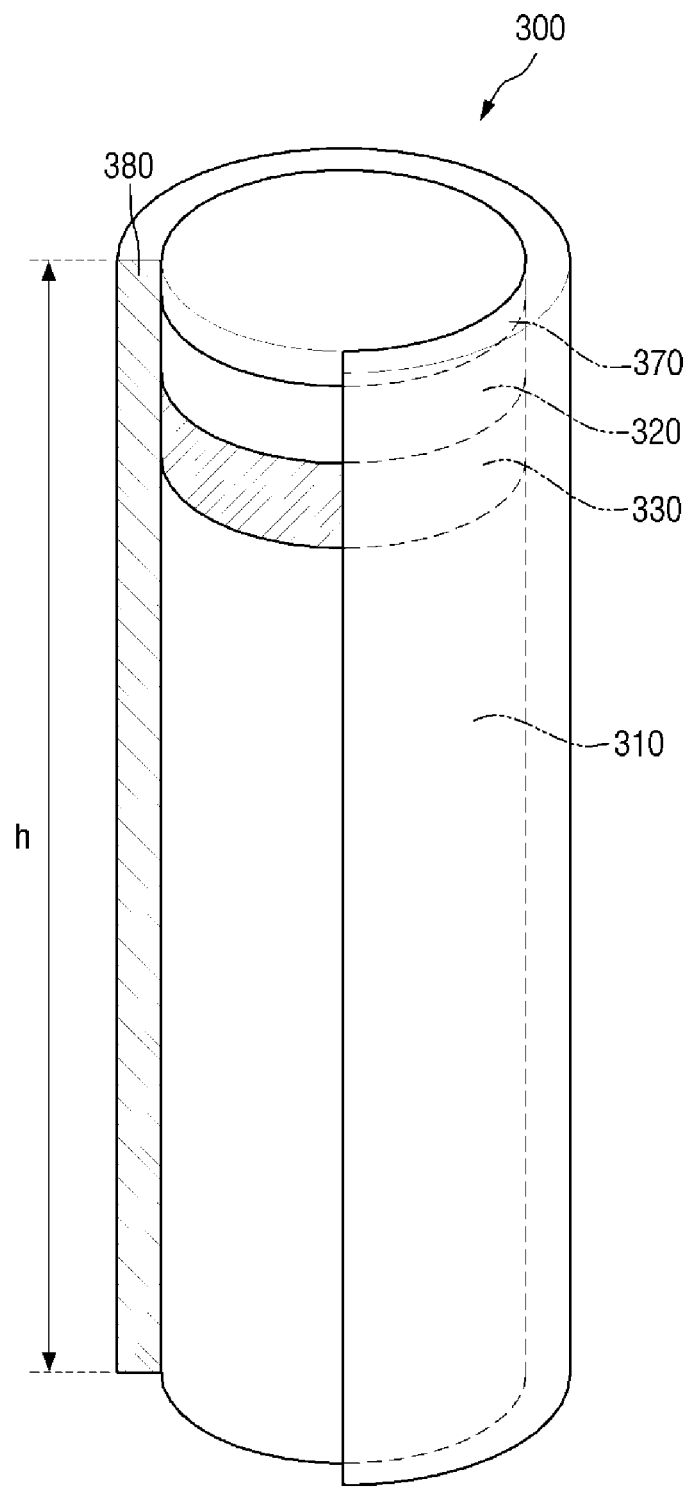
FIG. 6 is a schematic view of a light emitting element according to an embodiment.

FIG. 6 is a schematic view of a light emitting element according to an embodiment.

Referring to FIG. 6, the light emitting element 300 may include a first semiconductor layer 310, a second semiconductor layer 320, an active layer 330, an electrode layer 370, and an insulating film 380.

The first semiconductor layer 310 may be an n-type semiconductor. As an example, in case that the light emitting element 300 emits light of a blue wavelength band, the first semiconductor layer 310 may include a semiconductor material having a chemical formula of $Al_xGa_yIn_{1-x-y}N$ ($0 \le x \le 1$, $0 \le y \le 1$, and $0 \le x+y \le 1$). For example, the semiconductor material may be one or more of AlGaInN, GaN, AlGaN, InGaN, AlN, and InN doped with an n-type dopant. The first semiconductor layer 310 may be doped with an n-type dopant, which may be Si, Ge, Sn, or the like, as an example. In an embodiment, the first semiconductor layer 310 may be made of n-GaN doped with n-type Si. A length of the first semiconductor layer 310 may be in a range of about 1.5 μm to about 5 μm, but is not limited thereto.

The second semiconductor layer 320 is disposed on an active layer 330 to be described later. The second semiconductor layer 320 may be a p-type semiconductor, and as an example, in case that the light emitting element 300 emits light of a blue or green wavelength band, the second semiconductor layer 320 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more of AlGaInN, GaN, AlGaN, InGaN, AlN, and InN doped with a p-type dopant. The second semiconductor layer 320 may be doped with a p-type dopant, which may be Mg, Zn, Ca, Se, Ba, or the like, as an example. In an embodiment, the second semiconductor layer 320 may be made of p-GaN doped with p-type Mg. A length of the second semiconductor layer 320 may be in the range of about 0.05 μm to about 0.10 μm, but is not limited thereto.

It has been illustrated in the drawing that each of the first semiconductor layer 310 and the second semiconductor layer 320 is one layer, but the disclosure is not limited thereto. According to an embodiment, each of the first semiconductor layer 310 and the second semiconductor layer 320 may further include a larger number of layers, for example, a clad layer or a tensile strain barrier reducing (TSBR) layer, according to a material of the active layer 330. This will be described later with reference to other drawings.

The active layer 330 is disposed between the first semiconductor layer 310 and the second semiconductor layer 320. The active layer 330 may include a material having a single or multiple quantum well structure. In case that the active layer 330 may include the material having the multiple quantum well structure, the active layer 330 may have a structure in which quantum layers and well layers may be alternately stacked each other. The active layer 330 may emit light by a combination of electron-hole pairs according to electrical signals applied through the first semiconductor layer 310 and the second semiconductor layer 320. As an example in case that the active layer 330 emits light of a blue wavelength band, the active layer 330 may include a material such as AlGaN or AlGaInN. In in case that the active layer 330 has the multiple quantum well structure, for example, the structure in which the quantum layers and the well layers may be alternately stacked each other, the quantum layers may include a material such as AlGaN or AlGaInN, and the well layers may include a material such as GaN or AlInN. In an embodiment, the active layer 330 may include AlGaInN as a material of the quantum layers and AlInN as a material of the well layers to emit the blue light having the central wavelength band in a range of about 450 nm to about 495 nm, as described above.

However, the disclosure is not limited thereto, and the active layer 330 may have a structure in which semiconductor materials having large band gap energy and semiconductor materials having small band gap energy may be alternately stacked each other, and may include other Group III to Group V semiconductor materials according to a wavelength band of emitted light. The light emitted by the active layer 330 is not limited to the light of the blue wavelength band, and in some case, the active layer 330 may emit light of red and green wavelength bands. A length of the active layer 330 may be in a range of about 0.05 μm to about 0.10 μm, but is not limited thereto.

The light emitted from the active layer 330 may be emitted not only to outer surfaces of the light emitting element 300 in a length direction, but also to both side surfaces of the light emitting element 300. Directivity of the light emitted from the active layer 330 is not limited to one direction.

The electrode layer 370 may be an ohmic contact electrode. However, the disclosure is not limited thereto, and the electrode layer 370 may also be a Schottky contact electrode. The light emitting element 300 may include at least one electrode layer 370. It has been illustrated in FIG. 6 that the light emitting element 300 may include one electrode layer 370, but the disclosure is not limited thereto. In some cases, the light emitting element 300 may also include a larger number of electrode layers 370 or the electrode layer 370 may also be omitted. A description of a light emitting element 300 to be provided later may be equally applied even though the number of electrode layers 370 is changed or the light emitting element 300 further may include another structure.

The electrode layer 370 may decrease resistance between the light emitting element 300 and the electrodes or the contact electrodes in case that the light emitting element 300 is electrically connected to the electrodes 210 and 220 or the contact electrodes 261 and 262. The electrode layer 370 may include a metal having conductivity. The electrode layer 370 may include at least one of aluminum (Al), titanium (Ti), indium (In), gold (Au), silver (Ag), indium tin oxide (ITO), indium zinc oxide (IZO), and indium tin zinc oxide (ITZO). The electrode layer 370 may include a semiconductor material doped with an n-type or p-type dopant. The electrode layer 370 may include a same material or a similar material or include different materials, but is not limited thereto.

The insulating film 380 is disposed to surround outer surfaces of the semiconductor layers and the electrode layers described above. In an embodiment, the insulating film 380 may be disposed to surround at least an outer surface of the active layer 330, and may extend in one direction in which the light emitting element 300 extends. The insulating film 380 may serve to protect these members. As an example, the insulating film 380 may be formed to surround side surface portions of these members, but may be formed to expose both ends of the light emitting element 300 in the length direction.

It has been illustrated in the drawing that the insulating film 380 is formed to extend in the length direction of the light emitting element 300 to cover side surfaces of the first semiconductor layer 310 to the electrode layer 370, but the disclosure is not limited thereto. The insulating film 380 may cover only outer surfaces of some or a number of the semiconductor layers as well as the active layer 330 or cover only a portion of an outer surface of the electrode layer 370, such that the outer surface of each electrode layer 370 may be partially exposed. The insulating film 380 may also be formed so that an upper surface thereof is rounded in cross section in an area adjacent to at least one end of the light emitting element 300.

A thickness of the insulating film 380 may be in the range of about 10 nm to about 1.0 μm, but is not limited thereto. The thickness of the insulating film 380 may be about 40 nm.

The insulating film 380 may include materials having insulating properties, for example, one or more of silicon oxide (SiOx), silicon nitride (SiNx), silicon oxynitride (SiOxNy), aluminum nitride (AlN), and aluminum oxide (Al2O3). Accordingly, an electrical short circuit that may occur in case that the active layer 330 is in direct contact with an electrode through which an electrical signal is transferred to the light emitting element 300 may be prevented. The insulating film 380 protects an outer surface of the light emitting element 300 as well as the active layer 330, and may thus prevent a decrease in luminous efficiency.

In an embodiment, an outer surface of the insulating film 380 may be surface-treated. The light emitting elements 300 may be jetted and aligned onto electrodes in a state in which they are dispersed in ink in case that the display device 10 is manufactured. Here, in order to maintain the light emitting elements 300 in a state in which the light emitting elements 300 are dispersed without being agglomerated with other adjacent light emitting elements 300 in the ink, a hydrophobic or hydrophilic treatment may be performed on a surface of the insulating film 380.

The light emitting element 300 may have a length h in a range of about 1 μm to about 10 μm or in a range of about 2 μm to about 6 μm, and for example in a range of about 3 μm to about 5 μm. A diameter of the light emitting element 300 may be in a range of about 300 nm to about 700 nm, and an aspect ratio of the light emitting element 300 may be in a range of about 1.2 to about 100. However, the disclosure is not limited thereto, and the light emitting elements 300 included in the display device 10 may also have different diameters according to a difference in composition between the active layers 330. By way of example, the diameter of the light emitting element 300 may be about 500 nm.

As described above, the light emitting element 300 may be disposed between the electrodes 210 and 220 while their orientation directions and positions are changed by the electric field formed between the electrodes 210 and 220. According to an embodiment, in the display device 10, at least one of the electrodes 210 and 220 to which the different electrical signals are applied may include the main electrode and the sub-electrodes to which the same alignment signal is applied, respectively. For example, the display device 10 may include the first electrode 210 and the second electrode 220 to which the different electrical signals are applied, and the second electrode 220 may include the sub-electrode 220A and the main electrode 220C to which the same alignment signal is applied. The alignment area AA and the non-alignment area NA may be formed between these electrodes, respectively, and the light emitting elements 300 may be intensively disposed in the alignment area AA during the process of manufacturing the display device 10.

Figure 7:
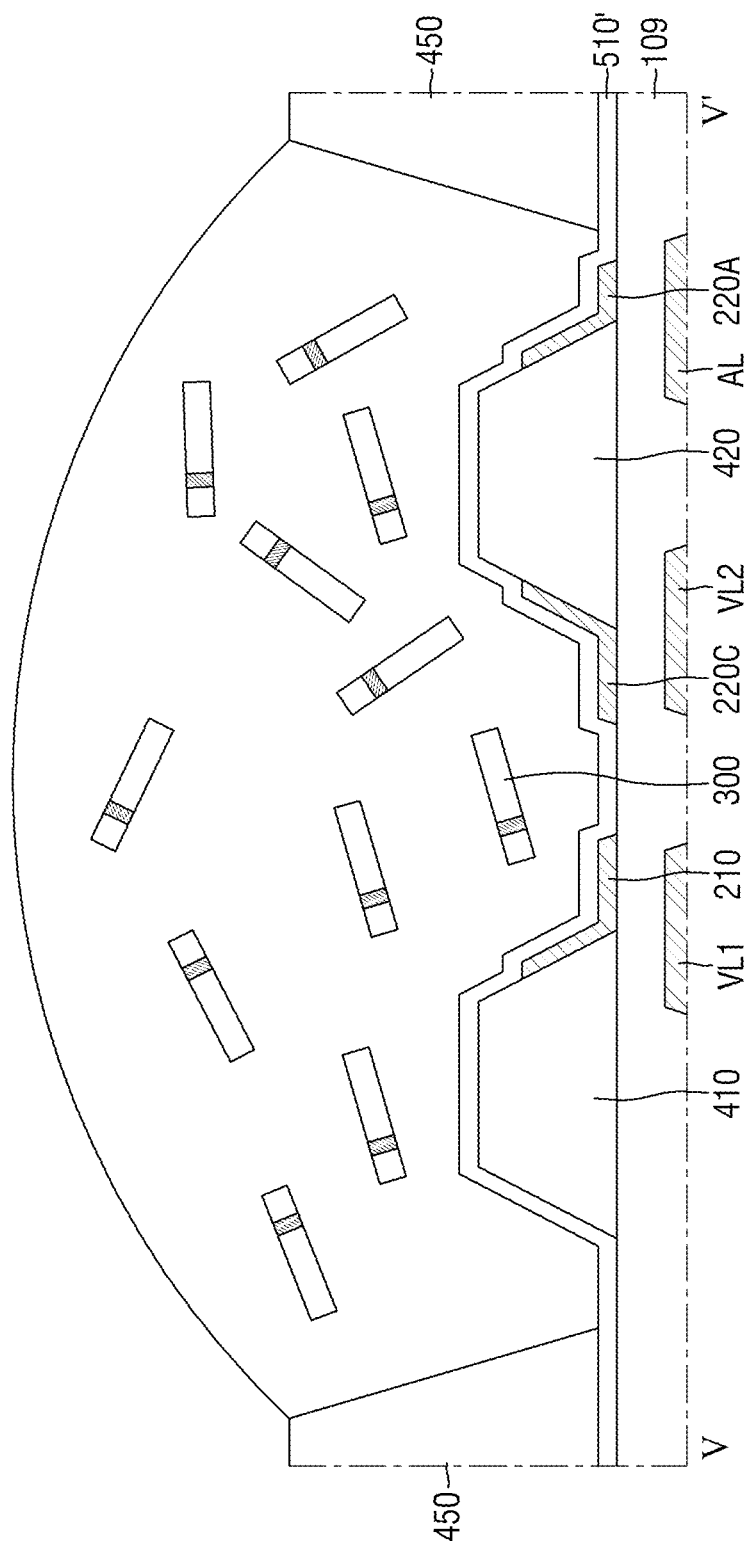
FIGS. 7 to 9 are schematic cross-sectional views illustrating some of processes of manufacturing the display device according to an embodiment.
Figure 8:
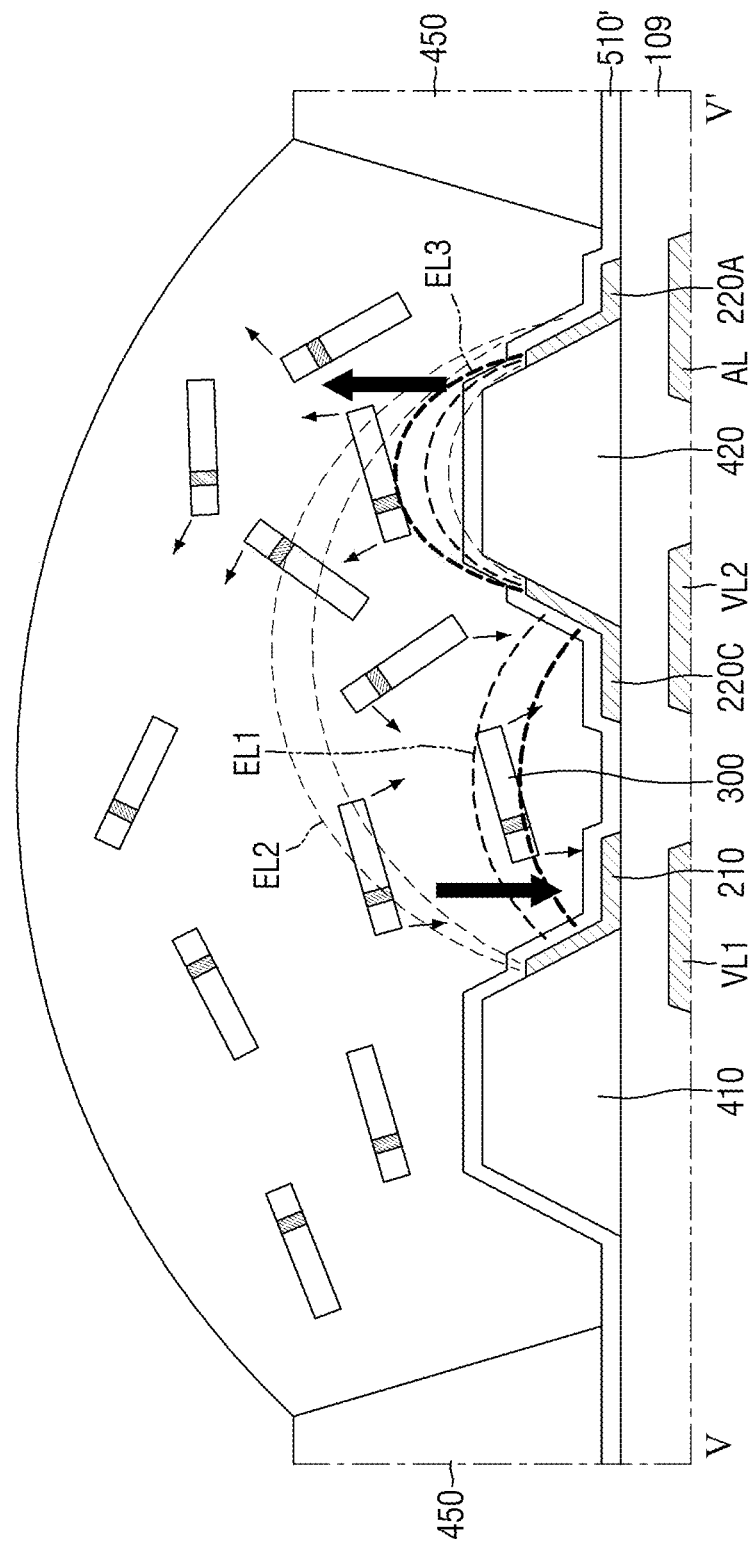
Figure 9:
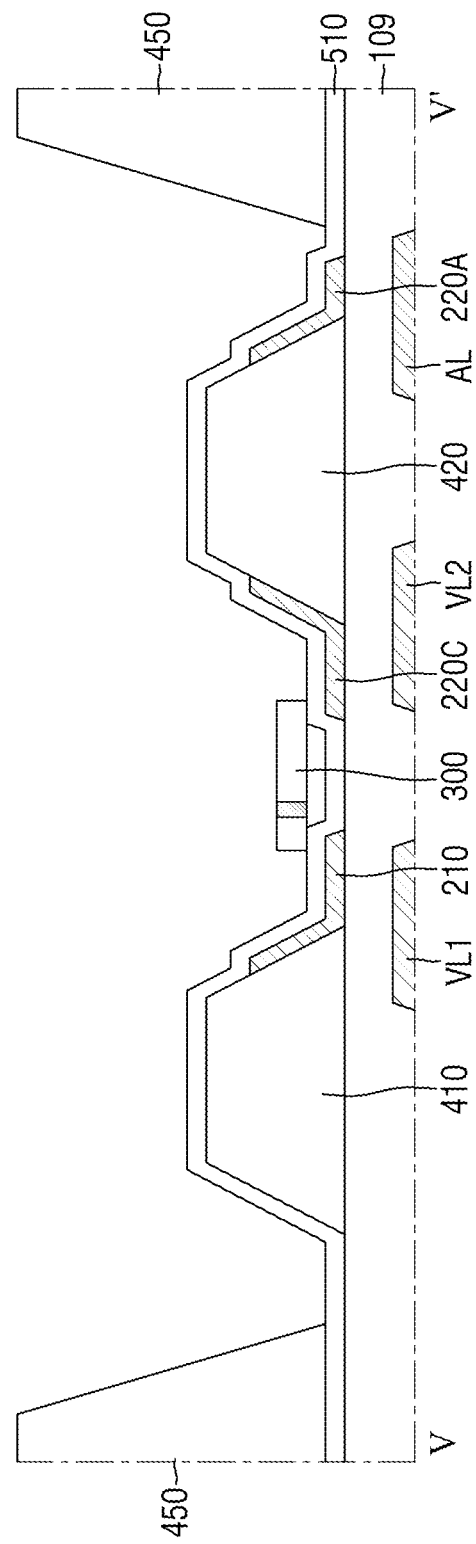

FIGS. 7 to 9 are schematic cross-sectional views illustrating some of processes of manufacturing the display device according to an embodiment. FIGS. 7 to 9 schematically illustrate a process in which the light emitting elements 300 are disposed between the first electrode 210 and the main electrode 220C of the second electrode 220 among the processes of manufacturing the display device 10.

First, referring to FIG. 7, a first substrate 101 is prepared, and internal banks 410 and 420, an external bank 450, a first electrode 210, and a second electrode 220 disposed on the first substrate 101 and a first insulating material layer 510' covering the internal banks 410 and 420, the first electrode 210, and the second electrode 220 are formed. The first insulating material layer 510' may be partially patterned in a subsequent process to form the first insulating layer 510 of the display device 10. The members described above may be formed by patterning a metal, an inorganic material, an organic material, or the like by a general mask process.

The second electrode 220 may include the main electrode 220C and the sub-electrode 220A disposed to be spaced apart from each other as described above. The main electrode 220C and the sub-electrode 220A may be disposed on the second internal bank 420, respectively, but may be disposed to be spaced apart from each other. A description of an arrangement of other members is the same as that described above, and a detailed description will thus be omitted.

Ink in which the light emitting elements 300 are dispersed is jetted onto the first electrode 210 and the second electrode 220. In an embodiment, the ink may be jetted by a printing method using an inkjet printing device. However, the disclosure is not limited thereto. In some cases, a slit coating method, a spray jetting method, or the like may be used. The light emitting elements 300 dispersed in the ink may be dispersed in a random direction without directivity on the first electrode 210 and the second electrode 220.

Referring to FIG. 8, alignment signals are applied to the first electrode 210 and the second electrode 220 to generate an electric field (for example, EL1 and EL2) in the ink in which the light emitting elements 300 are dispersed. As described above, the first alignment signal may be applied to the first electrode 210 through the first voltage line VL1 electrically connected to the first electrode 210 through the driving transistor DT, and the second alignment signal may be applied to the second electrode 220 through the second voltage line VL2 or the alignment line AL. The second electrode 220 may include the main electrode 220C and the sub-electrode 220A disposed to be spaced apart from each other, the main electrode 220C may be electrically connected to the second voltage line VL2, and the sub-electrode 220A may be electrically connected to the alignment line AL. The second alignment signal may be applied to each of the main electrode 220C and the sub-electrode 220A.

Electric fields EL1 and EL2 (see FIG. 7) by the different alignment signals may be generated between the first electrode 210 and the main electrode 220C of the second electrode 220 and between the first electrode 210 and the sub-electrode 220C. A first electric field EL1 between the first electrode 210 and the main electrode 220C and a second electric field EL2 between the first electrode 210 and the sub-electrode 220A may be electric fields by the different alignment signals, potential gradients may be generated in these electric fields. The 'potential gradient' may refer to a change direction of a strength or a density of an electric field (for example, EL1 and EL2) formed between the electrodes to which the alignment signals are applied. For example, as illustrated in FIG. 8, the first electric field EL1 and the second electric field EL2 formed between the first electrode 210 and the main electrode 220C or the sub-electrode 220A of the second electrode 220 may have potential gradients in a direction in which strengths or densities of these electric fields increase toward a downward direction, for example, toward the electrodes 210 and 220. Accordingly, the light emitting elements 300 may receive a dielectrophoretic force along a direction to which the potential gradients of the first electric field EL1 and the second electric field EL2 are directed, and may be induced to be disposed between the first electrode 210 and the main electrode 220C or the sub-electrode 220A of the second electrode 220.

On the other hand, the same alignment signal may be applied to the main electrode 220C and the sub-electrode 220A of the second electrode 220, and a third electric field EL3 formed between the main electrode 220C and the sub-electrode 220A may have a potential gradient toward an opposite direction to an area between the main electrode 220C and the sub-electrode 220A. The third electric field EL3 may have a potential gradient in a direction in which a strength or a density of the third electric field increases toward an upward direction, for example, toward upper portions of the electrodes 210 and 220 or the internal banks 410 and 420. The light emitting elements 300 moving toward the area between the main electrode 220C and the sub-electrode 220A among the light emitting elements 300 dispersed in the ink may receive a dielectrophoretic force toward the outside of the area by the third electric field EL3. Accordingly, the light emitting elements 300 may not be disposed between the main electrode 220C and the sub-electrode 220A, and may be disposed only between the first electrode 210 and the main electrode 220C. Other electrodes are not disposed on a side of the first internal bank 410 opposite to the first electrode 210, such that an electric field (for example, EL1 and EL2) may not be generated, and the light emitting elements 300 may not be disposed in such an area. For example, in the display device 10, the alignment area AA in which the light emitting elements 300 are disposed and the non-alignment area NA may be formed.

According to an embodiment, the display device 10 may include the main electrode 220C and the sub-electrode 220A to which the same alignment signal is applied, such that the light emitting elements 300 may be intensively disposed in the alignment area AA electrically connected to the first electrode 210 and the second electrode 220, and the number of light emitting elements 300 that are disposed in the non-alignment area NA and are lost may be decreased.

Referring to FIG. 9, in case that the light emitting elements 300 are disposed between the first electrode 210 and the main electrode 220C of the second electrode 220, the ink is removed. A process of removing the ink may be performed by a general heat treatment process or a light irradiation process. In an embodiment, the process of removing the ink may be performed simultaneously with a process of applying the alignment signals to the first electrode 210 and the second electrode 220. By removing the ink in a state in which the electric field (for example, EL1 and EL2) is generated between the first electrode 210 and the second electrode 220, the light emitting elements 300 may be safely seated in the alignment area AA. Thereafter, although not illustrated in the drawings, the second insulating layer 520, the third insulating layer 530, the contact electrodes 261 and 262, and the like, disposed on the light emitting elements 300, the first electrode 210, and the second electrode 220 may be formed to manufacture the display device 10.

Hereinafter, processes of manufacturing a display device 10 according to an embodiment will be described with reference to other drawings.

Figure 10:
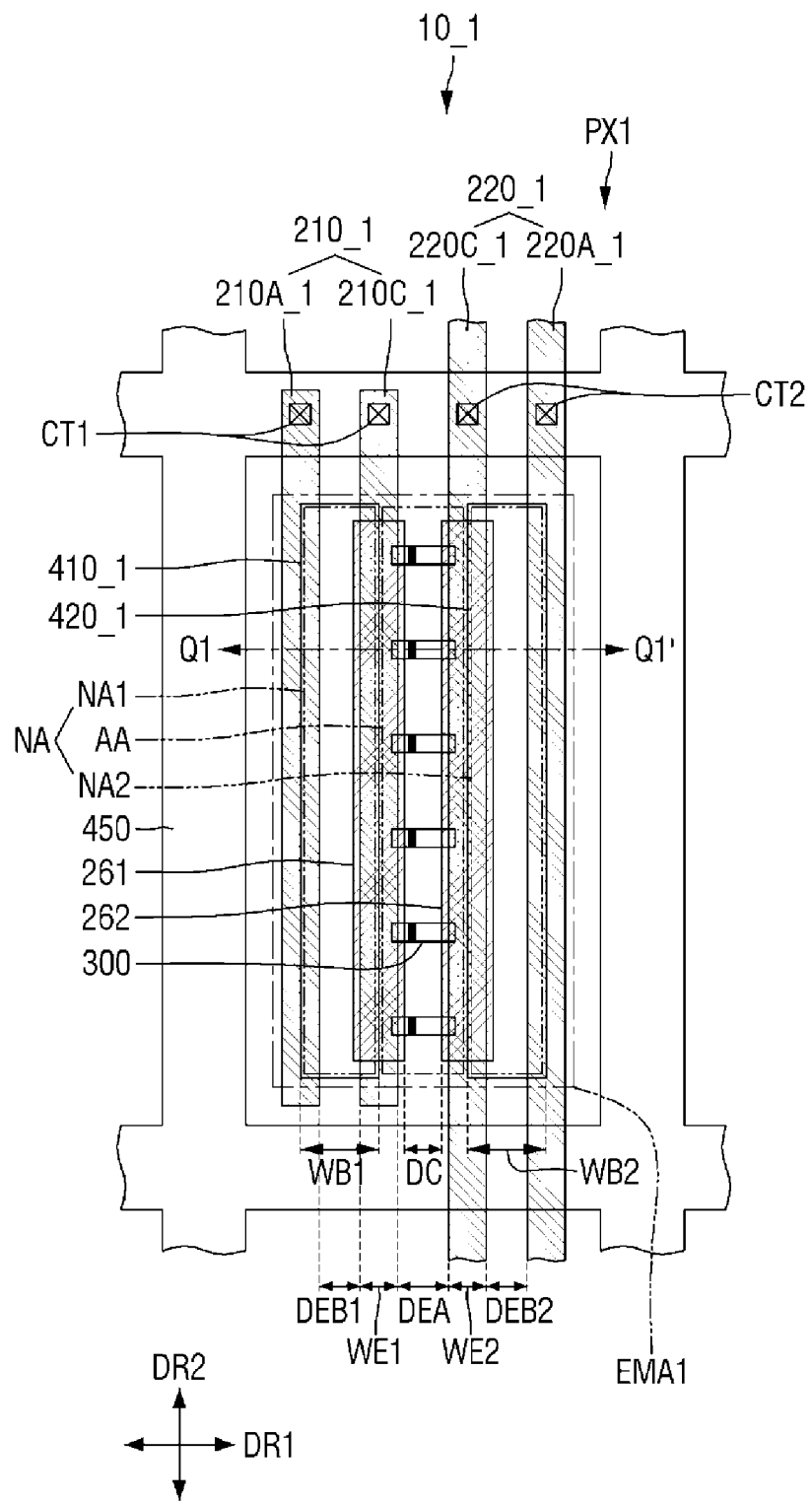
FIG. 10 is a schematic plan view illustrating one sub-pixel of a display device according to an embodiment.
Figure 11:
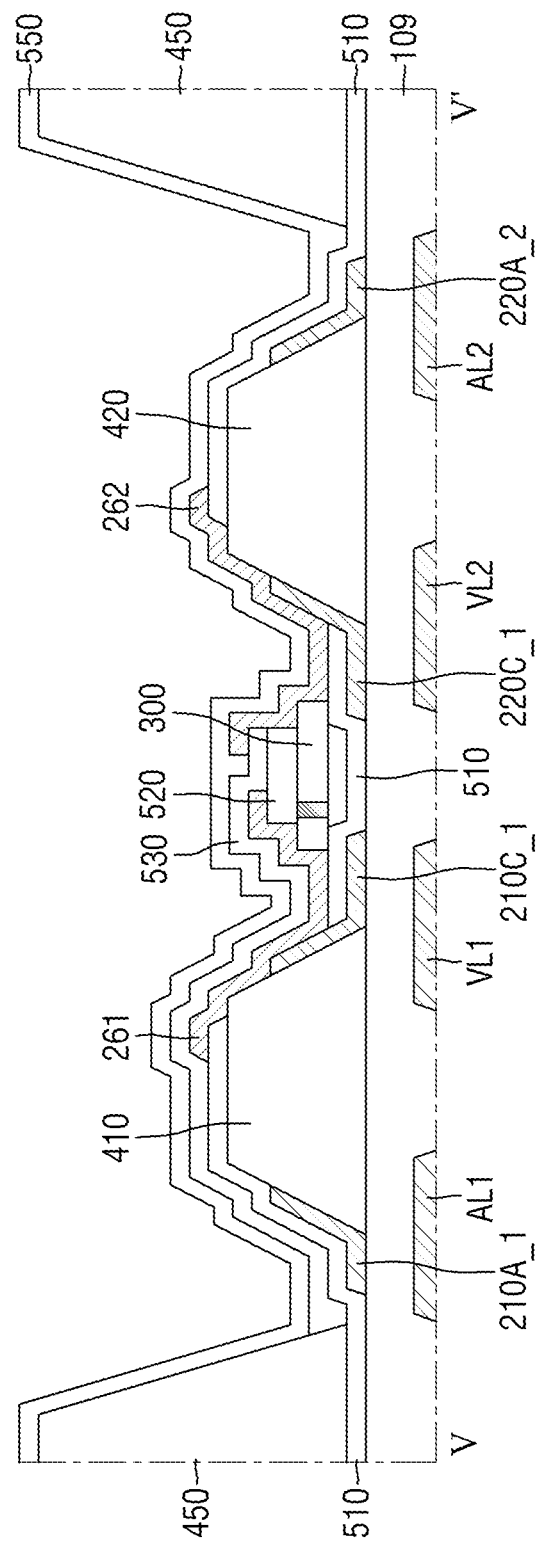
FIG. 11 is a schematic cross-sectional view taken along line Q1-Q1' of FIG. 10.

FIG. 10 is a schematic plan view illustrating one sub-pixel of a display device according to an embodiment. FIG. 11 is a schematic cross-sectional view taken along line Q1-Q1' of FIG. 10.

Referring to FIGS. 10 and 11, in a display device 10_1 according to an embodiment, a first electrode 210_1 may also include a main electrode and a sub-electrode. The first electrode 210_1 may include a first main electrode 210C_1 and a first sub-electrode 210A_1, and a second electrode 220_1 may include a second main electrode 220C_1 and a second sub-electrode 220A_1. An embodiment of FIGS. 10 and 11 is different from an embodiment of FIG. 3 in that the first electrode 210_1 also may include the first main electrode 210C_1 and the first sub-electrode 210A_1 that are distinguished from each other. Hereinafter, an overlapping description will be omitted, and contents different from those described above will be described.

In the display device 10_1, each of the electrodes 210_1 and 220_1 may include the main electrode and the sub-electrodes to which the same alignment signal is applied, and the light emitting elements 300 may not be disposed between the main electrode and the sub-electrodes. Similar to an embodiment of FIG. 3, in case that the first electrode 210_1 and the second electrode 220_1 include the main electrodes 210C_1 and 220C_1 and the sub-electrodes 210A_1 and 220A_1, respectively, an effect of inducing that the light emitting elements 300 are not disposed in a non-alignment area NA formed between the main electrodes 210C_1 and 220C_1 and the sub-electrodes 210A_1 and 220A_1 may be increased.

Since the description of the second electrode 220_1 is the same as described above, the first electrode 210_1 will be described in detail. Each of the first main electrode 210C_1 and the first sub-electrode 210A_1 of the first electrode 210_1 may extend in the second direction DR2 on a first internal bank 410_1. The first main electrode 210C_1 and the first sub-electrode 210A_1 may partially overlap the external bank 450, respectively, and may be electrically connected to the circuit element layer disposed therebelow through first contact holes CT1 in the overlapping portions.

Although not illustrated in the drawings, in an embodiment, the first main electrode 210C_1 of the first electrode 210_1 may be electrically connected to a first voltage line VL1 through the driving transistor DT, and the first sub-electrode 210A_1 of the first electrode 210_1 may be electrically connected to a first alignment line AL1. The alignment line AL may include a larger number of alignment lines, for example, a first alignment line AL1 and a second alignment line AL2, unlike an embodiment of FIG. 4, and the first alignment line AL1 and the second alignment line AL2 may be electrically connected to the first sub-electrode 210A_1 and the second sub-electrode 220A_1, respectively. During a process of manufacturing the display device 10_1, alignment signals may be applied from the first voltage line VL1 and the first alignment line AL1 to the first main electrode 210C_1 and the first sub-electrode 210A_1, respectively. However, during driving of the display device 10_1, an electrical signal for driving the display device 10_1 may be applied only to the first main electrode 210C_1, and an electrical signal may not be applied to the first sub-electrode 210A_1. For example, the first main electrode 210C_1 may be a driving electrode while being an alignment electrode, the first sub-electrode 210A_1 may be an alignment electrode, and during the driving of the display device 10_1, the electrical signal may not be applied to the first sub-electrode 210A_1.

The first main electrode 210C_1 and the first sub-electrode 210A_1 may be spaced apart from each other in the first direction DR1. The first main electrode 210C_1 and the first sub-electrode 210A_1 may be disposed on both sides of the first internal bank 410_1, respectively, and may be formed to have a width WE1. An interval DEB1 between the first main electrode 210C_1 and the first sub-electrode 210A_1 may be smaller than (or less than) the width WB1 of the first internal bank 410_1. Accordingly, the first main electrode 210C_1 and the first sub-electrode 210A_1 may be disposed on the inclined side surfaces of the first internal bank 410_1, respectively. FIG. 10 includes a further interval DEB2 between 220A_1 and 220C_1.

The first main electrode 210C_1 of the first electrode 210_1 and the second main electrode 220C_1 of the second electrode 220_1 may be spaced apart from and face each other, and an alignment area AA in which the light emitting elements 300 are disposed may be formed between the first main electrode 210C_1 and the second main electrode 220C_1. The first main electrode 210C_1 may be electrically connected to the first voltage line VL1 through the driving transistor DT, and the second main electrode 220C_1 may be electrically connected to a second voltage line VL2. Alignment signals may be applied to the first main electrode 210C_1 and the second main electrode 220C_1 during the process of manufacturing the display device 10_1, and electrical signals for driving the display device 10_1 may be applied to the first main electrode 210C_1 and the second main electrode 220C_1 during the driving of the display device 10_1.

The first sub-electrode 210A_1 and the second sub-electrode 220A_1 may be spaced apart from the first main electrode 210C_1 and the second main electrode 220C_1, respectively. The first sub-electrode 210A_1 and the second sub-electrode 220A_1 may be electrically connected to the first alignment line AL1 and the second alignment line AL2, respectively. Alignment signals may be applied to the first sub-electrode 210A_1 and the second sub-electrode 220A_1 during the process of manufacturing the display device 10_1, and electrical signals may not be applied to the first sub-electrode 210A_1 and the second sub-electrode 220A_1 during the driving of the display device 10_1.

Figure 12:
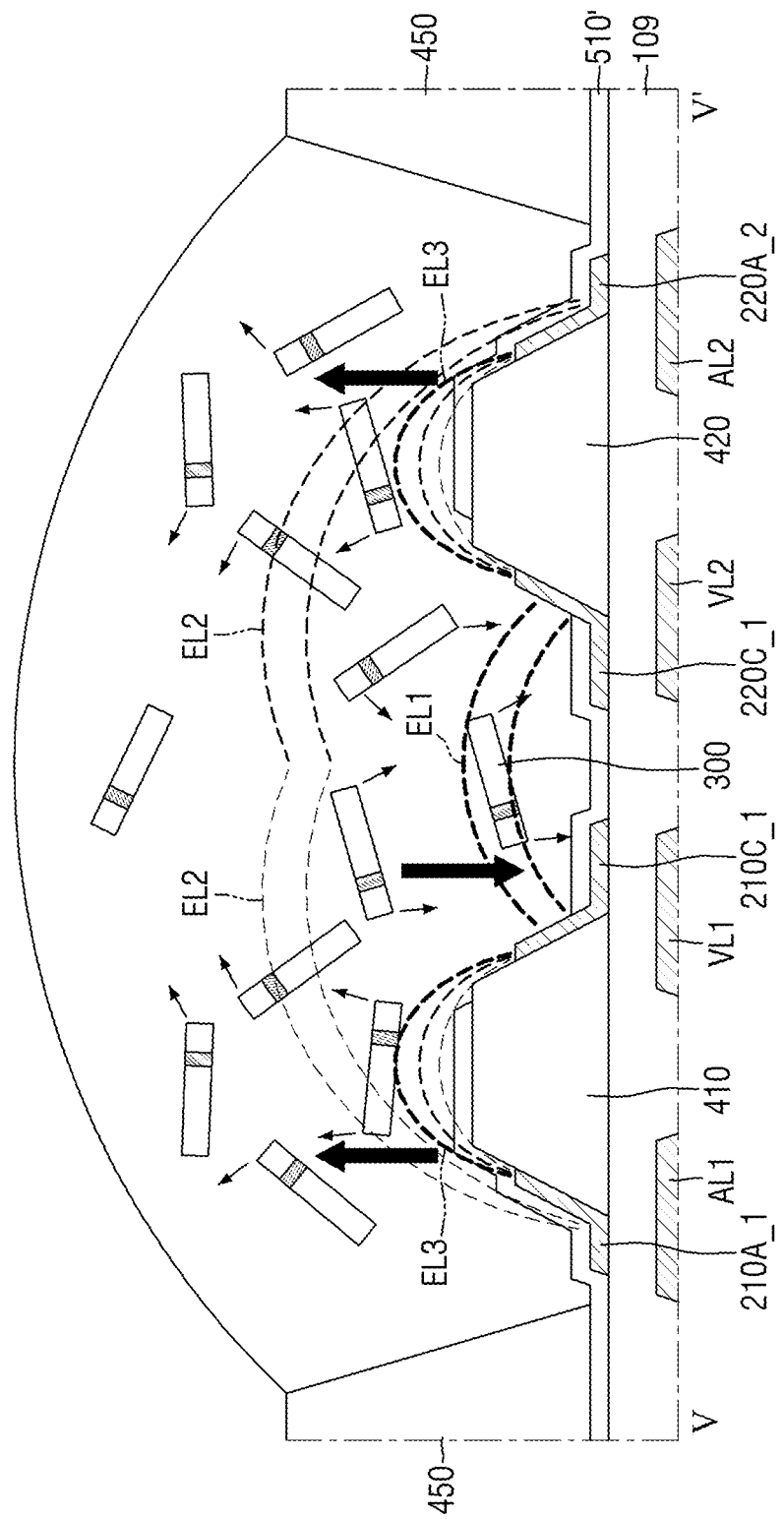
FIG. 12 is a schematic view illustrating electric fields formed between electrodes during a process of manufacturing the display device of FIG. 10.

FIG. 12 is a schematic view illustrating electric fields formed between electrodes during a process of manufacturing the display device of FIG. 10.

Referring to FIG. 12, a first alignment signal and a second alignment signal may be applied to the first electrode 210_1 and the second electrode 220_1, respectively, during the process of manufacturing the display device 10_1. Electric fields by different alignment signals may be generated between the first electrode 210_1 and the second electrode 220_1, and potential gradients toward an area between the first electrode 210_1 and the second electrode 220_1 may be generated in the electric fields EL1 and EL2. Accordingly, the light emitting elements 300 dispersed in the ink may be disposed between the first electrode 210_1 and the second electrode 220_1.

However, in electric fields EL3 formed between the first main electrode 210C_1 and the first sub-electrode 210A_1 of the first electrode 210_1 and between the second main electrode 220C_1 and the second sub-electrode 220A_1 of the second electrode 220_1, potential gradients toward an outward direction of areas between the first main electrode 210C_1 and the first sub-electrode 210A_1 and between the second main electrode 220C_1 and the second sub-electrode 220A_1 may be generated. Accordingly, the light emitting elements 300 may be induced so as not to be disposed between the first main electrode 210C_1 and the first sub-electrode 210A_1 and between the second main electrode 220C_1 and the second sub-electrode 220A_1 of the second electrode 220_1, and may be induced so as to be intensively disposed between the first main electrode 210C_1 and the second main electrode 220C_1. According to an embodiment, a first non-alignment area NA1 may be formed between the first electrodes 210_1, and a second non-alignment area NA2 may be formed between the second electrodes 220_1, and the alignment area AA may be formed between the first main electrode 210C_1 and the second main electrode 220C_1. According to an embodiment, the non-alignment areas NA may be formed in areas in which the light emitting elements 300 are not disposed on the first internal bank 410_1 and the second internal bank 420_1, and may partially overlap areas in which the main electrodes 210C_1 and 220C_1 and the sub-electrodes 210A_1 and 220A_1 are spaced apart from each other. As described above, in the areas in which the main electrodes 210C_1 and 220C_1 and the sub-electrodes 210A_1 and 220A_1 are spaced apart from each other, the electric fields may be generated by the same electrical signals, and thus, the light emitting elements 300 may not be disposed. Areas in which the light emitting elements 300 are not disposed may overlap areas in which the main electrodes 210C_1 and 220C_1 and the sub-electrodes 210A_1 and 220A_1 are spaced apart from each other while being formed on at least the first internal bank 410_1 and the second internal bank 420_1. A description of other components is the same as that described above, and a detailed description will thus be omitted.

The sub-electrodes 210A_1 and 220A of the respective electrodes 210 and 220 may not be electrically connected to the light emitting element 300, and electrical signals may not be applied to the sub-electrodes 210A and 220A during the driving of the display device 10. However, the sub-electrodes 210A and 220A may be in a state in which they are electrically connected to the alignment lines AL, but in an embodiment, the sub-electrodes 210A and 220A of the respective electrodes 210 and 220 may be partially patterned to be electrically disconnected from other lines.

Figure 13:
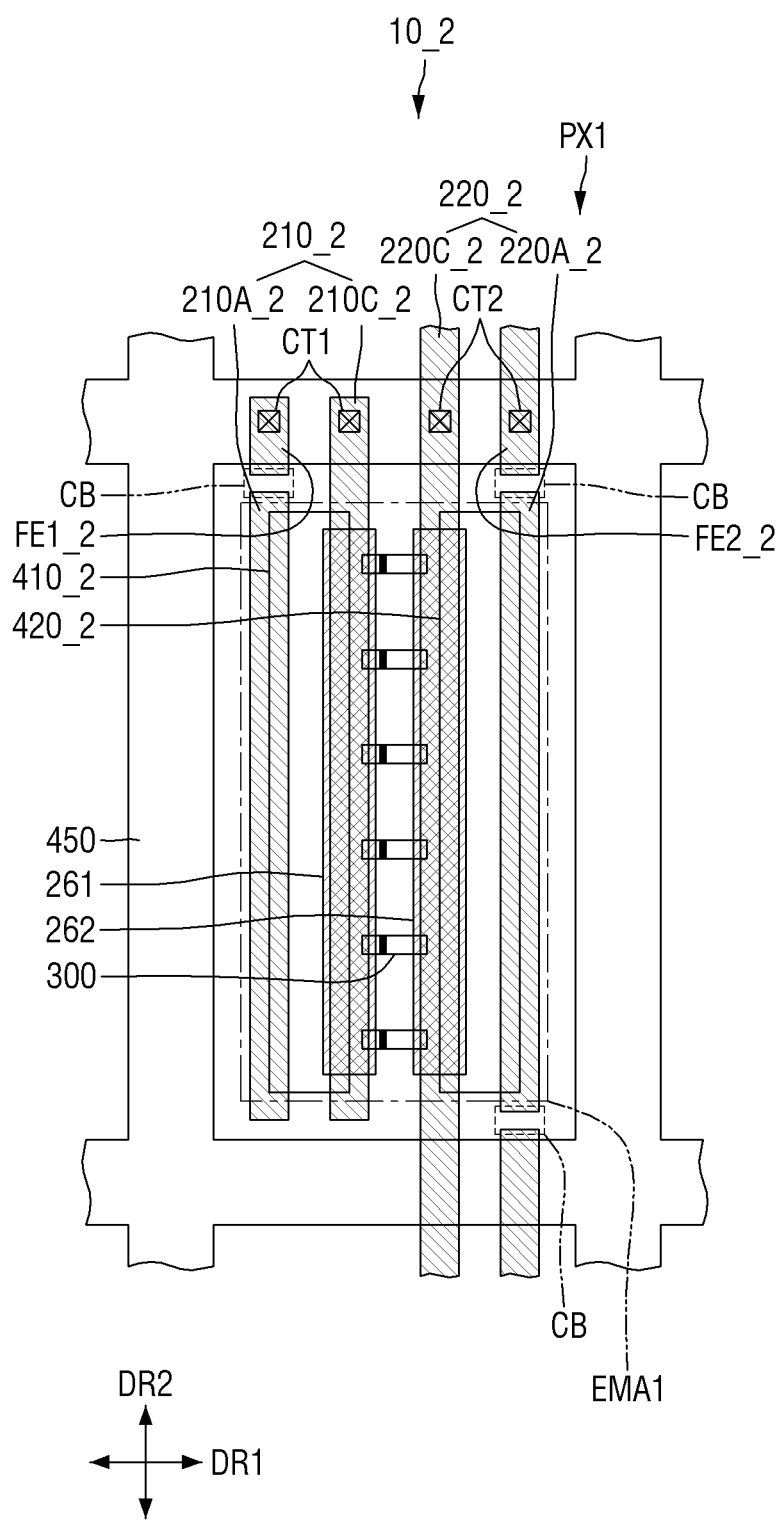
FIG. 13 is a schematic plan view illustrating one sub-pixel of a display device according to an embodiment.

FIG. 13 is a schematic plan view illustrating one sub-pixel of a display device according to an embodiment.

Referring to FIG. 13, in a display device 10_2 according to an embodiment, sub-electrodes 210A_2 and 220A_2 of respective electrodes 210_2 and 220_2 may be electrically disconnected from the alignment lines AL. In the respective sub-electrodes 210A_2 and 220A_2, portions where contact holes connected to the alignment lines AL are positioned and portions disposed on internal banks 410_2 and 4202 may be disconnected from each other, and the sub-electrodes 210A_2 and 220A_2 may remain as floating electrodes. The display device 10_2 of FIG. 13 is different from the display device according to an embodiment of FIG. 10 in that the sub-electrodes 210A_2 and 220A_2 remain as the floating electrodes. Hereinafter, an overlapping description will be omitted, and the sub-electrodes 210A_2 and 220A_2 will be described in detail.

Main electrodes 210C_2 and 220C_2 of the respective electrodes 210_2 and 2202 may be electrically connected to the first voltage line VL1 or the second voltage line VL2 rather than the alignment lines AL, respectively, and may be electrically connected to the light emitting elements 300. On the other hand, the sub-electrodes 210A_2 and 220A_2 of the respective electrodes 210_2 and 2202 may be electrically connected to the alignment lines AL, such that electrical signals may not be applied to the sub-electrodes 210A_2 and 220A_2 during driving of the display device 10_2. Accordingly, the respective sub-electrodes 210A_2 and 220A_2 may be patterned in portions CB (see FIG. 13) spaced apart from contact holes electrically connected to the alignment lines AL. For example, the first sub-electrode 210A_2 may be patterned at a portion spaced apart from a first contact hole CT1, the second sub-electrode 220A_2 may be performed at a portion spaced apart from the second contact hole CT2, and the first sub-electrode 210A_2 disposed on the first internal bank 410_2 and the second sub-electrodes 220A_2 disposed on the second internal bank 420_2 may remain as floating electrodes, respectively.

Portions disconnected from the first sub-electrode 210A_2 and the second sub-electrode 220A_2 may form electrode fragments FE1_2 and FE2_2 connected to the alignment lines AL through the contact holes CT1 and CT2, respectively. A first electrode fragment FE1_2 may be spaced apart from the first sub-electrode 210A_2 in the second direction DR2, and may be electrically connected to the first alignment line AL1 through the first contact hole CT1. A second electrode fragment FE2_2 may be spaced apart from the second sub-electrode 220A_2 in the second direction DR2, and may be electrically connected to the second alignment line AL2 through the first contact hole CT1. Areas CB in which the electrode fragments FE1_2 and FE2_2 and the sub-electrodes 210A_2 and 220A_2 are spaced apart from each other may be traces formed after the light emitting elements 300 are aligned during a process of manufacturing the display device 10_2. The alignment lines AL may be electrically disconnected from the respective sub-electrodes 210A_2 and 220A_2 after the light emitting elements 300 are aligned, and may be utilized as lines to which other signals are applied.

Since the respective sub-electrodes 210A_2 and 220A_2 remain as the floating electrodes without the other electrical signals applied thereto, in case that the respective main electrodes 210C_2 and 220C_2 are partially disconnected, the respective sub-electrodes 210A_2 and 220A_2 may also function as repair electrodes capable of repairing the partial disconnection of the main electrodes 210C_2 and 220C_2. However, the disclosure is not limited thereto.

In the display device 10, an arrangement and the number of electrodes are not particularly limited as long as the electrodes to which the same alignment signal is applied are disposed adjacent to each other, such that the non-alignment area NA may be formed between these electrodes. In an embodiment, the display device 10 may include a larger number of internal banks, such that the non-alignment area NA may be formed on the internal banks 410 and 420 using only the electrodes to which electrical signals are applied during the driving of the display device 10.

Figure 14:
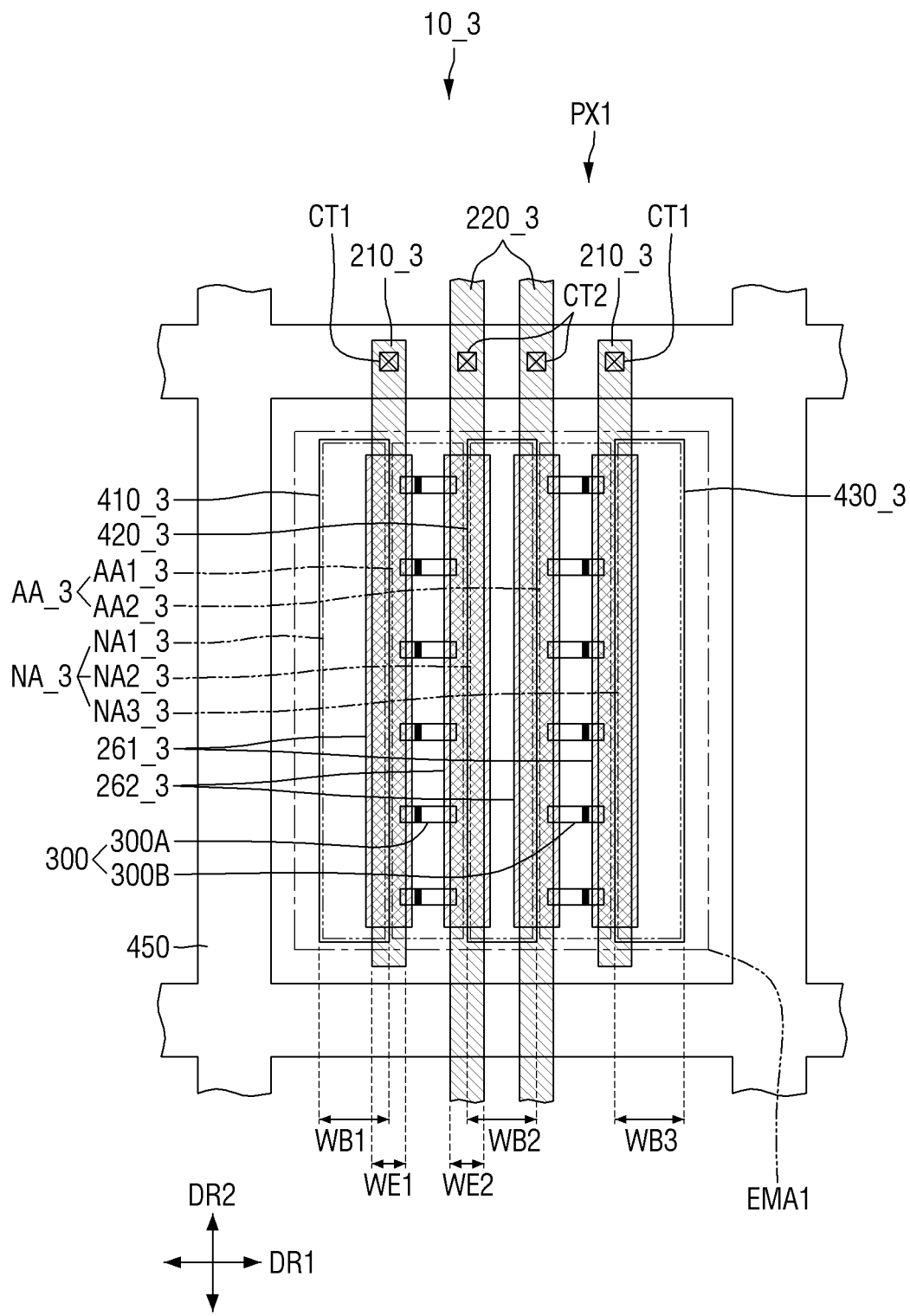
FIG. 14 is a schematic plan view illustrating one sub-pixel of a display device according to an embodiment.

FIG. 14 is a schematic plan view illustrating one sub-pixel of a display device according to an embodiment.

Referring to FIG. 14, a display device 10_3 according to an embodiment may include first electrodes 210_3 and second electrodes 220_3 disposed between the first electrodes 210_3. The respective first electrode 210_3 and the respective second electrode 220_3 may be electrically connected to the first voltage line VL1 and the second voltage line VL2, respectively. For example, the respective first electrode 210_3 and the respective second electrode 220_3 may be main electrodes.

In the display device 10_3, an alignment area AA_3 in which light emitting elements 300 are disposed may be formed between internal banks 410_3, 420_3, and 430_3, and a non-alignment area NA_3 in which the light emitting elements 300 are not disposed may be formed on the internal banks 410_3, 420_3, and 430_3. According to an embodiment, the display device 10_3 may include a larger number of internal banks 410_3, 420_3, and 430_3, and the first electrodes 210_3 and the second electrodes 220_3 may be disposed on the internal banks 410_3, 420_3, and 430_3, respectively.

The display device 10_3 may include three internal banks 410_3, 420_3, and 430_3, for example, a first internal bank 410_3, a second internal bank 420_3, and a third internal bank 430_3. The first to third internal banks 410_3, 420_3, and 430_3 may have a shape in which they extend in the second direction DR2, and may be spaced apart from each other in the first direction DR1. The second internal bank 4203 may be disposed between the first internal bank 410_3 and the third internal bank 430_3, and the first internal bank 410_3, the second internal bank 420_3, and the third internal bank 430_3 may be sequentially disposed along the first direction DR1 in each sub-pixel PXn.

The first electrodes 210_3 may be disposed on the first internal bank 410_3 and the third internal bank 430_3, respectively. The first electrodes 210_3 may have a width WE1 smaller than (or a width less than) widths WB1 and WB3 of the first internal bank 410_3 and the third internal bank 430_3, and may be disposed on one side or a side or sides of the first internal bank 410_3 and the third internal bank 430_3 facing the second internal bank 420_3, respectively. Each of the first electrodes 210_3 may extend in the second direction DR2 and may be electrically connected to the first voltage line VL1 through a first contact hole CT1. Since other electrodes are not disposed on the other sides of the first internal bank 410_3 and the third internal bank 430_3, a first non-alignment area NA1_3 and a third non-alignment area NA3_3 may be formed between different first electrodes 210_3 and the other sides of the first internal bank 410_3 and the third internal bank 430_3, respectively.

The second electrodes 220_3 may have a width WE2 smaller than (or a width less than) a width WB2 of the second internal bank 420_3, and may be disposed on the second internal bank 420_3. Two different second electrodes 220_3 may be spaced apart from each other in the first direction DR1, and may be disposed on both sides of the second internal bank 420_3, respectively. The second electrodes 220_3 may extend in the second direction DR2 and may be electrically connected to the second voltage line VL2 through second contact holes CT2. The same alignment signal may be applied to the second electrodes 220_3 through the second voltage line VL2, and a second non-alignment area NA2_3 in which the light emitting elements 300 are not disposed may be formed between the second electrodes 220_3.

The first electrodes 210_3 and the second electrodes 220_3 may be disposed on one side of the first internal bank 410_3, the second internal bank 420_3, and the third internal bank 430_3, respectively. The first electrode 210_3 disposed on the first internal bank 410_3 and the second electrode 220_3 disposed on one side of the second internal bank 420_3 may be spaced apart from and face each other, and the first electrode 2103 disposed on the third internal bank 430_3 and the second electrode 220_3 disposed on the other side of the second internal bank 420_3 may be spaced apart from and face each other. Different alignment signals may be applied to the first electrode 210_3 disposed on the first internal bank 410_3 and the second electrode 220_3 disposed on one side of the second internal bank 420_3 and the first electrode 210_3 disposed on the third internal bank 430_3 and the second electrode 2203 disposed on the other side of the second internal bank 420_3, and a first alignment area AA1_3 and a second alignment area AA2_3 may be formed between the first electrode 210_3 disposed on the first internal bank 410_3 and the second electrode 220_3 disposed on one side of the second internal bank 420_3 and between the first electrode 210_3 disposed on the third internal bank 430_3 and the second electrode 220_3 disposed on the other side of the second internal bank 420_3, respectively.

The light emitting elements 300 may include first light emitting elements 300A disposed in the first alignment area AA1_3 and second light emitting elements 300B disposed in the second alignment area AA2_3. The first light emitting elements 300A and the second light emitting elements 300B may be electrically connected to the first electrode 210_3 and the second electrode 220_3, respectively. Contact electrodes 261_3 and 262_3 may be disposed on the first electrodes 210_3 and the second electrodes 220_3, respectively. The first light emitting elements 300A and the second light emitting elements 300B may be electrically connected to different first electrodes 210_3 and second electrodes 220_3, respectively, and may be connected to each other in parallel by individually receiving electrical signals.

The first contact electrodes 261_3 may be disposed to overlap the first electrodes 210_3 disposed on the first internal bank 410_3 and the third internal bank 430_3, and the second contact electrodes 2623 may be disposed to overlap the second electrodes 220_3 disposed on one side and the other side of the second internal bank 420_3.

In an embodiment, the second electrodes 220_3 physically spaced apart from each other are disposed on one second internal bank 420_3, and thus, the second non-alignment area NA2_3 may be formed on the second internal bank 420_3. The respective first electrode 210_3 and the respective second electrode 220_3 may be electrically connected to the first voltage line VL1 and the second voltage line VL2, and may be main electrodes to which electrical signals for driving the display device 10_3 are applied. Since the display device 10_3 may include a larger number of internal banks 410_3 and 420_3, even though the display device 10_3 does not include the sub-electrode, the non-alignment area NA_3 may be formed on the internal banks 410_3 and 420_3.

As described above, the sub-electrode is disposed on the other side of the first internal bank 410_3 on which the first electrodes 210_3 are not disposed, such that an effect that the light emitting elements 300 are not disposed between the sub-electrode and the first electrode 210_3 may be increased.

Figure 15:
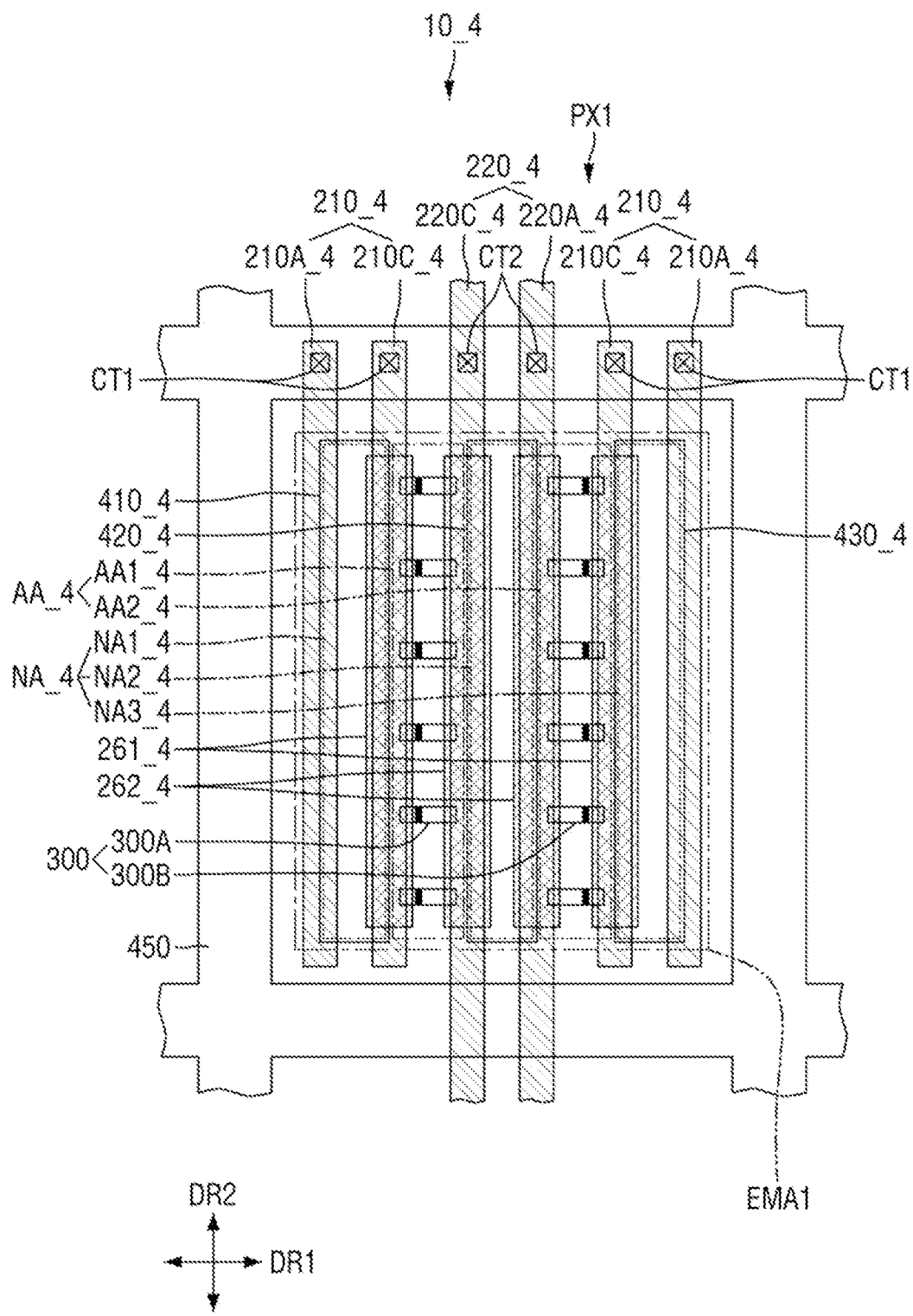
FIG. 15 is a schematic plan view illustrating one sub-pixel of a display device according to an embodiment.

FIG. 15 is a schematic plan view illustrating one sub-pixel of a display device according to an embodiment.

Referring to FIG. 15, in a display device 10_4 according to an embodiment, first electrodes 210_4 may further include first sub-electrodes 210A_4. Accordingly, each of first main electrodes 210C_4 and the first sub-electrodes 210A_4 may be disposed on a first internal bank 410_4 and a third internal bank 430_4. A first non-alignment area NA1_4 and a third non-alignment area NA3_4 may be formed between the first main electrode 210C_4 and the first sub-electrodes 210A_4 disposed on the first internal bank 410_4 and the first main electrode 210C_4 and the first sub-electrodes 210A_4 disposed on the third internal bank 430_4, respectively. The display device 10_4 of FIG. 15 is different from the display device according to an embodiment of FIG. 14 in that the first sub-electrodes 210A_4 are disposed on the other sides of the first internal bank 410_4 and the third internal bank 430_4 that do not face the second internal bank 420_4. The embodiment is a combination of embodiments of FIGS. 10 and 14, and a detailed description thereof is the same as described above. FIG. 15 may also include 220A_4, 220C_4, AA_4, AA1_4, AA2_4, NA_4, NA2_4, 261_4, and 262_4 as sub-electrodes, main electrodes, alignment areas, non-alignment areas, and contact electrodes, respectively.

Figure 16:
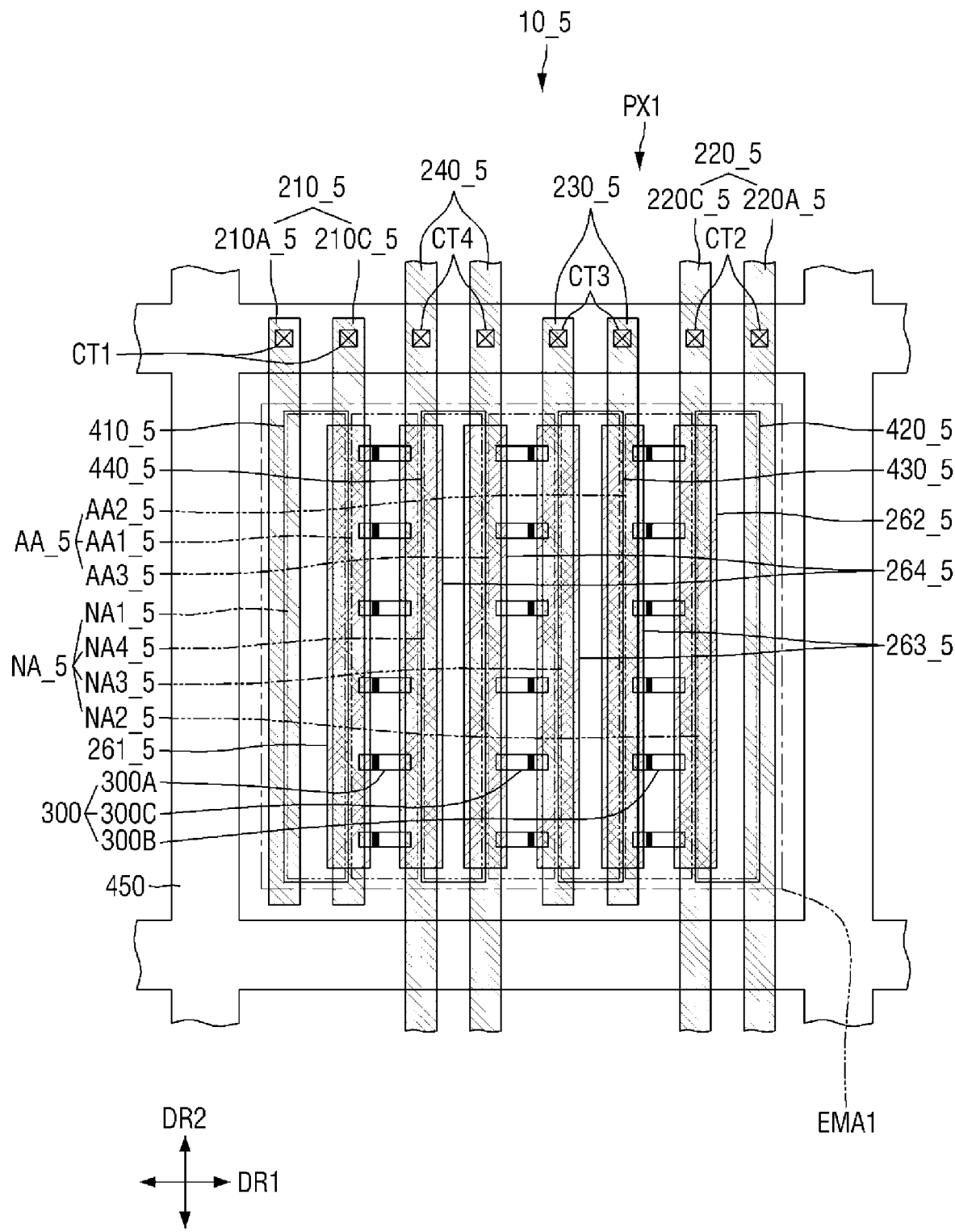
FIG. 16 is a schematic plan view illustrating one sub-pixel of a display device according to an embodiment.

FIG. 16 is a schematic plan view illustrating one sub-pixel of a display device according to an embodiment.

Referring to FIG. 16, in a display device 10_5 according to an embodiment, a larger number of internal banks may be disposed between a first internal bank 410_5 and a second internal bank 420_5, and a larger number of electrodes may also be disposed between a first electrode 210_5 and a second electrode 220_5. The display device 105 may include larger numbers of electrodes and internal banks, and may thus include larger numbers of alignment areas AA_5 and non-alignment areas NA_5 for each sub-pixel PXn. The display device 10_5 of FIG. 16 is different in the numbers of internal banks and electrodes from the display device according to an embodiment of FIG. 10. Hereinafter, an overlapping description will be omitted, and contents different from those described above will be described.

The display device 10_5 may further include a third internal bank 430_5 and a fourth internal bank 440_5 disposed between the first internal bank 410_5 and the second internal bank 420_5. The third internal bank 4305 may be disposed between the first internal bank 410_5 and the second internal bank 420_5, and the fourth internal bank 440_5 may be disposed between the first internal bank 410_5 and the third internal bank 430_5. In each sub-pixel PXn, the first internal bank 410_5, the fourth internal bank 440_5, the third internal bank 430_5, and the second internal bank 420_5 may be sequentially disposed along the first direction DR1. The first to fourth internal banks 410_5, 420_5, 430_5, and 440_5 may have the same width WB (see FIG. 10), and a description thereof is the same as described above.

The first electrode 210_5 and the second electrode 220_5 may include main electrodes 210C_5 and 220C_5 and sub-electrodes 210A_5 and 220A_5, respectively. The main electrodes 210C_5 and 220C_5 and the sub-electrodes 210A_5 and 220A_5 may be disposed on both sides of the first internal bank 410_5 and the second internal bank 420_5, respectively, and may be disposed to be spaced apart from each other in the first direction DR1. A description thereof is the same as that described above, and a detailed description will thus be omitted.

Third electrodes 230_5 may be disposed on the third internal bank 430_5. According to an embodiment, the display device 10_5 may include third electrodes 2305 disposed on both sides of the third internal bank 430_5 for each sub-pixel PXn. As illustrated in the drawing, the third electrodes 230_5 may extend in the second direction DR2, and may be spaced apart from each other in the first direction DR1. Any one of the third electrodes 230_5 may be disposed on one side of the third internal bank 430_5, and the other of the third electrodes 230_5 may be disposed on the other side of the third internal bank 430_5. The third electrodes 230_5 may extend in the second direction DR2 and may be electrically connected to the alignment line AL or the first voltage line VL1 disposed therebelow through third contact holes CT3 at places where they overlap the external bank 450. For example, the third electrodes 230_5 may have substantially the same shape as the first electrode 210_5. It has been illustrated in the drawing that the third electrodes 230_5 are separated between sub-pixels PXn (not illustrated) neighboring in the second direction DR2, but the disclosure is not limited thereto, and the third electrodes 230_5 may be disposed to extend to the sub-pixels PXn neighboring in the second direction DR2, similar to the first electrode 210_5.

Fourth electrodes 240_5 may be disposed on the fourth internal bank 440_5. Similar to the third electrodes 230_5, fourth electrodes 240_5 may be disposed on both sides of the fourth internal bank 440_5 for each sub-pixel PXn. As illustrated in the drawing, the fourth electrodes 240_5 may extend in the second direction DR2, and may be spaced apart from each other in the first direction DR1. Any one of the fourth electrodes 240_5 may be disposed on one side of the fourth internal bank 440_5, and the other of the fourth electrodes 240_5 may be disposed on the other side of the fourth internal bank 440_5. The fourth electrodes 240_5 may extend in the second direction DR2 and may be electrically connected to the alignment line AL or the second voltage line VL2 disposed therebelow through fourth contact holes CT4 at places where they overlap the external bank 450. For example, the fourth electrodes 2405 may have substantially the same shape as the second electrode 220_5. It has been illustrated in the drawing that the fourth electrodes 240_5 are disposed to extend beyond the sub-pixels PXn (not illustrated) neighboring in the second direction DR2, but the disclosure is not limited thereto, and the fourth electrodes 240_5 may be disposed to be separated between the sub-pixels PXn neighboring in the second direction DR2, similar to the first electrode 210_5.

The third electrodes 230_5 and fourth electrode 240_5 may also be disposed to be spaced apart from each other on the same internal banks, for example, the third internal bank 430_5 and the fourth internal bank 440_5, respectively, and the same electrical signals may be applied to the third electrodes 230_5 and fourth electrode 240_5, respectively. Accordingly, non-alignment areas NA may be formed between the third electrodes 230_5 and fourth electrode 240_5.

The display device 10_5 according to an embodiment may include larger numbers of internal banks and electrodes, and may thus include larger numbers of alignment areas AA_5 and non-alignment areas NA_5. The alignment area AA_5 may include a first alignment area AA1_5, a second alignment area AA2_5, and a third alignment area AA3_5. The first alignment area AA1_5 is an area between the first internal bank 410_5 and the fourth internal bank 440_5 or between the first electrode 210_5 and the fourth electrode 240_5, the second alignment area AA2_5 is an area between the second internal bank 420_5 and the third internal bank 430_5 or between the second electrode 220_5 and the third electrode 230_5, and the third alignment area AA3_5 is an area between the third internal bank 430_5 and the fourth internal bank 440_5 or between the third electrode 230_5 and the fourth electrode 240_5.

The non-alignment area NA_5 may be formed on each of the internal banks 410_5, 420_5, 430_5, and 440_5, and may include a first non-alignment area NA1_5 and a second non-alignment area NA2_5 formed between the main electrodes 210C_5 and 220C_5 and the sub-electrodes 210A_5 and 220A_5 of the first electrode 210_5 and the second electrode 220_5, respectively. The non-alignment area NA_5 may further include a third non-alignment area NA3_5 formed between the third electrodes 230_5 and a fourth non-alignment area NA4_5 formed between the fourth electrodes 240_5.

The light emitting elements 300 may include first light emitting elements 300A disposed in the first alignment area AA1_5 and having both ends electrically connected to the first electrode 210_5 and the fourth electrode 240_5, second light emitting elements 300B disposed in the second alignment area AA2_5 and having both ends electrically connected to the second electrode 220_5 and the third electrode 230_5, and third light emitting elements 300C disposed in the third alignment area AA3_5 and having both ends electrically connected to the third electrode 230_5 and the fourth electrode 240_5.

Third contact electrodes 263_5 and fourth contact electrodes 264_5 may be disposed on the third electrode 230_5 and the fourth electrode 240_5, respectively. The third contact electrodes 263_5 and the fourth contact electrodes 264_5 may have substantially the same shapes as the first contact electrode 261_5 and the second contact electrode 262_5, respectively. The third contact electrodes 263_5 and the fourth contact electrodes 264_5 may be formed to have greater widths than the third electrodes 230_5 and the fourth electrodes 240_5, respectively, and may be disposed to cover the third electrodes 230_5 and the fourth electrodes 240_5, respectively. However, unlike the first contact electrode 261_5 and the second contact electrode 262_5, the third contact electrodes 263_5 and the fourth contact electrodes 264_5 may be disposed on both sides of the third internal bank 430_5 and the fourth internal bank 440_5, respectively, so as to correspond to the third electrodes 230_5 and the fourth electrodes 240_5, respectively. However, the disclosure is not limited thereto.

One end or an end or ends of the first light emitting elements 300A and the second light emitting elements 300B may be electrically connected to the first main electrode 210C_5 and the second main electrode 220C_5, respectively, and the other ends of the first light emitting elements 300A and the second light emitting elements 300B may be electrically connected to the fourth electrode 240_5 and the third electrode 230_5, respectively. Both ends of the third light emitting elements 300C may be electrically connected to the third electrode 230_5 and the fourth electrode 240_5, respectively. In the display device 10_5 according to an embodiment, the third electrodes 230_5 and the fourth electrodes 240_5 may be main electrodes electrically connected to the light emitting elements 300. A first source voltage or a second source voltage may be transferred to the third electrodes 230_5 and the fourth electrodes 240_5 through the third contact holes CT3 and the fourth contact holes CT4, respectively. Even during a process of manufacturing the display device 10_5, the same signal may be applied to each of the third electrodes 230_5 and fourth electrode 240_5, and an electric field EL3 having a potential gradient toward an outward direction may be generated in each of areas between the third electrodes 230_5 and fourth electrode 240_5.

The third electrodes 230_5 and the fourth electrodes 240_5 are electrically connected to the driving transistor DT or the second voltage line VL2, respectively, and thus, the first source voltage or the second source voltage may be applied to the third electrodes 230_5 and the fourth electrodes 240_5, respectively. Electrical signals for driving the light emitting elements 300A, 300B, and 300C disposed in the respective alignment areas AA_5 may be transferred from the first to fourth electrodes 210_5, 220_5, 230_5, and 240_5 to the light emitting elements 300A, 300B, and 300C, respectively, and the light emitting elements 300A, 300B, and 300C may be connected to each other in parallel. On the other hand, the third electrodes 230_5 and the fourth electrodes 240_5 are connected to the alignment lines AL, respectively, such that electrical signals may not be applied to the third electrodes 230_5 and the fourth electrodes 2405 during driving of the display device 10_5. Electrical signals may be applied to the light emitting elements 300A, 300B, and 300C disposed in the respective alignment areas AA_5 through the first electrode 210_5 and the second electrode 220_5, and the third electrodes 230_5 and the fourth electrodes 240_5 may be electrodes transferring the electrical signals. The light emitting elements 300A, 300B, and 300C disposed in the respective alignment areas AA_5 may be connected to each other in series.

According to an embodiment, the display device 10_5 may include the larger number of electrodes, and thus, the number of light emitting elements 300 disposed in each sub-pixel PXn may increase, and the light emitting elements 300 are connected to each other in series according to the connection of the third electrodes 230_5 and the fourth electrodes 240_5, such that light efficiency may be improved.

Figure 17:
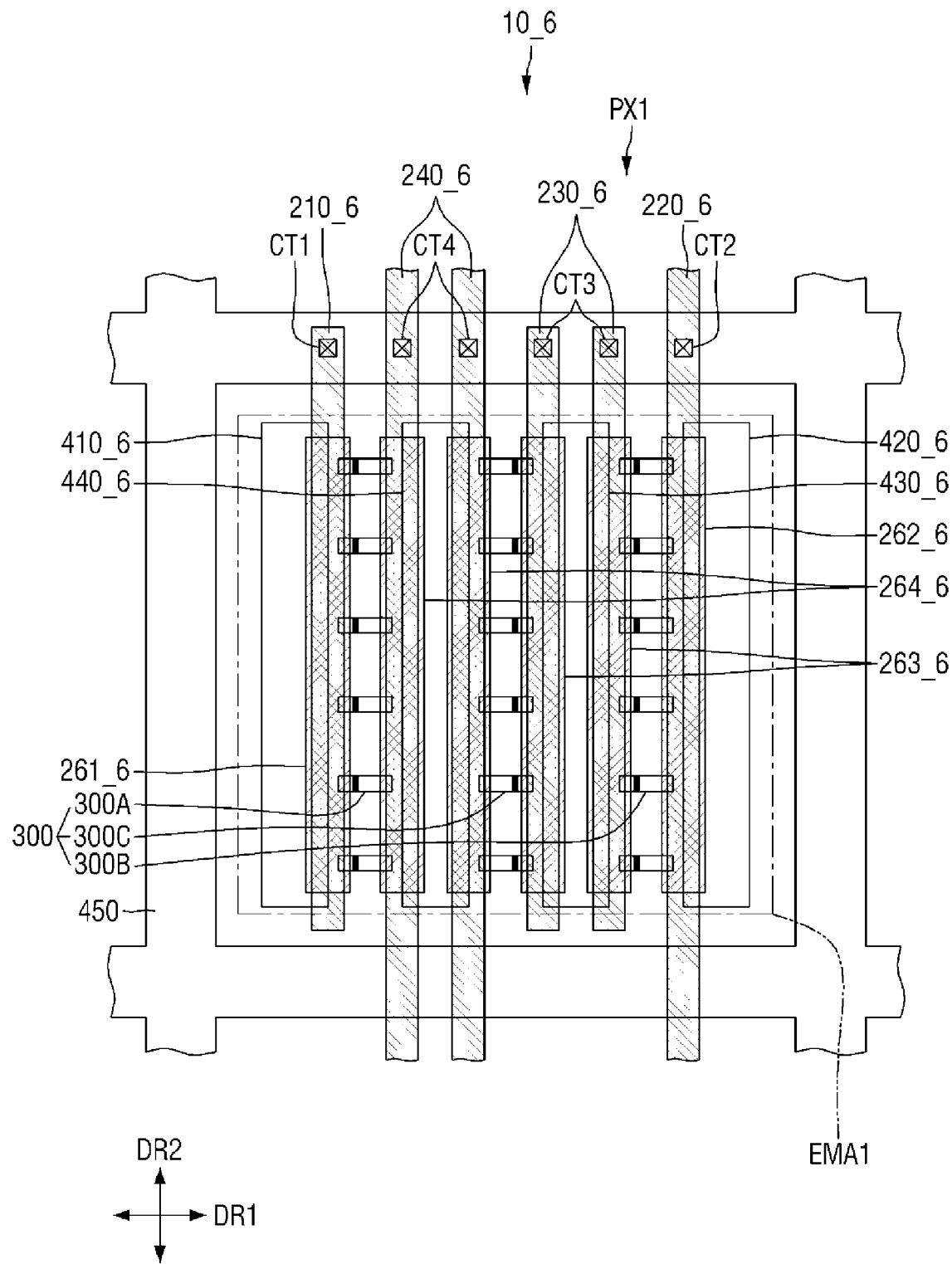
FIGS. 17 and 18 are schematic plan views illustrating one sub-pixels of display devices according to other embodiments.
Figure 18:
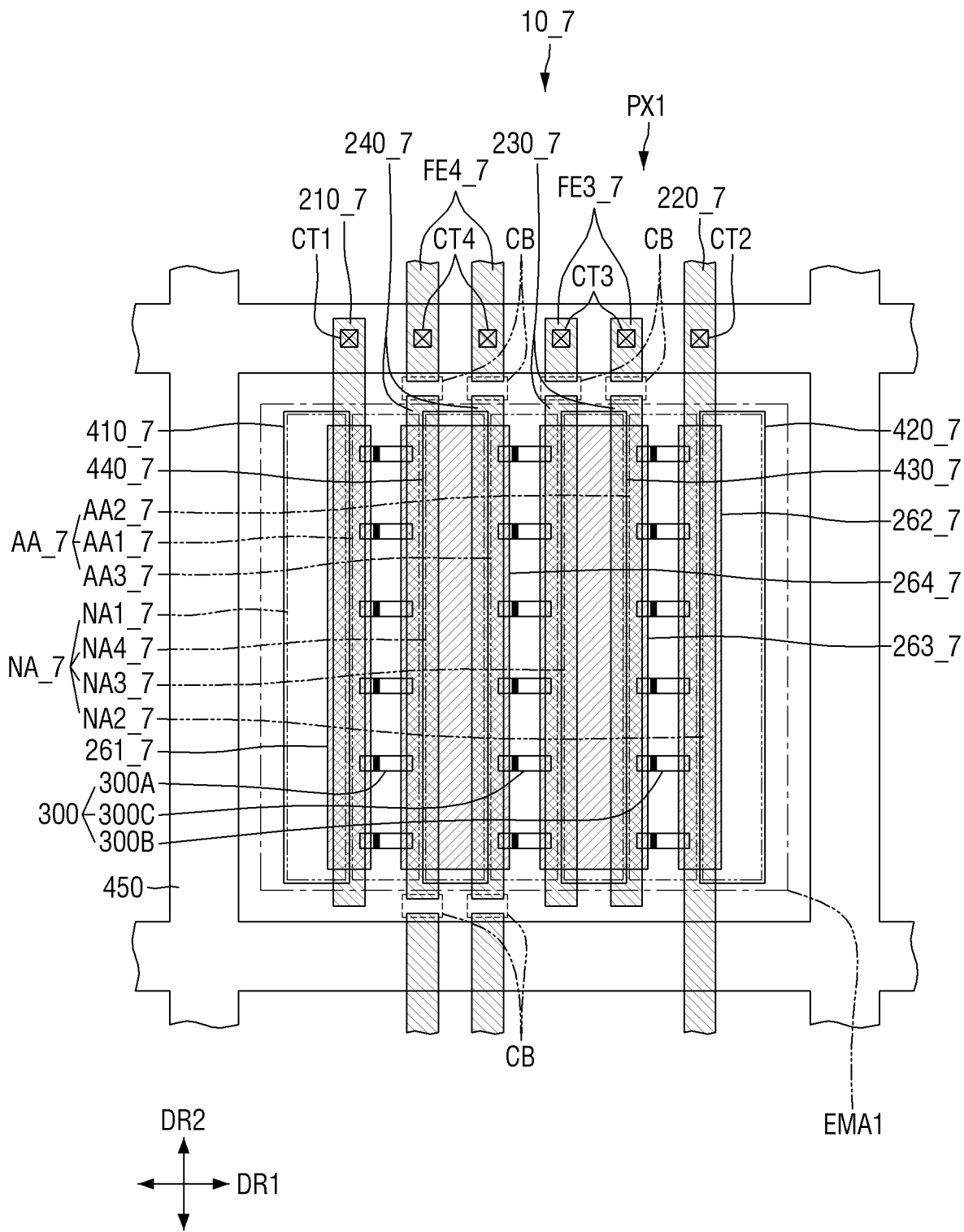

FIGS. 17 and 18 are schematic plan views illustrating one sub-pixels of display devices according to embodiments.

Referring to FIG. 17, a display device 10_6 according to an embodiment may include a larger number of internal banks 410_6, 420_6, 430_6, and 440_6 and further include a third electrode 230_6 and a fourth electrode 240_6, and a first electrode 210_6 and a second electrode 220_6 may include only main electrodes without sub-electrodes. The display device 10_6 of FIG. 17 is different from the display device according to an embodiment of FIG. 16 in that sub-electrodes of the first electrode 210_6 and the second electrode 220_6 are omitted. Other components are substantially the same as those of an embodiment of FIG. 16, and a detailed description thereof will thus be omitted. FIG. 17 may also include 261_6, 262_6, 263_6, and 264_6 as first, second, third and fourth contact electrodes.

Referring to FIG. 18, in a display device 10_7 according to an embodiment, third electrodes 230_7 and fourth electrodes 2407 may be electrically disconnected from the alignment lines AL. The third electrodes 230_7 and the fourth electrodes 240_7 may be disposed on third and fourth internal banks 430_7 and 440_7, respectively, may be disconnected from portions where contact holes CT3 and CT4 connected to the alignment lines AL are positioned, and may remain as floating electrodes. The third electrodes 230_7 and the fourth electrodes 240_7 may be electrically connected to the alignment lines AL through third contact holes CT3 and fourth contact holes CT4 during a process of manufacturing the display device 10_7, such that alignment signals may be applied to the third electrodes 230_7 and the fourth electrodes 240_7. Thereafter, after the light emitting elements 300 are disposed, the third electrodes 230_7 and the fourth electrodes 240_7 may be patterned in portions CB (see FIG. 18) where they do not overlap the external bank 450, and may remain as the floating electrodes that are not directly electrically connected to the alignment lines AL. Portions electrically connected to the alignment lines AL through the third contact holes CT3 and the fourth contact holes CT4 may form electrode fragments FE3_7 and FE4_7, which may be spaced apart from the third electrodes 230_7 and the fourth electrodes 240_7, respectively. Electrical signals are not directly applied to the third electrodes 230_7 and the fourth electrodes 240_7 during driving of the display device 10_7, and electrical signals for driving the display device 10_7 may be applied only to the first electrode 210_7 and the second electrode 220_7.

A first contact electrode 261_7 and a second contact electrode 262_7 may be in contact with one end or an end of first light emitting elements 300A and second light emitting elements 300B, respectively. On the other hand, a third contact electrode 263_7 and a fourth contact electrode 264_7 may be formed to have greater widths than the first contact electrode 261_7 and the second contact electrode 262_7, respectively, and may be in contact with light emitting elements 300 disposed at other positions. For example, the third contact electrode 263_7 may be in contact with the other ends of the second light emitting elements 300B and one end or an end or ends of third light emitting elements 300C, and the fourth contact electrode 264_7 may be in contact with the other ends of the first light emitting elements 300A and the other ends of the third light emitting elements 300C.

Since the third electrodes 230_7 and the fourth electrodes 240_7 are not directly electrically connected to the alignment lines AL, the electrical signals applied to the first electrode 210_7 and the second electrode 220_7 may flow through the light emitting elements 300A, 300B, and 300C and the contact electrodes 261_7, 262_7, 263_7, and 264_7. Accordingly, first light emitting elements 300A, second light emitting elements 300B, and third light emitting elements may be connected to each other in series. The display device 10_7 of FIG. 18 is different from the display device according to an embodiment of FIG. 17 in that the third electrodes 230_7 and the fourth electrodes 240_7 remain as the floating electrodes. The embodiment is a combination of embodiments of FIGS. 13 and 17, and a detailed description thereof is the same as described above.

The first non-alignment area NA1 and the second non-alignment area NA2 positioned on the first internal bank 410 and the second internal bank 420, respectively, in the non-alignment area NA in which the light emitting elements 300 are not disposed may be positioned at the outermost sides with respect to the center of each sub-pixel PXn. The first non-alignment area NA1 and the second non-alignment area NA2 may be formed adjacent to the external bank 450 extending in the second direction DR2, and a shape or a position of the external bank 450 may determine a unit area of each sub-pixel PXn. In an embodiment, the display device 10 may include internal banks having different widths, and thus, an area occupied by each sub-pixel PXn may be decreased. FIG. 18 may also include AA_7, AA1_7, AA2_7, AA3_7, NA_7, NA1_7, NA2_7, NA3_7, and NA4_7 as alignment areas and non-alignment areas.

Figure 19:
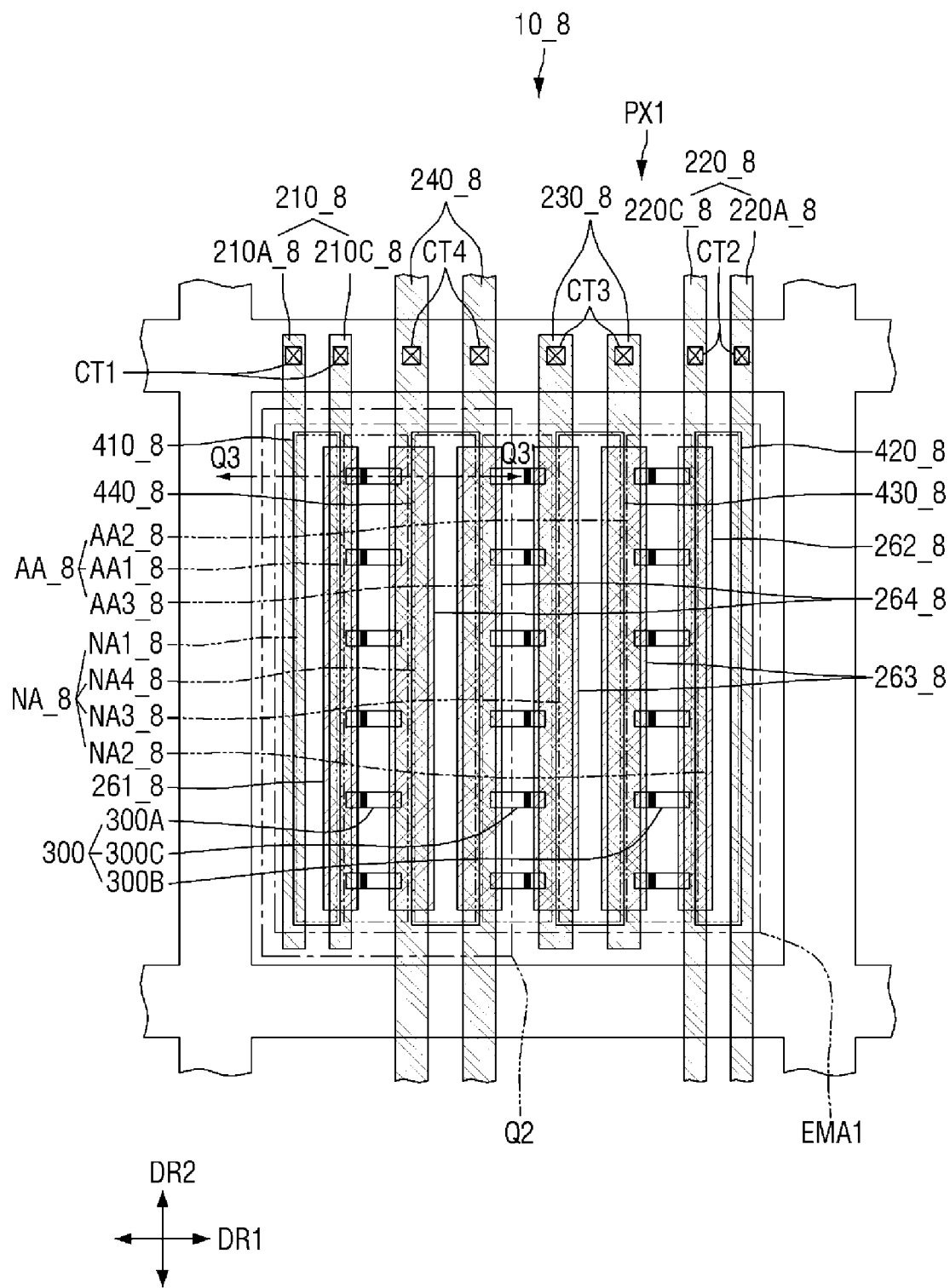
FIG. 19 is a schematic plan view illustrating one sub-pixel of a display device according to an embodiment.
Figure 20:
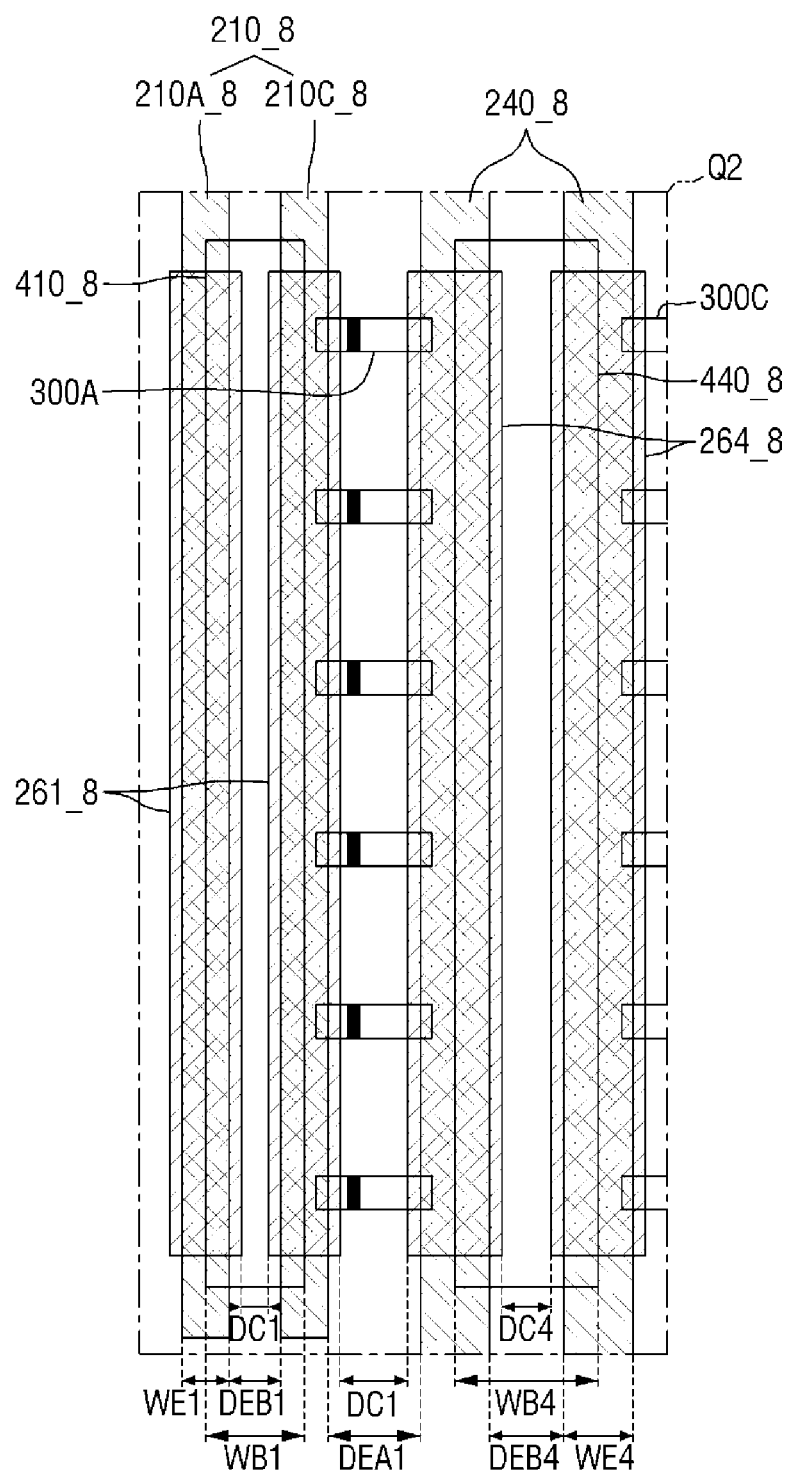
FIG. 20 is an enlarged view of portion Q2 of FIG. 19.
Figure 21:
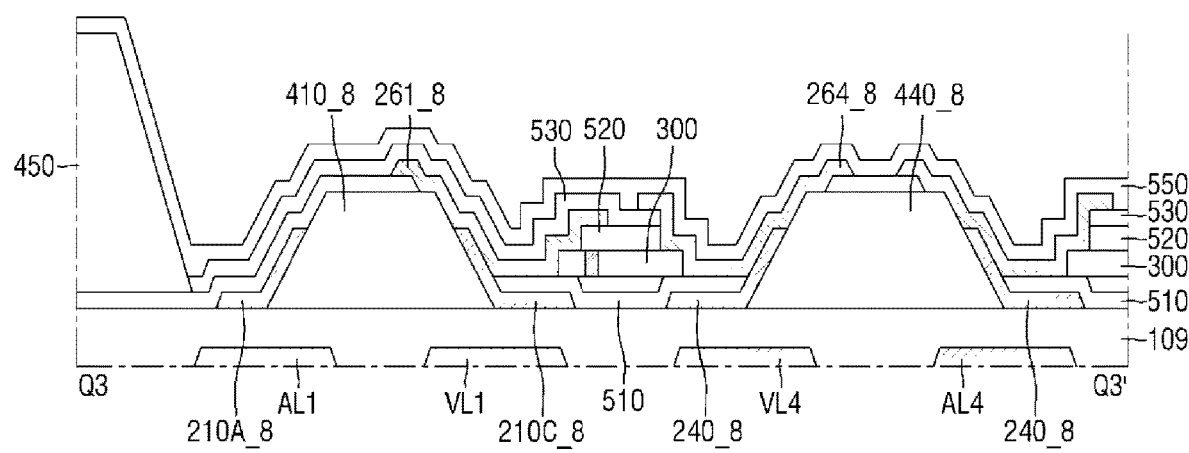
FIG. 21 is a schematic cross-sectional view taken along line Q3-Q3' of FIG. 20.

FIG. 19 is a schematic plan view illustrating one sub-pixel of a display device according to an embodiment. FIG. 20 is an enlarged view of portion Q2 of FIG. 19. FIG. 21 is a schematic cross-sectional view taken along line Q3-Q3' of FIG. 20.

Referring to FIGS. 19 to 21, a display device 10_8 according to an embodiment may include internal banks having different widths. For example, a width WB1 of a first internal bank 410_8 and a second internal bank 420_8 may be smaller than (or a width less than) a width WB4 of a third internal bank 430_8 and a fourth internal bank 440_8. The display device 10_8 of FIGS. 19 to 21 is different from the display device according to an embodiment of FIG. 16 in that internal banks have different widths. Hereinafter, an overlapping description will be omitted, and contents different from those described above will be described. FIG. 19 may also include 220A_8, 220C_8, 262_8, 263_8, AA1_8, AA2_8, and AA3_8 as sub-electrodes, main electrodes, contact electrodes, and alignment areas. FIG. 21 may further include a fourth voltage line VL4 and fourth alignment line AL4.

The display device 10_8 may include first to fourth internal banks 410_8, 420_8, 430_8, and 440_8, which may be disposed to be spaced apart from each other. First to fourth electrodes 210_8, 220_8, 230_8, and 240_8 may be disposed on the first to fourth internal banks 410_8, 420_8, 430_8, and 440_8, respectively, and alignment areas AA_8 and non-alignment areas NA_8 may be formed between the first to fourth electrodes 210_8, 220_8, 230_8, and 240_8.

With respect to a central portion of each sub-pixel PXn, the first internal bank 410_8 and the second internal bank 420_8 may be disposed at an outer portion of each sub-pixel PXn as compared with the third internal bank 430_8 and the fourth internal bank 440_8. Accordingly, the third alignment area AA3_5 may be formed adjacent to the central portion of the sub-pixel PXn, and the first alignment area AA1_5 and the second alignment area AA2_5 may be formed at the outer portion of the sub-pixel PXn. Similarly, the non-alignment areas NA_8 formed according to an arrangement of the internal banks may include a third non-alignment area NA3_8 and a fourth non-alignment area NA4_8 adjacent to the central portion of the sub-pixel PXn and a first non-alignment area NA1_8 and a second non-alignment area NA2_8 formed at the outer portion of the sub-pixel PXn.

Unlike the third internal bank 430_8 and the fourth internal bank 440_8, the alignment areas AA_8 in which the light emitting elements 300 are disposed may be formed only on one side or a side or sides of the first internal bank 410_8 and the second internal bank 420_8, and the non-alignment areas NA_8 in which the light emitting elements 300 are not disposed may be formed on the other sides of the first internal bank 410_8 and the second internal bank 420_8.

According to an embodiment, in the display device 10_8, the width WB1 of the first and second internal banks 410_8 and 420_8 may be smaller than (or a width less than) the width WB4 of the third and fourth internal banks 430_8 and 440_8. As the width of the first internal bank 410_8 and the second internal bank 420_8 becomes smaller or less, a width of the non-alignment areas formed at the outer portion of the sub-pixel PXn, for example, the first non-alignment area NA1_8 and the second non-alignment area NA2_8 may become smaller or less. Accordingly, in the display device 10_8, an area of the area in which the light emitting elements 300 are not disposed in each sub-pixel PXn may be minimized, and an area occupied by each sub-pixel PXn may be decreased.

As the width of the first internal bank 410_8 and the second internal bank 420_8 becomes smaller or less, other electrodes, an interval between other electrodes, or the like, may be variously modified. As an example, a width WE1 of the first electrode 210_8 and the second electrode 220_8 may be smaller than (or a width less than) a width WE4 of the third electrode 230_8 and the fourth electrode 240_8, and an interval DEB1 between the first sub-electrode 210A_8 and the first main electrode 210C_8 of the first electrode 210_8 may be smaller than (or less than) an interval DEB4 between the third electrodes 230_8 or the fourth electrodes 240_8. An interval DC1 between first contact electrodes 261_8 may be smaller than (or less than) an interval DC4 between fourth contact electrodes 264_8. However, the disclosure is not limited thereto, and widths of or intervals between the electrodes and the contact electrodes may be variously modified as long as the width WB1 of the first internal bank 410_8 and the second internal bank 420_8 becomes smaller or less than the width WB4 of the third internal bank 430_8 or the fourth internal bank 440_8, such that an area of each sub-pixel PXn is decreased. In FIG. 20, and interval DEA 1 may be greater than the interval DC1.

The display device 10 may include the main electrode and the sub-electrode or the electrodes to which the same alignment signal is applied, and may include spaces in which the main electrode and the sub-electrode or the electrodes are spaced apart from each other, such that the non-alignment areas NA may be formed. However, the main electrode and the sub-electrode or the electrodes may not necessarily be physically spaced apart from each other, and it is sufficient if at least portions of the main electrode and the sub-electrode or the electrodes may be disposed to be spaced apart from each other. In the display device 10 according to an embodiment, each of the electrodes may further include a bridge part connecting the main electrode and the sub-electrodes to each other.

Figure 22:
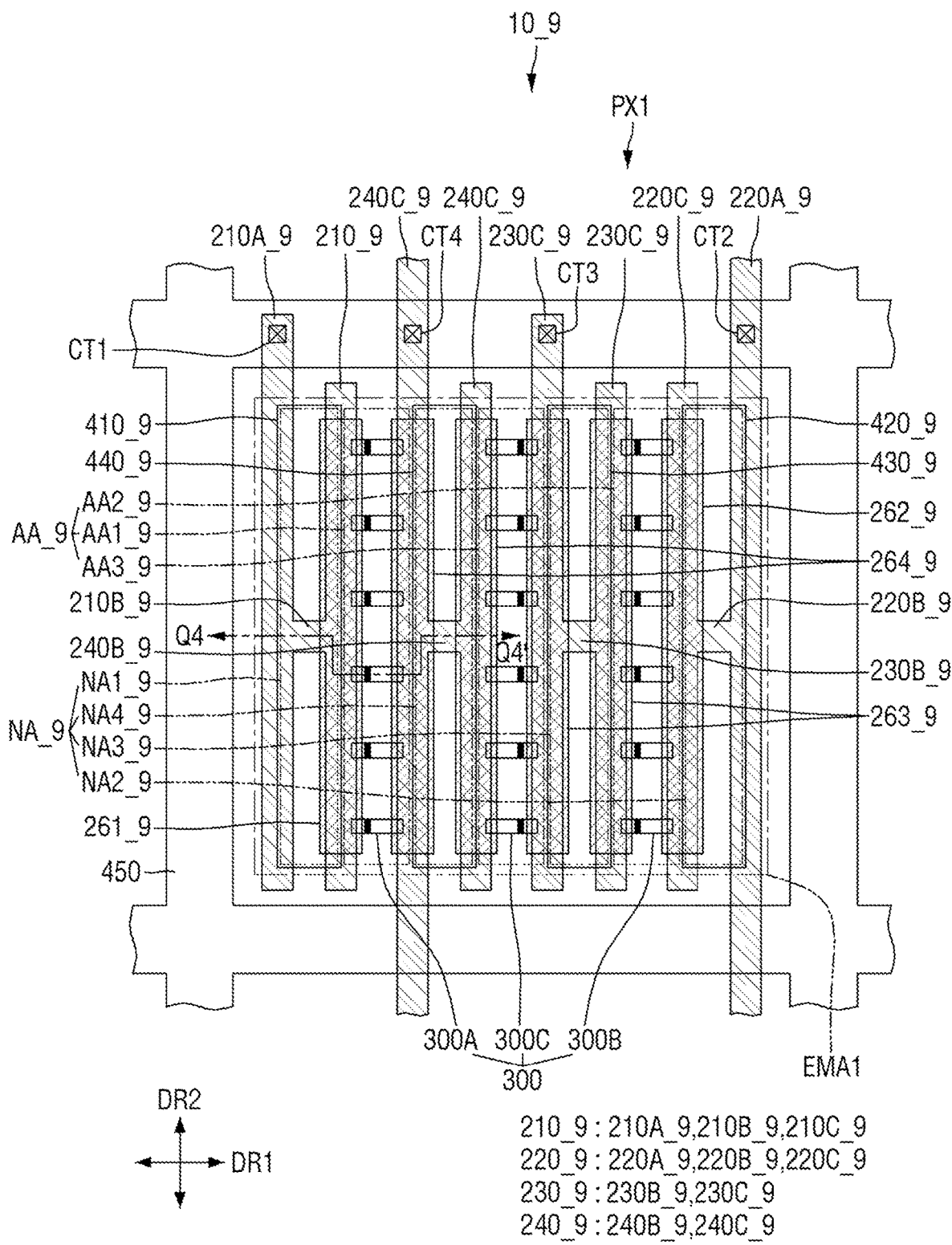
FIG. 22 is a schematic plan view illustrating one sub-pixel of a display device according to an embodiment.
Figure 23:
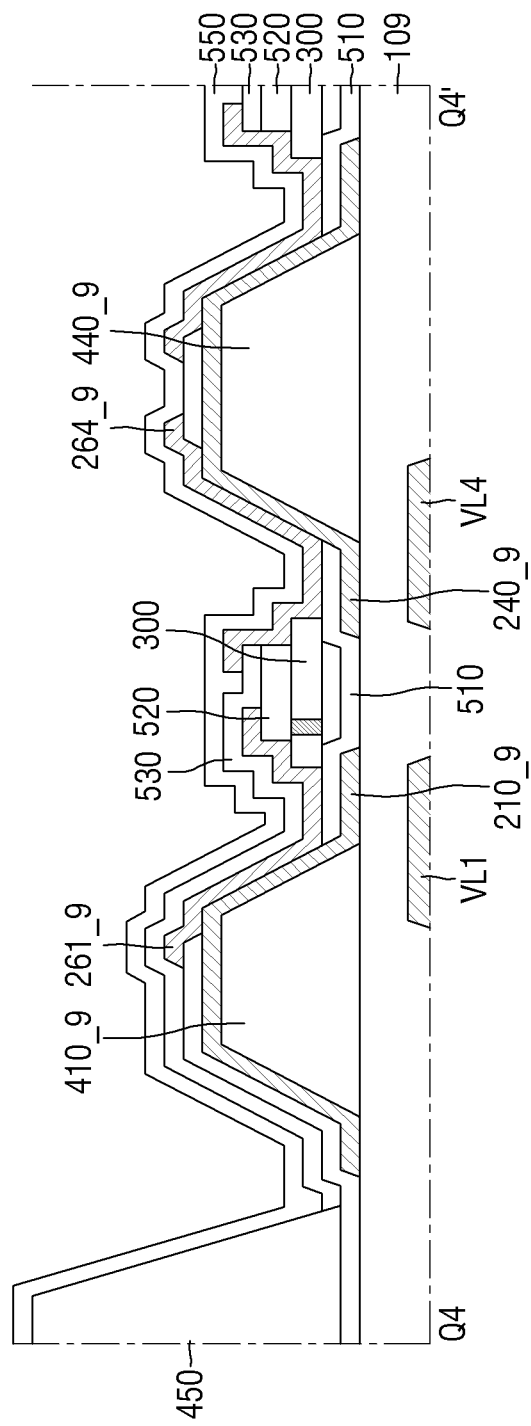
FIG. 23 is a schematic cross-sectional view taken along line Q4-Q4' of FIG. 22.

FIG. 22 is a schematic plan view illustrating one sub-pixel of a display device according to an embodiment. FIG. 23 is a schematic cross-sectional view taken along line Q4-Q4' of FIG. 22.

Referring to FIGS. 22 and 23, in a display device 10_9 according to an embodiment, each of electrodes may further include a bridge part connecting a main electrode and a sub-electrode to each other. For example, a first electrode 210_9 may further include, in addition to a first main electrode 210C_9 and a first sub-electrode 210A_9, a first bridge part 210B_9 connecting portions of the first main electrode 210C_9 and the first sub-electrode 210A_9 to each other. A second electrode 220_9 may include a second main electrode 220C_9, a second sub-electrode 220A_9, and a second bridge part 220B_9, and a third electrode 230_9 and a fourth electrode 240_9 may include bridge parts 230B_9 and 240B_9 connecting main electrodes 230C_9 and 240C_9 to each other, respectively. The display device 10_9 of FIG. 22 is different from the display device according to an embodiment of FIG. 16 in that the electrodes further include the bridge parts. Hereinafter, an overlapping description will be omitted, and contents different from those described above will be described. FIG. 22 may also include AA1_9, AA2_9, AA3_9, NA1_9, NA2_9, NA3_9, NA4_9, 261_9 (see also FIG. 23), 262_9, 263_9, and 264_9 (see also FIG. 23) as alignment areas, non-alignment areas, and contact electrodes.

In the display device 10_9, at least one electrode may include a main electrode and a sub-electrode, and may further include a bridge part connecting portions of the main electrode and the sub-electrode to each other. The main electrode and the sub-electrode may include portions spaced apart from each other, but may be electrically connected to each other through the bridge part.

For example, the first electrode 210_9 may be disposed on a first internal bank 410_9, and may include the first sub-electrode 210A_9 disposed on one side of the first internal bank 410_9 and the first main electrode 210C_9 disposed on the other side of the first internal bank 410_9. The first electrode 210_9 may further include the first bridge part 210B_9 connecting at least portions of the first main electrode 210C_9 and the first sub-electrode 210A_9 to each other. The first bridge part 210B_9 may be disposed to connect portions of the first main electrode 210C_9 and the first sub-electrode 210A_9 spaced apart from each other in the first direction DR1, for example, center portions of the first main electrode 210C_9 and the first sub-electrode 210A_9 in the second direction DR2, to each other. The first bridge part 210B_9 may be disposed to be positioned at a central portion of the first internal bank 410_9, but is not limited thereto, and the first bridge part 210B_9 may be disposed on both ends of the first internal bank 410_9 in the second direction DR2 and connect the first main electrode 210C_9 and the first sub-electrode 210A_9 to each other in the above area.

According to an embodiment, the first main electrode 210C_9 and the first sub-electrode 210A_9 may include portions physically spaced apart from each other, but these portions may be electrically connected to each other through the first bridge part 210B_9. The first main electrode 210C_9 and the first sub-electrode 210A_9 may include portions physically spaced apart from and face each other so that a non-alignment area NA_9 may be formed on the first internal bank 410_9. The first bridge part 210B_9 may be disposed in portions of the portions of first main electrode 210C_9 and the first sub-electrode 210A_9 spaced apart from each other, and may be directly connected to the first main electrode 210C_9 and the first sub-electrode 210A_9. The first main electrode 210C_9 and the first sub-electrode 210A_9 may be electrically connected to each other through the first bridge part 210B_9, and only one of the first main electrode 210C_9 and the first sub-electrode 210A_9 may be electrically connected to the first voltage line VL1 or the light emitting elements 300. For example, in a case of the first electrode 210_9, a length of the first sub-electrode 210A_9 measured in the second direction DR2 may be greater than that of the first main electrode 210C_9, and the first sub-electrode 210A_9 may be electrically connected to the first voltage line VL1 through a first contact hole CTL. The first main electrode 210C_9 may be electrically connected to one end or an end or ends of the light emitting elements 300. Since the first main electrode 210C_9 and the first sub-electrode 210A_9 are electrically connected to each other, a first source voltage applied to the first sub-electrode 210A_9 may be transferred to one end or an end or ends of the light emitting elements 300 through the first bridge part 210B_9 and the first main electrode 210C_9.

Similarly, the second electrode 220_9 may include the second main electrode 220C_9, the second sub-electrode 220A_9, and the second bridge part 220B_9. The second sub-electrode 220A_9 may be electrically connected to the second voltage line VL2, and a second source voltage applied to the second sub-electrode 220A_9 may be transferred to the light emitting elements 300 through the second bridge part 220B_9 and the second main electrode 220C_9.

On the other hand, the third electrode 230_9 and the fourth electrode 240_9 may include the main electrodes 230C_9 and 240C_9 partially spaced apart from each other, respectively, and may include the bridge parts 230B_9 and 240B_9 connecting the main electrodes 230C_9 and 240C_9 to each other. Describing the third electrode 230_9 by way of example, the third electrode 230_9 may include two third main electrodes 230C_9 disposed on both sides of a third internal bank 430_9, and may include a third bridge part 230B_9 partially connecting the two third main electrodes 230C_9 to each other.

Any one of the third main electrodes 230C_9 may be electrically connected to the first voltage line VL1 through a third contact hole CT3, and at the same time, may be electrically connected to one end or an end or ends of the light emitting elements 300, for example, one end or an end or ends of light emitting elements 300C. The other of the third main electrodes 230C_9 may have a relatively small length measured in the second direction DR2, and may be electrically connected to the third bridge part 230B_9 and one end or an end or ends of second light emitting elements 300B. The first source voltage applied through the first voltage line VL1 may be transferred to different third main electrodes 230C_9 through the third bridge part 230B_9. The fourth electrode 240_9 is also the same as described above.

Since the above-described main electrode and sub-electrodes are disposed so that at least portions thereof are spaced apart from each other, an electric field EL3 having a potential gradient toward an outward direction may be generated between the main electrode and sub-electrodes. Non-alignment areas NA_9 may be formed at portions where the main electrodes and the sub-electrodes are spaced apart from each other, on the respective internal banks 410_9, 420_9, 430_9, and 440_9, and alignment areas AA_9 may be formed between the respective internal banks 410_9, 420_9, 430_9, and 440_9.

In the display device 109 according to an embodiment, each of the electrodes may include the bridge part electrically connecting the main electrode and the sub-electrode to each other, and an electrical signal for driving the display device 10_9 may be applied to each of the electrodes disposed on the internal banks.

Figure 24:
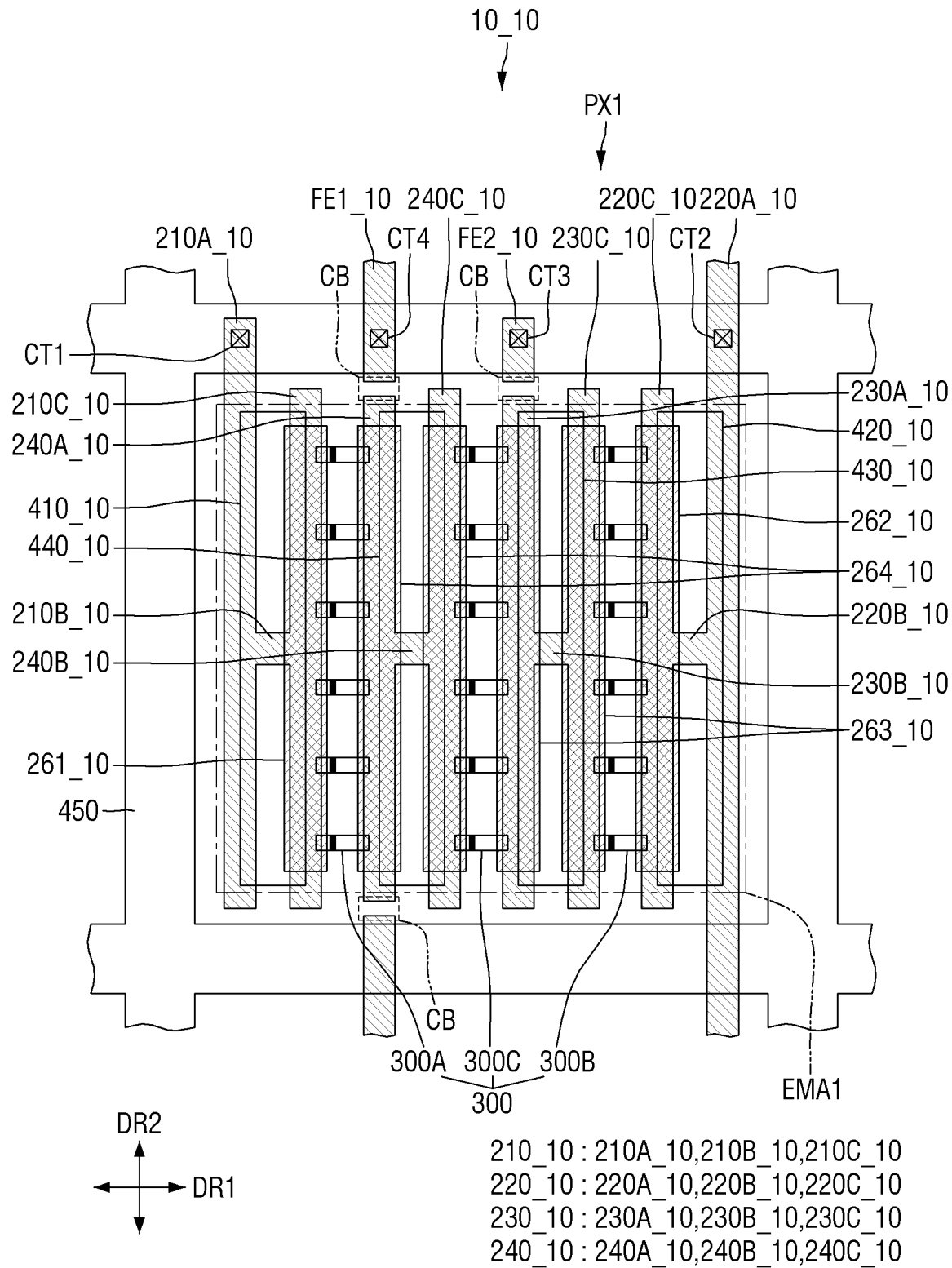
FIG. 24 is a schematic plan view illustrating one sub-pixel of a display device according to an embodiment.

FIG. 24 is a schematic plan view illustrating one sub-pixel of a display device according to an embodiment.

Referring to FIG. 24, in a display device 10_10 according to an embodiment, a third electrode 230_10 and a fourth electrode 240_10 may include main electrodes 230C_10 and 240C_10 and bridge parts 230B_10 and 240B_10, respectively, but may not be electrically connected to the voltage lines VL1 and VL2. Similar to an embodiment of FIG. 18, the third electrode 230_10 and the fourth electrode 240_10 may be disconnected and spaced apart from electrode fragments FE1_10 and FE2_10 electrically connected to the voltage lines VL1 and VL2, respectively, and may remain as floating electrodes. The display device 10_10 of FIG. 24 is a combination of embodiments of FIGS. 18 and 23, and a detailed description thereof is the same as described above. FIG. 24 may also include 210_10, 210A_10, 210B_10, 210C_10, 220_10, 220A_10, 220B_10, 220C_10, 230A_10, 240A_10, 410_10, 420_10, 430_10, 440_10, 261_10, 262_10, 263_10, and 264_10 as first and second electrodes, sub-electrodes, bridge parts, main electrodes, internal banks and contact electrodes.

Figure 25:
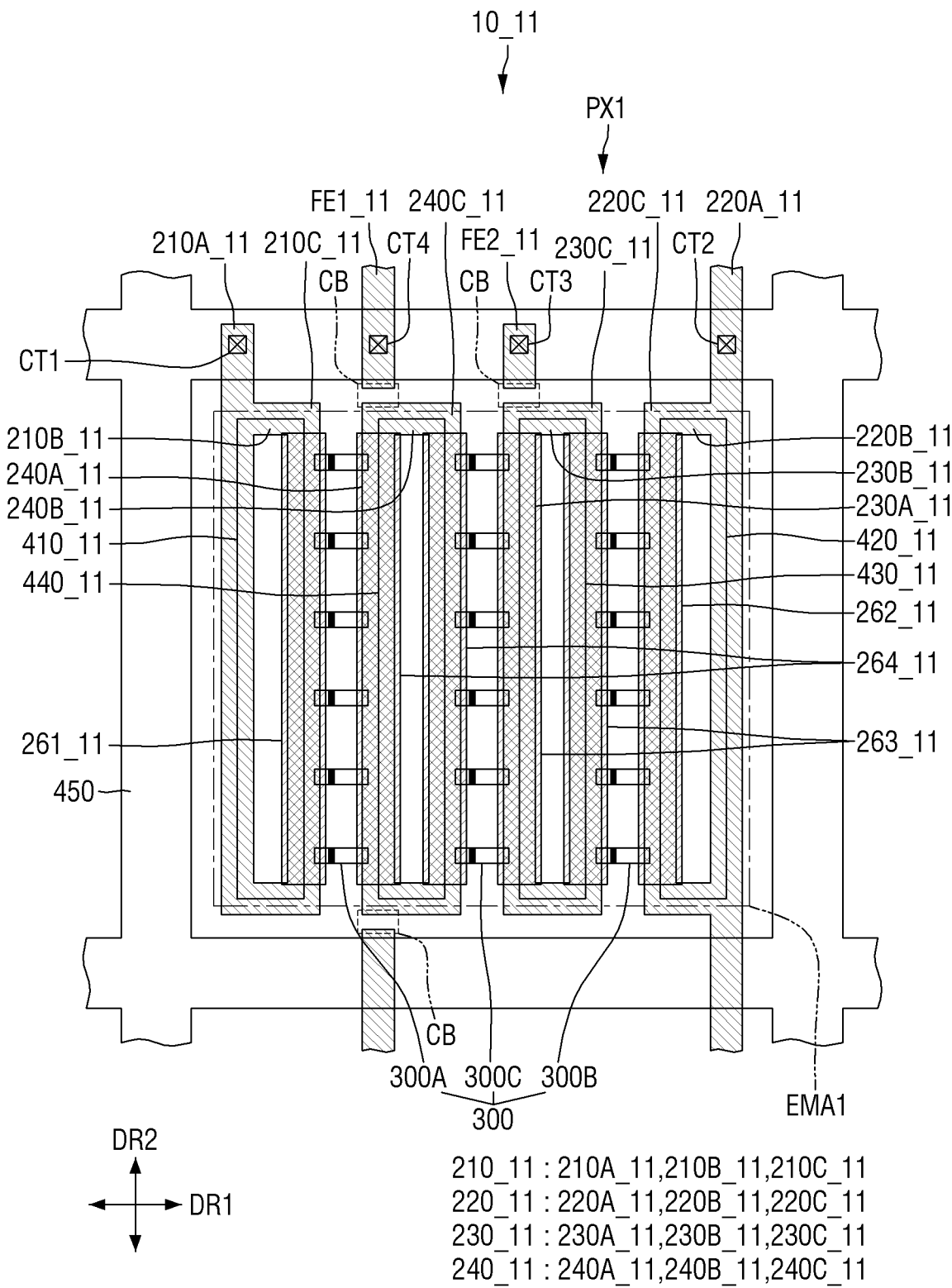
FIGS. 25 and 26 are schematic plan views illustrating one sub-pixels of display devices according to embodiments.
Figure 26:
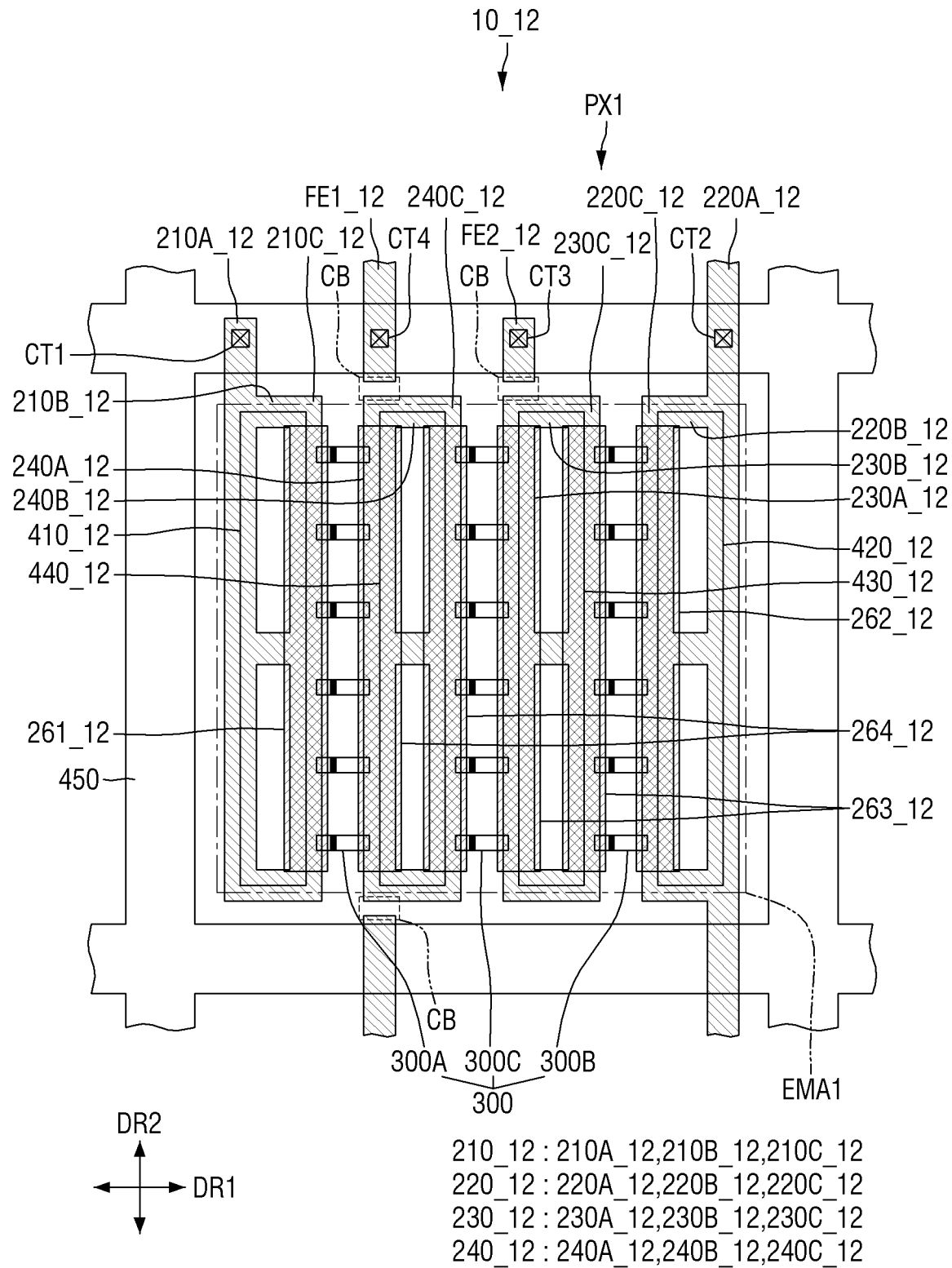

FIGS. 25 and 26 are schematic plan views illustrating one sub-pixels of display devices according to embodiments.

Referring to FIGS. 25 and 26, in display devices 10_11 and 10_12 according to an embodiment, bridge parts of respective electrodes may be formed at different positions. In the display device 10_11 of FIG. 25, bridge parts 210B_11, 220B_11, 230B_11, and 240B_11 of the respective electrodes may be disposed on both ends of respective internal banks 410_11, 420_11, 430_11, and 440_11 in the second direction DR2, respectively, and may connect respective main electrodes to each other or connect main electrodes and sub-electrodes to each other. In the display device 10_12 of FIG. 26, in addition to the display device 10_11 of FIG. 25, as in the display device 10_10 of FIG. 24, bridge parts 210B_12, 220B_12, 230B_12, and 240B_12 of respective electrodes may be further disposed at central portions of internal banks 410_12, 420_12, 430_12, and 440_12, respectively. A description thereof is substantially the same as that described above, and a detailed description will thus be omitted. FIG. 25 may also include FE1_11, FE2_11, 210_11, 210A_11, 210C_11, 220_11, 220A_11, 220C_11, 230_11, 230A_11, 230C_11, 240_11, 240A_11, 240C_11, 261_11, 262_11, 263_11, 264_11, FE1_12 (FIG. 26), FE2_12 (FIG. 26), 210_12, 210A_12, 210C_12, 220_12, 220A_12, 220C_12, 230_12, 230A_12, 230C_12, 240_12 240A_12, 240C_12, 261_12, 262_12, 263_12, and 264_12.

In the display device 10, the respective electrodes may include the main electrodes and the sub-electrodes, and the non-alignment areas may be formed between the main electrodes and the sub-electrodes. Main electrodes electrically connected to the light emitting elements 300 among these main electrodes may be electrically connected to the voltage lines VL1 and VL2 through contact holes while being electrically connected to the light emitting elements 300 through the respective contact electrodes 261 and 262. In an embodiment, in the display device 10, the respective contact electrodes 261 and 262 may be directly connected to the respective voltage lines VL1 and VL2.

Figure 27:
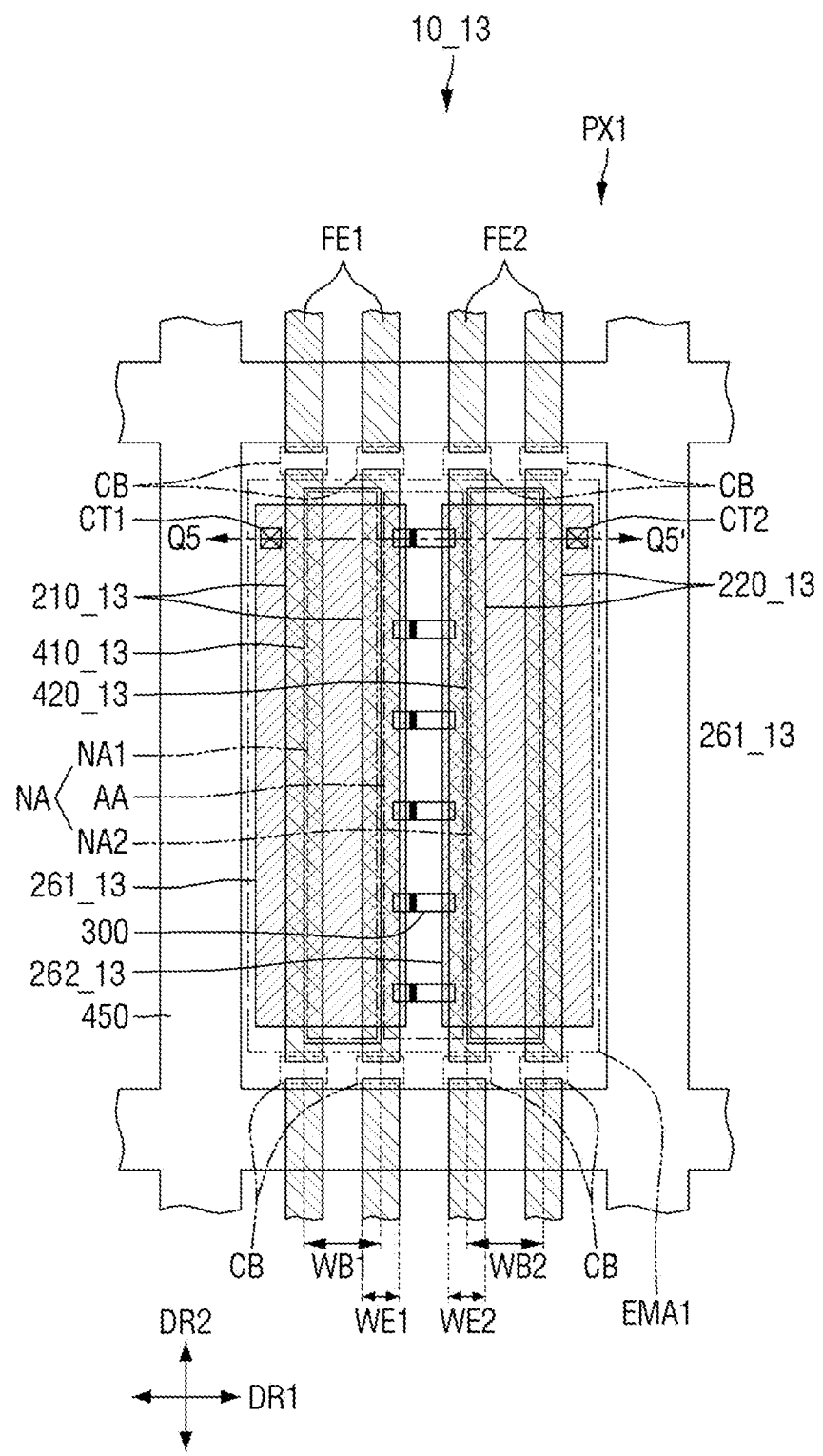
FIG. 27 is a schematic plan view illustrating one sub-pixel of a display device according to an embodiment.
Figure 28:
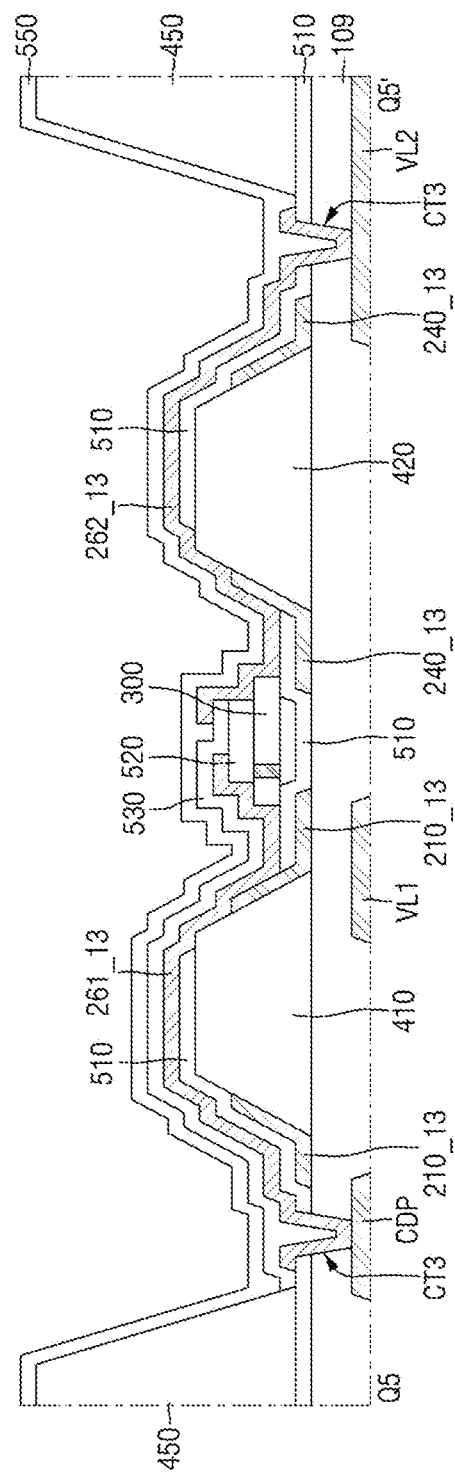
FIG. 28 is a schematic cross-sectional view taken along line Q5-Q5' of FIG. 27.

FIG. 27 is a schematic plan view illustrating one sub-pixel of a display device according to an embodiment. FIG. 28 is a schematic cross-sectional view taken along line Q5-Q5' of FIG. 27.

Referring to FIGS. 27 and 28, in a display device 10_13 according to an embodiment, a first contact electrode 261_13 and a second contact electrode 262_13 may be electrically connected to the voltage lines VL1 and VL2 through a first contact hole CT1 and a second contact hole CT2, respectively. First electrodes 210_13 and second electrodes 220_13 may be disposed on both sides of a first internal bank 410_13 and a second internal bank 420_13, respectively, and may be spaced apart from each other. The first electrodes 210_13 and second electrodes 220_13 extend in the second direction DR2, and alignment signals may be applied to the first electrodes 210_13 and second electrodes 220_13 through a separate voltage application device during a process of manufacturing the display device 10_13. FIG. 28 may also include at least a fourth electrode 240_13.

In the display device 10_13, the alignment line AL disposed on the circuit element layer may be omitted, and the first electrodes 210_13 and the second electrodes 220_13 may not be directly connected to the voltage lines VL1 and VL2. The first electrodes 210_13 and the second electrodes 220_13 may be alignment electrodes used to align the light emitting elements 300, and may be disconnected for each sub-pixel PXn in the display device 10_13. According to an embodiment, the first electrodes 210_13 and second electrodes 220_13 may extend in the second direction DR2, respectively, but may be spaced apart from electrode fragments FE1 and FE2 disposed in areas overlapping the external bank 450. The electrode fragments FE1 and FE2 may be electrodes remaining after being connected to the first electrodes 210_13 and second electrodes 220_13 and partially patterned (see 'CB' of FIG. 27) after the light emitting elements are aligned. The electrode fragments FE1 and FE2 may remain in a floating state without other electrical signals applied thereto.

The first contact electrode 261_13 and the second contact electrode 262_13 may be disposed on the first electrodes 210_13 and the second electrodes 220_13, respectively, and may be formed to have greater widths than the first electrodes 210_13 and the second electrodes 220_13. According to an embodiment, the first contact electrode 261_13 and the second contact electrode 262_13 may have widths greater than widths WE1 and WE2 of the first electrode 210_13 and the second electrode 220_13 or widths WB1 and WB2 of the first internal bank 410_13 and the second internal bank 420_13, respectively. The first contact electrode 261_13 and the second contact electrode 262_13 are respectively disposed to overlap the first electrodes 210_13 or second electrode 220_13, respectively, and may be disposed to cover both sides of the internal banks 410_13 and 420_13, respectively, while being in contact with both ends of the light emitting elements 300, respectively. At least portions of the first contact electrode 261_13 and the second contact electrode 262_13 may be disposed on the first insulating layer 510 in areas in which the internal banks 410_13 and 420_13 are not disposed, and the first contact hole CT1 and the second contact hole CT2 may be formed in such areas. The first contact electrode 261_13 may be in direct contact with the first conductive pattern CDP1 through the first contact hole CT1, and may be electrically connected to the driving transistor DT and the first voltage line VL1 through the first conductive pattern CDP1.

The first contact electrode 261_13 and the second contact electrode 262_13 may be disposed to overlap the first electrodes 210_13 or second electrode 220_13, respectively, and may be in direct contact with some or a number of the first electrodes 210_13 or second electrode 220_13, respectively. For example, the first electrode 210_13 and the second electrodes 220_13 disposed adjacent to the light emitting elements 300 among the first electrodes 210_13 and the second electrodes 220_13 may be in direct contact with the first contact electrode 261_13 or the second contact electrode 262_13, respectively. The first electrode 210_13 and the second electrodes 220_13 disposed adjacent to the light emitting elements 300 may be exposed by openings formed in the first insulating layer 510 disposed on the first electrode 210_13 and the second electrodes 220_13, and the exposed portions exposed by the openings may be in direct contact with the first contact electrode 261_13 or the second contact electrode 262_13. However, the disclosure is not limited thereto. The first insulating layer 510 may be disposed to cover the first electrode 210_13 and the second electrode 220_13 without exposing the first electrode 210_13 and the second electrode 220_13. The first contact electrode 261_13 and the second contact electrode 262_13 may not be in direct contact with the electrodes 210_13 and 220_13, respectively.

In the display device 10, the electrodes do not necessarily extend in one direction, and may also have a shape in which at least portions thereof are curved.

Figure 29:
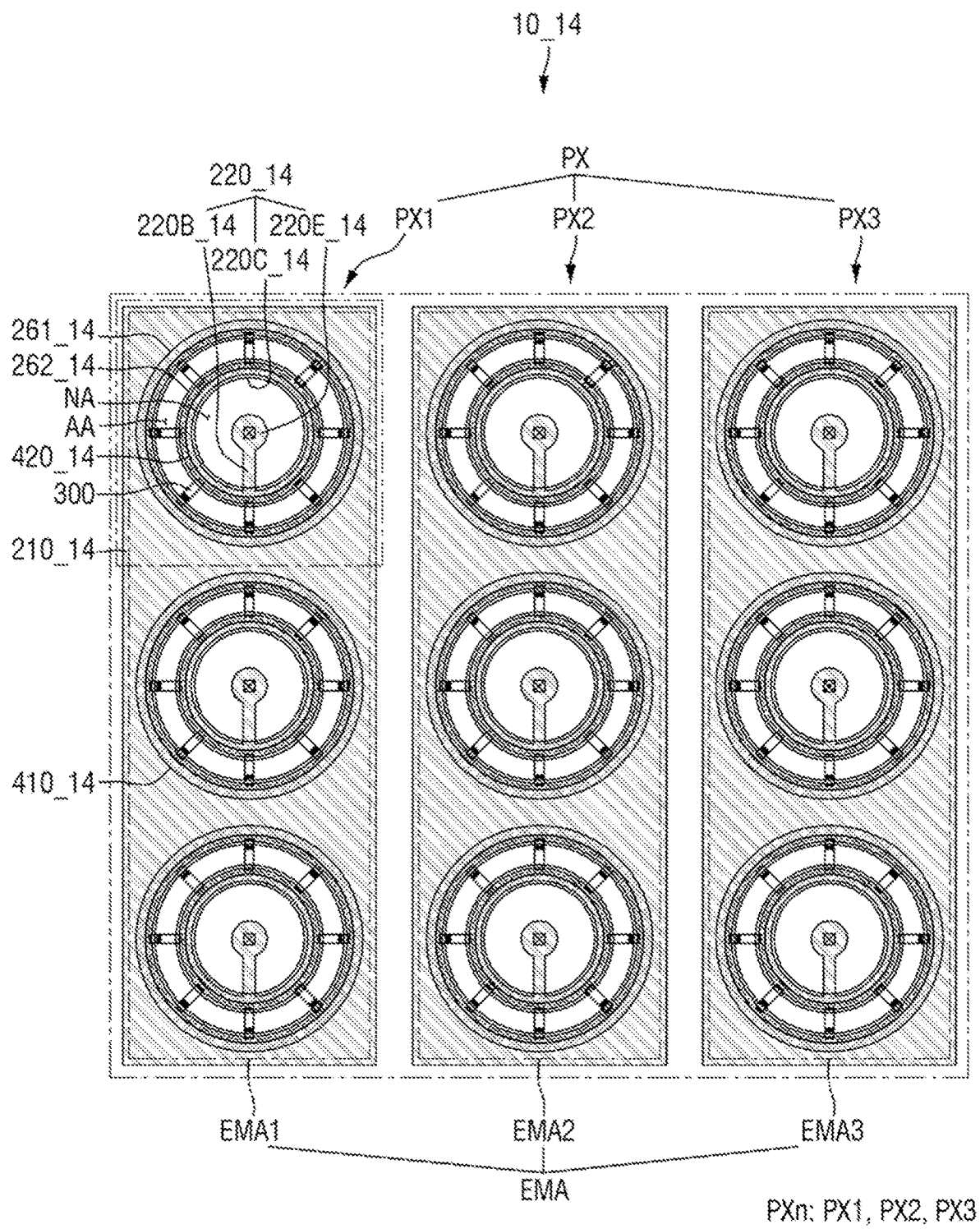
FIG. 29 is a schematic plan view illustrating one sub-pixel of a display device according to an embodiment.
Figure 30:
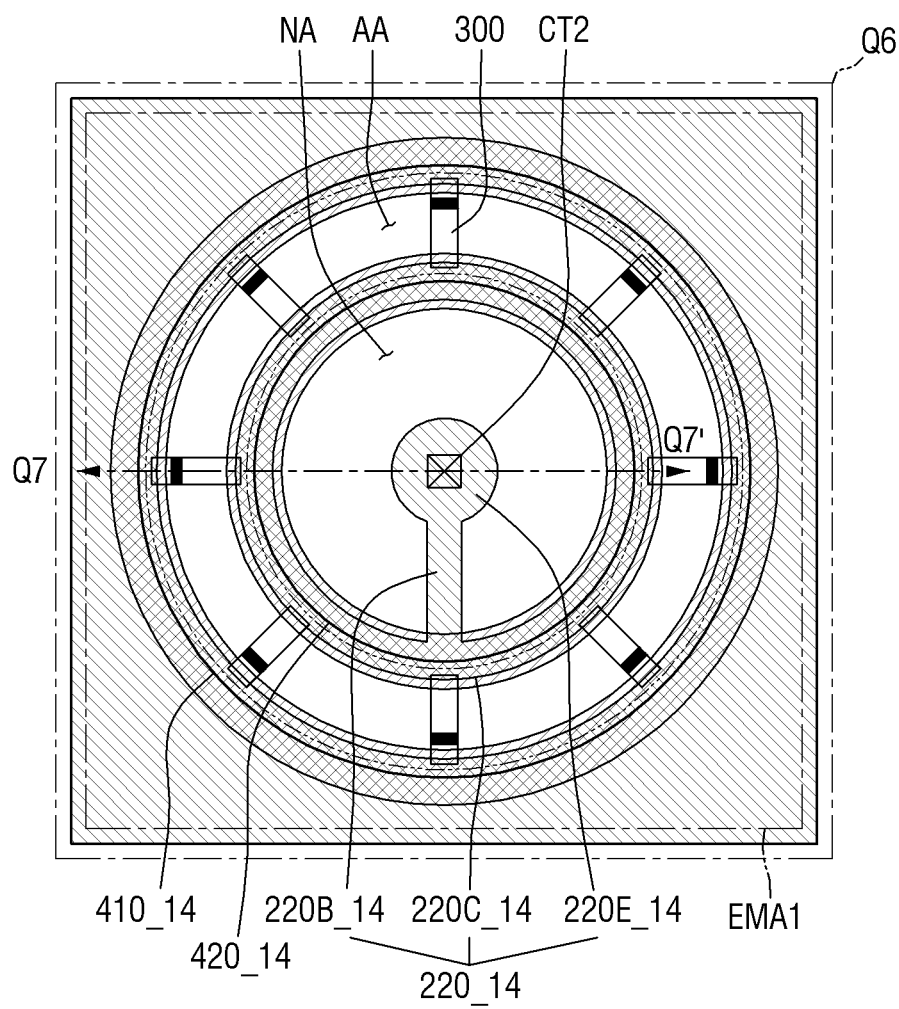
FIG. 30 is an enlarged view of portion Q6 of FIG. 29.
Figure 31:
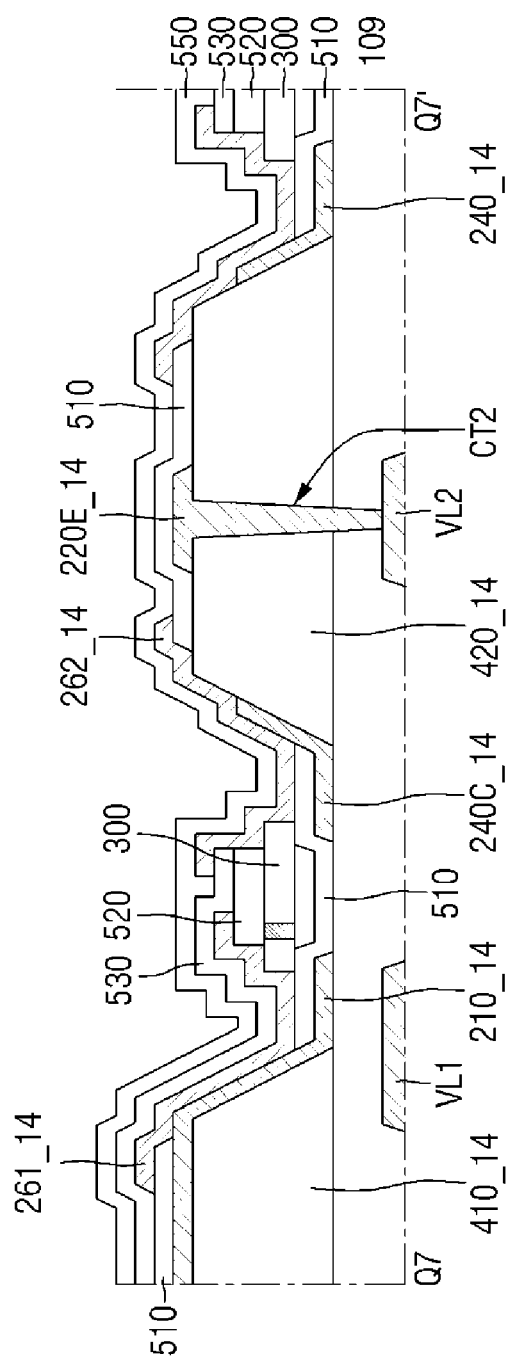
FIG. 31 is a schematic cross-sectional view taken along line Q7-Q7' of FIG. 30.

FIG. 29 is a schematic plan view illustrating one sub-pixel of a display device according to an embodiment. FIG. 30 is an enlarged view of portion Q6 of FIG. 29. FIG. 31 is a schematic cross-sectional view taken along line Q7-Q7' of FIG. 30.

Referring to FIGS. 29 to 31, in a display device 10_14 according to an embodiment, a first electrode 210_14 and a second electrode 220_14 may have a shape in which at least partial areas thereof are curved, and the curved areas of the first electrode 210_14 and a second electrode 220_14 may be spaced apart from and face each other. A first internal bank 410_14 and a second internal bank 420_14 may also have a curved shape, and curved portions of the first internal bank 410_14 and the second internal bank 420_14 may be spaced apart from and face each other.

For example, the first internal bank 410_14 may have a width, may extend in one direction, and may include holes. In an embodiment, the holes may have a circular shape, and may be arranged along one direction in which the first internal bank 410_14 extends. It has been illustrated in FIG. 29 that three holes are formed in one first internal bank 410_14, but the disclosure is not limited thereto. The first internal bank 410_14 may also include a larger number of holes, a smaller number of holes, or only one hole. The holes of the first internal bank 410_14 are not limited in a shape thereof as long as they may provide a space in which the second internal bank 420_14 is disposed, and may also have, for example, a shape such as an elliptical shape or a polygonal shape of a quadrangle or more in a plan view. Hereinafter, it will be described by way of example that the first internal bank 410_14 may include three holes having a circular shape.

The second internal bank 420_14 may have a curved shape, for example, a circular shape, and may be disposed in the hole of the first internal bank 410_14. A diameter of the second internal bank 420_14 may be smaller than a diameter of the hole of the first internal bank 410_14, and the second internal bank 420_14 may be spaced apart from and face a sidewall of the hole of the first internal bank 410_14. For example, both side surfaces of the first internal bank 410_14 and the second internal bank 420_14 may be spaced apart from each other to face each other. Light emitting elements 300 may be disposed between the first internal bank 410_14 and the second internal bank 420_14.

The first electrode 210_14 is disposed on the first internal bank 410_14. The first electrode 210_14 may be disposed to cover the first internal bank 410_14, and may include holes, similar to the first internal bank 410_14. According to an embodiment, the first electrode 21014 may include electrode holes formed to correspond to the holes of the first internal bank 410_14. The electrode holes may have a smaller diameter than the holes of the first internal bank 410_14 so that the holes of the first internal bank 410_14 are partially exposed, and the first electrode 210_14 may be disposed to cover the sidewall of the hole of the first internal bank 410_14.

The second electrode 220_14 is disposed on the second internal bank 420_14. The second electrode 220_14 may be disposed to cover a curved outer surface of the second internal bank 420_14, but may be disposed to expose a portion, for example, a central portion, of an upper surface of the second internal bank 420_14. According to an embodiment, the second electrode 220_14 may have a curved shape so as to correspond to the outer surface of the second internal bank 420_14. The second electrode 220_14 may be disposed to cover an outer side surface of the second internal bank 420_14 spaced apart from and facing the first internal bank 410_14, and in an embodiment, the second electrode 220_14 may have a cylindrical shape. Accordingly, the first electrode 210_14 and the second electrode 220_14 may be spaced apart from and face each other between the first internal bank 410_14 and the second internal bank 420_14.

According to an embodiment, the second electrode 220_14 may include a second main electrode 220C_14 disposed along the outer side surface of the second internal bank 420_14 and electrically connected to the light emitting elements 300, a second electrode extension part 220E_14 disposed at a central portion of the second internal bank 420_14, and a second bridge part 220B_14 connecting the second main electrode 220C_14 and the second electrode extension part 220E_14 to each other. The second electrode 220_14 may be electrically connected to the second voltage line VL2 through a second contact hole CT2 formed in the second electrode extension part 220E_14. In the second electrode 220_14, the second main electrode 220C_14 spaced apart from the second electrode extension part 220E_14 may be electrically connected to the second electrode extension part 220E_14 through the second bridge part 220B_14. It has been illustrated in the drawings that one second bridge part 220B_14 is disposed to connect the second electrode extension part 220E_14 and the second main electrode 220C_14 to each other, but the disclosure is not limited thereto.

A first contact electrode 261_14 and a second contact electrode 262_14 may be disposed to cover the first electrode 210_14 and the second electrode 220_14, respectively, and may be disposed along the sidewall of the hole of the first internal bank 410_14, and the second contact electrode 262_14 may have a greater width than the second electrode 220_14 and may be disposed to cover the outer side surface of the second internal bank 420_14. In an embodiment, the first contact electrode 261_14 and the second contact electrode 262_14 may have a circumferential or annular shape with the central portion of the second internal bank 420_14 as the center of curvature, and may be disposed to be spaced apart from each other. The light emitting elements 300 disposed between the first internal bank 410_14 and the second internal bank 420_14 may be electrically connected to the first electrode 210_14 and the second electrode 220_14 through the first contact electrode 261_14 and the second contact electrode 262_14.

As described above, the first electrode 210_14 and the second electrode 220_14 to which different electrical signals are applied may be disposed between the first internal bank 410_14 and the second internal bank 420_14 so as to be spaced apart from each other, and an alignment area AA may be formed between the first electrode 210_14 and the second electrode 220_14.

On the other hand, the second electrode 22014 is disposed to have the circumferential shape along the outer side surface of the second internal bank 420_14, such that the second electrode 220_14 to which the same electrical signal is applied may be disposed in a partially spaced shape on the central portion of the second internal bank 420_14. For example, the second electrode 220_14 may have a shape in which it surrounds the upper surface of the second internal bank 420_14, and on the upper surface of the second internal bank 420_14, an electric field generated by an alignment signal may have a potential gradient toward an outward direction.

Figure 32:
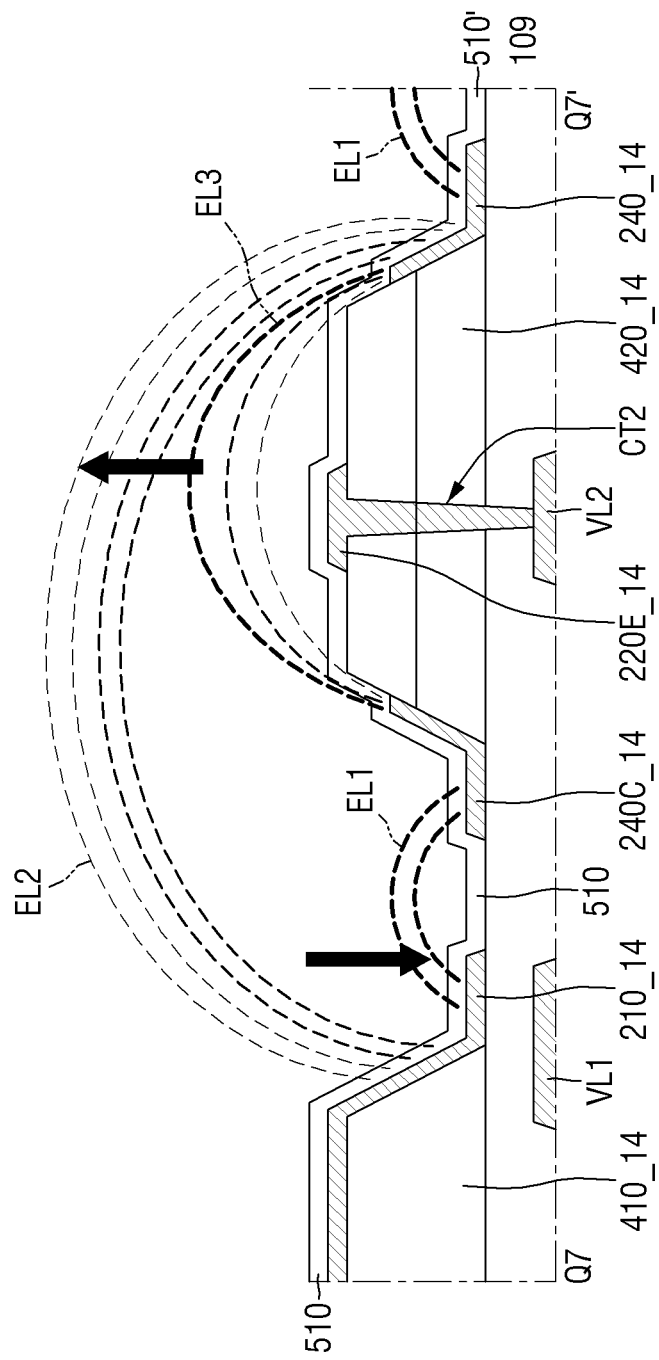
FIG. 32 is a schematic view illustrating electric fields formed between electrodes during a process of manufacturing the display device of FIG. 31.

FIG. 32 is a schematic view illustrating electric fields formed between electrodes during a process of manufacturing the display device of FIG. 31.

Referring to FIG. 32, the first electrode 210_14 disposed on the first internal bank 410_14 may be spaced apart from and face the second electrode 220_14 disposed on the outer side surface of the second internal bank 420_14. The second electrode 220_14 is disposed to surround the second internal bank 420_14, and thus, the first electrode 210_14 may face each of a portion adjacent to the second electrode 220_14 and a portion spaced apart from the second electrode 220_4. A first electric field EL1 and a second electric field EL2 may be generated between the first electrode 210_14 and the portion adjacent to the second electrode 220_14 and the portion spaced apart from the second electrode 220_4 by different electrical signals, and potential gradients toward an area between the first electrode 210_14 and the second electrodes 220_14 may be generated in the first electric field EL1 and the second electric field EL2. The light emitting elements 300 may be disposed between the first electrode 210_14 and the second electrode 220_14 by the first electric field EL1 and the second electric field EL2.

Figure 33:
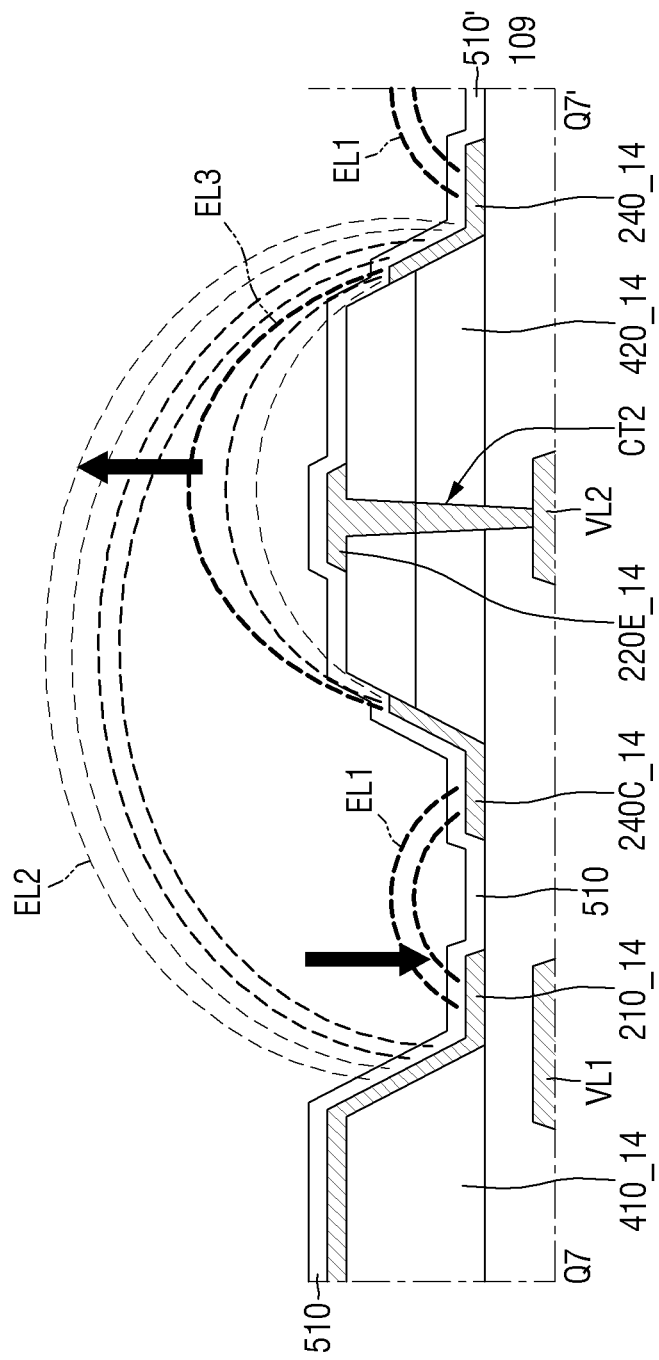
FIGS. 33 and 34 are schematic plan views illustrating one sub-pixels of display devices according to embodiments.

On the other hand, a third electric field EL3 may be generated on the second internal bank 420_14 by the second electrode 220_14. The third electric field EL3 may be generated by the same electrical signal, and may have a potential gradient from the upper surface of the second internal bank 420_14 toward an outward direction. Accordingly, a non-alignment area NA may be formed on the second internal bank 420_14, and an alignment area AA may be formed on the first internal bank 410_14 and the second internal bank 420_14. The display device 1014 according to an embodiment may include the internal banks 410_14 and 420_14 and the electrodes 210_14 and 220_14 having the shape in which at least portions thereof are curved, and the alignment area AA and the non-alignment area NA may be formed between the internal banks 410_14 and 420_14 and the electrodes 210_14 and 220_14. The second electrode 220_14 is disposed to cover only the outer side surface of the second internal bank 420_14 having the circular shape, such that an area in which the second electrodes 220_14 are partially spaced apart from each other may be formed on the upper surface of the second internal bank 420_14. The non-alignment area NA in which the light emitting elements 300 are not disposed may be formed in the area. FIGS. 31-33 may also include 240_14 and 240C_14 as at least a fourth electrode and at least a main electrode.

Figure 34:
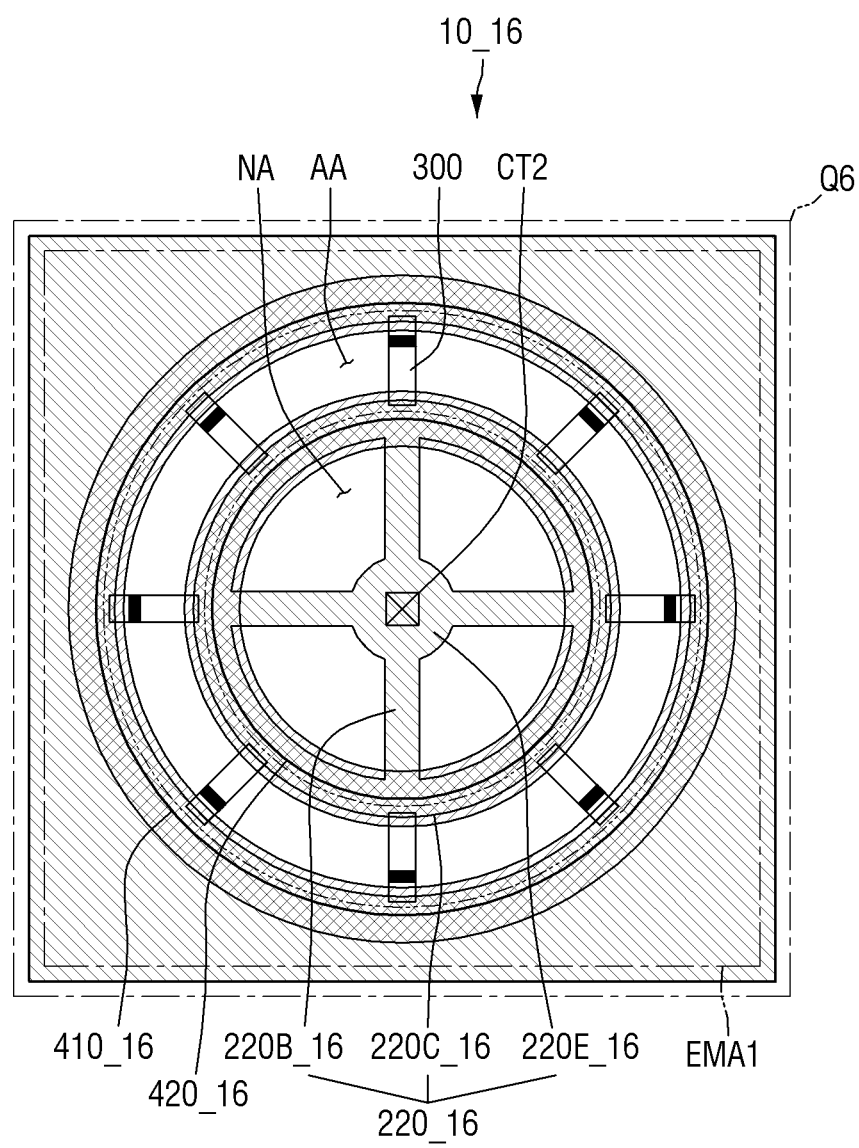

FIGS. 33 and 34 are schematic plan views illustrating one sub-pixels of display devices according to embodiments.

Referring to FIGS. 33 and 34, in display devices 10_16 according to an embodiment, second electrodes 220_15 and 220_16 may include larger numbers of second bridge parts 220B_15 and 220B_16, respectively. In the display device of FIG. 33, the second bridge part 220B_15 of the second electrode 220_15 may have a shape in which it extends in a longitudinal direction in the drawing, and may cross a second electrode extension part 220E_15, such that each of both ends of the second bridge part 220B_15 may be connected to a second main electrode 220C_16. In the display device 10_16 of FIG. 34, the second electrode 220_16 may further include a second bridge part 220B_15 extending in a transverse direction in the drawing. A description thereof is substantially the same as that described above, and a detailed description will thus be omitted. FIG. 34 may also include 220C_16, 220E_16, 410_16, and 420_16 as main electrodes, electrode extension parts and internal banks.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

The invention claimed is:

1. A display device comprising:
a first internal bank and a second internal bank extending in a first direction on a substrate and spaced apart from each other in a second direction different from the first direction;
a first electrode including a first main electrode extending in the first direction on a side of the first internal bank and a first sub-electrode extending in the first direction on another side of the first internal bank and at least partially spaced apart from and facing the first main electrode;
a second electrode extending in the first direction on a side of the second internal bank and spaced apart from and facing the first main electrode; and
a light emitting element disposed between the first internal bank and the second internal bank,
wherein the light emitting element has an end disposed on the first main electrode and another end disposed on the second electrode.

2. The display device of claim 1, wherein
a non-alignment area is formed on the first internal bank and the non-alignment area does not include the light emitting element, and
the non-alignment area partially overlaps an area in a plan view in which the first main electrode and the first sub-electrode are spaced apart from each other.

3. The display device of claim 2, wherein the second electrode includes a second main electrode extending in the first direction on the side of the second internal bank and a second sub-electrode extending in the first direction on the another side of the second internal bank.

4. The display device of claim 3, wherein the another end of the light emitting element is disposed on the second main electrode.

5. The display device of claim 3, wherein
the first main electrode and the first sub-electrode are spaced apart from and face each other in the second direction on the first internal bank and the first main electrode is not connected to the first sub-electrode, and
the first sub-electrode is not electrically connected to the light emitting element.

6. The display device of claim 3, wherein
the second electrode includes a bridge part at least partially disposed between the second main electrode and the second sub-electrode on the second internal bank, and
at least portions of the second main electrode and the second sub-electrode are spaced apart from and face each other.

7. The display device of claim 3, further comprising:
a first contact electrode extending in the first direction on the first main electrode and electrically contacting the one-end of the light emitting element; and
a second contact electrode extending in the first direction on the second main electrode and disposed on the another end of the light emitting element.

8. The display device of claim 7, wherein
the light emitting element has a shape extending in a direction, and
an interval between the first contact electrode and the second contact electrode is less than a length of the light emitting element.

9. The display device of claim 7, wherein widths of the first main electrode and the second main electrode are less than widths of the first contact electrode and the second contact electrode.

10. The display device of claim 7, wherein
the first main electrode and the first sub-electrode have a same width, and
an interval between the first main electrode and the first sub-electrode is less than a width of the first internal bank.

11. The display device of claim 2, wherein a first source voltage is applied to the first main electrode, and the first source voltage is not applied to the first sub-electrode.

12. The display device of claim 11, further comprising:
a first electrode fragment spaced apart from the first sub-electrode and the first internal bank in the first direction.

13. The display device of claim 2, further comprising:
a third internal bank extending in the first direction between the first internal bank and the second internal bank; and
third electrodes disposed on both sides of the third internal bank and spaced apart from each other in the second direction,
wherein the third electrode disposed on a side of the third internal bank is spaced apart from and faces the first main electrode, and the third electrode disposed on another side of the third internal bank is spaced apart from and faces the second electrode.

14. The display device of claim 13, wherein the light emitting element includes a first light emitting element disposed between the first internal bank and the third internal bank and a second light emitting element disposed between the third internal bank and the second internal bank.

15. The display device of claim 13, further comprising:
second electrode fragments spaced apart from the third electrodes and the third internal bank in the first direction.

16. The display device of claim 13, further comprising:
a fourth internal bank extending in the first direction between the first internal bank and the third internal bank; and
fourth electrodes disposed on both sides of the fourth internal bank and spaced apart from each other in the second direction,
wherein the light emitting element includes a third light emitting element disposed between the fourth internal bank and the third internal bank.

17. A display device comprising:
a first internal bank and a second internal bank disposed on a substrate and spaced apart from and facing each other;
a first electrode including a first sub-electrode covering a side of the first internal bank and a first main electrode covering another side of the first internal bank;
a second electrode including a second main electrode covering a side of the second internal bank and a second sub-electrode covering another side of the second internal bank; and
a light emitting element disposed between the first internal bank and the second internal bank, wherein
the first electrode is not disposed on at least a portion of an upper surface of the first internal bank, and the second electrode is not disposed on at least a portion of an upper surface of the second internal bank.

18. The display device of claim 17, further comprising:
a first insulating layer covering portions of the first electrode and the second electrode,
wherein the first insulating layer covers the first sub-electrode and the second sub-electrode, and exposes portions of upper surfaces of the first main electrode and the second main electrode.

19. The display device of claim 18, further comprising:
a first contact electrode disposed on the first main electrode and contacting an end of the light emitting element and a second contact electrode disposed on the second main electrode and contacting another end of the light emitting element.

20. The display device of claim 19, wherein the first main electrode is electrically connected to a first voltage line to which a first source voltage is applied.

21. The display device of claim 20, wherein the second contact electrode electrically contacts a second voltage line to which a second source voltage is applied.

22. A display device comprising:
a first internal bank including at least one hole;
a first electrode disposed on the first internal bank and in which at least one electrode hole partially exposing the at least one hole corresponds to the at least one hole;
a second internal bank disposed in the at least one hole of the first internal bank and spaced apart from a sidewall of the at least one hole of the first internal bank;
a second electrode that covers an outer surface of the second internal bank, and exposes a portion of an upper surface of the second internal bank; and
light emitting elements disposed between the first internal bank and the second internal bank and having both ends electrically connected to the first electrode and the second electrode,
wherein at least a portion of the first electrode is disposed that covers the sidewall of the first internal bank.

23. The display device of claim 22, wherein the second electrode includes:
a main electrode that covers an outer side surface of the second internal bank spaced apart from and facing the first internal bank;
an electrode extension part disposed on the exposed upper surface of the second internal bank and spaced apart from the main electrode; and
a bridge part connecting the electrode extension part to the main electrode.

24. The display device of claim 23, further comprising:
a first contact electrode disposed on the first electrode and disposed along the sidewall of the at least one hole of the first internal bank and a second contact electrode disposed on the main electrode of the second electrode and having a width greater than a width of the main electrode.

* * * * *